(12) United States Patent
Feldmann et al.

(10) Patent No.: US 10,852,640 B2
(45) Date of Patent: Dec. 1, 2020

(54) OPTICAL DIFFRACTION COMPONENT FOR SUPPRESSING AT LEAST ONE TARGET WAVELENGTH BY DESTRUCTIVE INTERFERENCE

(71) Applicant: Carl Zeiss SMT GmbH, Oberkochen (DE)

(72) Inventors: Heiko Feldmann, Aalen (DE); Valentin Bolsinger, Aalen (DE); William Peter Van Drent, Veldhoven (NL); Jozef Petrus Henricus Benschop, Veldhoven (NL)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/739,320

(22) Filed: Jan. 10, 2020

(65) Prior Publication Data

US 2020/0225586 A1 Jul. 16, 2020

(30) Foreign Application Priority Data

Jan. 15, 2019 (DE) .................... 10 2019 200 376
Jul. 16, 2019 (DE) .................... 10 2019 210 450

(51) Int. Cl.
*G02B 5/18* (2006.01)
*G03F 7/20* (2006.01)

(52) U.S. Cl.
CPC ....... *G03F 7/70158* (2013.01); *G02B 5/1823* (2013.01); *G02B 5/1861* (2013.01);
(Continued)

(58) Field of Classification Search
CPC .. G03F 7/70158; G03F 7/70166; G03F 7/702; G02B 1/04; G02B 27/4277
(Continued)

(56) References Cited

U.S. PATENT DOCUMENTS 6,271,967 B1    8/2001 Stork
2004/0021945 A1  2/2004 Tompkin et al.
(Continued)

FOREIGN PATENT DOCUMENTS

DE    195 16 741 A1   11/1996
DE    100 54 503 A1    6/2002
(Continued)

OTHER PUBLICATIONS

Feigl, T. et al. "Multilayer EUV optics with integrated IR-suppression gratings", 2016 EUVL Workshop, Berkeley, Jun. 13-16, 2016.
(Continued)

*Primary Examiner* — Hung Nguyen
(74) *Attorney, Agent, or Firm* — Fish & Richardson P.C.

(57) ABSTRACT

An optical diffraction component is configured to suppress at least one target wavelength by destructive interference. The optical diffraction component includes at least three diffraction structure levels that are assignable to at least two diffraction structure groups. A first of the diffraction structure groups is configured to suppress a first target wavelength $\lambda_1$. A second of the diffraction structure groups is configured to suppress a second target wavelength $\lambda_2$, where $(\lambda_1-\lambda_2)^2/(\lambda_1+\lambda_2)^2<20\%$. A topography of the diffraction structure levels can be described as a superimposition of two binary diffraction structure groups. Boundary regions between adjacent surface sections of each of the binary diffraction structure groups have a linear course and are superimposed on one another at most along sections of the linear course.

31 Claims, 27 Drawing Sheets

(52) U.S. Cl.
CPC ............ *G03F 7/702* (2013.01); *G03F 7/7025* (2013.01); *G03F 7/70166* (2013.01)

(58) Field of Classification Search
USPC .................................... 355/67; 359/566, 576
See application file for complete search history.

(56) References Cited

U.S. PATENT DOCUMENTS

| | | | | |
|---|---|---|---|---|
| 2005/0243423 | A1* | 11/2005 | Nakai | G02B 27/4277 359/566 |
| 2008/0231956 | A1* | 9/2008 | Yasui | G02B 1/04 359/576 |
| 2014/0131586 | A1 | 5/2014 | Wang et al. | |
| 2018/0203367 | A1* | 7/2018 | Jak | G01N 21/9505 |
| 2020/0073031 | A1* | 3/2020 | Born | G02B 27/0081 |

FOREIGN PATENT DOCUMENTS

| | | |
|---|---|---|
| DE | 10 2009 044 462 A1 | 1/2011 |
| EP | 1 540 423 B1 | 3/2007 |
| WO | WO 2007/031 992 A1 | 3/2007 |
| WO | WO 2014/114405 A2 | 7/2014 |
| WO | WO 2017/207401 A1 | 12/2017 |

OTHER PUBLICATIONS

Oliva, M. et al. "Multilevel blazed gratings in resonance domain: an alternative to the classical fabrication approach", Optics Express (OpEx), vol. 19, No. 15, Jul. 18, 2011.

Oliva, M et al. "Highly efficient three-level blazed grating in the resonance domain", Optics Letter (OL), vol. 35, No. 16, Aug. 15, 2010.

Kettunen, Ville et al "Diffractive elements designed to suppress unwanted zeroth order due to surface depth error", In: Journal of Modern Optics (MOB), vol. 51, issue 14, 2004.

German Examination Report, with translation thereof, for corresponding Appl No. DE 10 2019 210 450.9, dated Sep. 27, 2019.

German Examination Report, with translation thereof, for corresponding Appl No. DE 10 2019 200 376.1, dated Sep. 26, 2019.

* cited by examiner

OPTICAL DIFFRACTION COMPONENT FOR SUPPRESSING AT LEAST ONE TARGET WAVELENGTH BY DESTRUCTIVE INTERFERENCE

CROSS-REFERENCE TO RELATED APPLICATIONS

The present patent application claims the priorities of German patent application DE 10 2019 200 376.1, filed Jan. 15, 2019, and DE 10 2019 210 450.9, filed Jul. 16, 2019, the contents of which are incorporated by reference herein.

FIELD

The disclosure relates to an optical diffraction component for suppressing at least one target wavelength by destructive interference. Furthermore, the disclosure relates to an EUV collector of a projection exposure apparatus including such an optical diffraction component, an illumination system including such an EUV collector, an optical system including such an illumination system, a projection exposure apparatus including such an optical system, and a method for producing a structured component with the aid of such a projection exposure apparatus, and a structured component produced in this way.

BACKGROUND

An EUV collector including an optical diffraction component in the form of an optical grating is known from WO 2017/207401 A1 and from WO 2014/114405 A2. Embodiments of optical gratings for suppressing IR wavelengths in EUV projection exposure apparatuses are known from the publication "Multilayer EUV optics with integrated IR-suppression gratings", T. Feigl et al., 2016 EUVL Workshop, Berkeley, Jun. 13-16, 2016. EP 1 540 423 B1 describes a grating-based spectral filter for suppressing radiation outside a used band in an EUV lithography system. US 2014/0131586 A1 describes a phase grating for a mask inspection system. DE 10 2009 044 462 A1 describes an optical filter element including a grating structure for diffracting infrared radiation within an EUV illumination system. The technical article "Multilevel blazed gratings in resonance domain: an alternative to the classical fabrication approach" by M. Oliva et al., OPTICS EXPRESS, Vol. 19, No. 15, 2011, pages 1473 to 1475, and the technical article "Highly efficient three-level blazed grating in the resonance domain" by M. Oliva et al., OPTICS LETTERS Vol. 35, No. 16, 2010, pages 2774 to 2776, describe different variants of blazed gratings. The technical article "Diffractive elements designed to suppress unwanted zeroth order due to surface depth error" by V. Kettunen et al., Journal of Modern Optics 51, 14, 2111-2123, 2004, discloses diffractive elements for suppressing unwanted zero orders of diffraction on account of a profile depth error.

DE 195 16 741 A1 discloses a diffraction-optically effective structure arrangement. DE 100 54 503 A1 discloses a light-diffracting binary grating structure. WO 2007/031 992 A1 discloses a diffraction grating having a spatially changing duty cycle.

An optical grating can be used for suppressing stray light of a wavelength that deviates from that of used light. The stray light can then be diffracted by the optical grating towards a light trap (beam dump), whereas used light takes a different path.

SUMMARY

The present disclosure seeks to provide an optical diffraction component for suppressing at least one target wavelength by destructive interference so that the possibilities for use thereof are extended in particular for stray light suppression.

In a first general aspect, the disclosure provides an optical diffraction component that includes a periodic grating structure profile including diffraction structures, having three diffraction structure levels, which predefine different structure depths relative to a reference plane. The arrangement of the diffraction structures is such that a wavelength range around a first target wavelength $\lambda_1$ in the infrared wavelength range, which first target wavelength is diffracted by the grating structure profile, has radiation components having at least three different phases which interfere with one another destructively at least in the zero and/or +/− first order(s) of diffraction of the first target wavelength $\lambda_1$. The diffraction structure levels predefine a topography of a grating period of the grating structure profile that is repeated regularly along a period running direction. The diffraction structure levels include: a neutral diffraction structure level, which corresponds to a reference height of zero; a positive diffraction structure level, which is arranged higher by an optical path length of $\lambda_1/4 +/- 20\%$ relative to the neutral diffraction, structure level; and a negative diffraction structure level, which is arranged lower by an optical path length of $\lambda_1/4 +/- 20\%$ relative to the neutral diffraction structure level.

A range to be suppressed around the target wavelength $\lambda_1$ can be chosen so as to encompass a plurality of wavelengths to be suppressed, for example the different wavelengths of a prepulse and of a main pulse of an EUV plasma light source.

In the case of the optical diffraction component in accordance with the first aspect, firstly the positive diffraction structure level and secondly the negative diffraction structure level are embodied with a tolerance range of a maximum of 20% around the optical path length difference of $\lambda_1/4$ relative to the neutral diffraction structure level. This tolerance in comparison with the path length difference $\lambda_1/4$ can also be less than +/−20% and can be for example +/−15%, +/−10%, +/−5%, +/−4%, +/−3%, +/−2%, or even +/−1%.

In the case of the optical diffraction component according to the first aspect, a grating period of the grating structure profile can be subdivided into four period sections of the diffraction structure levels. Two of the four period sections can be embodied as neutral diffraction structure sections having the neutral diffraction structure level. One of the four period sections can be embodied as a positive diffraction structure section having the positive diffraction structure level. One of the four period sections can be embodied as a negative diffraction structure section having the negative diffraction structure level. In the case of this embodiment of the optical diffraction component, the two neutral diffraction structure levels can be arranged in the grating period in a manner separated from one another by a positive diffraction structure level or by a negative diffraction structure level. The separation of the two neutral diffraction structure levels from one another enables a sequence of the diffraction structure levels in which in the period running direction an identical number of falling edges or sidewalls (structure depth increases, edge "valley-wards") and rising edges or sidewalls (structure depth decreases again, edge "peak-wards") having in each case mutually comparable structure height differences are present. Firstly the falling edges and secondly the rising edges then respectively compensate for one another as far as a possible phase error is concerned, with the result that an entire phase error, possibly stemming from an undesired edge structuring and/or an undesired edge position, is reduced or wholly avoided.

Alternatively, the two neutral diffraction structure levels can also be arranged directly successively in the grating period as a neutral diffraction structure level of double length.

The four period sections into which the grating period of the grating structure profile can be subdivided can have an identical length along the period running direction, wherein an identical length is present if the lengths differ from one another by less than +/−20%. Such an optical diffraction component gives rise to a particularly good destructively interfering suppressing effect for the target wavelength. The lengths of the four period sections can deviate from one another by less than 20%, for example by less than 15%, by less than 10%, by less than 5%, by less than 4%, by less than 3%, by less than 2% or even by less than 1%. The lengths of the four period sections can also be exactly identical.

The four period sections into which the grating period of the grating structure profile can be subdivided can have the following sequence: positive diffraction structure level, neutral diffraction structure level, negative diffraction structure level, neutral diffraction structure level. Such a sequence of the period sections has been found to be particularly suitable. A corresponding sequence is achievable by cyclically interchanging the sequence indicated above, thus resulting in the following sequence, for example: neutral diffraction structure level, positive diffraction structure level, neutral diffraction structure level, negative diffraction structure level.

The following sequence of the four period sections is also possible: Negative diffraction structure level, neutral diffraction structure level, positive diffraction structure level, neutral diffraction structure level. Cyclic interchange is possible in the case of this variant, too.

The following can be used as a further variant of the sequence of the four period sections: Neutral diffraction structure level, neutral diffraction structure level; positive diffraction structure level, negative diffraction structure level. Here, therefore, two neutral diffraction structure levels are present directly next to one another as a common neutral diffraction structure level in particular of double length. Cyclic interchange, for example, is possible in the case of this variant, too.

In the case of the optical diffraction component in accordance with the first aspect, the arrangement of the diffraction structures can be such that a target wavelength range, containing the target wavelength, in the infrared wavelength range, which is diffracted by the grating structure profile, has radiation components having at least three different phases which interfere with one another destructively at least in the zero and/or +/− first order(s) of diffraction of the first target wavelength, wherein the target wavelength range also includes, besides the first target wavelength $\lambda_1$, a second target wavelength $\lambda_2$ different therefrom, wherein the arrangement of the diffraction structures is such that a wavelength range around the second target wavelength in the infrared wavelength range, which is diffracted by the grating structure profile, also has radiation components having at least three different phases which interfere with one another destructively at least in the zero and/or +/− first order(s) of diffraction of the first target wavelength, wherein the target wavelength range also includes, besides the first target wavelength, a target wavelength different therefrom, wherein the arrangement of the diffraction structures is such that a wavelength range around the second target wavelength in the infrared wavelength range, which is diffracted by the grating structure profile, has radiation components having at least three different phases which interfere with one another destructively at least in the zero and/or +/− first order(s) of diffraction of the second target wavelength, wherein for the two target wavelengths $\lambda_1$ and $\lambda_2$ it holds true that: $(\lambda_1-\lambda_2)^2/(\lambda_1+\lambda_2)^2 < 20\%$. The advantages of such an optical diffraction component correspond to those which have already been explained above.

For the upper limit value characterizing the difference between the two target wavelengths, it can hold true that: $(\lambda_1-\lambda_2)^2/(\lambda_1+\lambda_2)^2 < 15\%$, 10%, <5%, <4%, <3%, <2%, <1%, <0.5%, <0.2%, <0.1%, <0.05%, <0.01%, <0.001%. The upper limit value can be 0.037%, for example. The upper limit value can also be significantly smaller still, for example 0.0002%. The two target wavelengths that are suppressed by the at least two diffraction structure groups of the optical diffraction component can be exactly identical. A deviation $(\lambda_1-\lambda_2)^2/(\lambda_1+\lambda_2)^2$ characterizing the difference between the two target wavelengths can be greater than 0.0001%, can be greater than 0.001%, can be greater than 0.01%, can be greater than 0.1%, can be greater than 0.2%, can be greater than 0.5%, can be greater than 0.7% and can also be even greater.

The target wavelengths can be in the IR wavelength range, for example in the range of the typical emission wavelengths of $CO_2$ lasers at 10.6 µm. Alternatively or additionally, wavelengths in the NIR wavelength range, in the visible wavelength range, in the UV wavelength range or else in the DUV wavelength range can constitute target wavelengths to be suppressed. One of the two target wavelengths can be 10.2 µm and the other of the two target wavelengths can be 10.6 µm. The target wavelengths can be adapted to the wavelengths of a prepulse and of a main pulse of an EUV plasma light source.

The design of the at least two diffraction structure groups for suppressing two different target wavelengths results in a suppression of wavelengths within a predefinable wavelength bandwidth, which can also be referred to as suppression design bandwidth. Wavelengths which lie within this suppression design bandwidth, that is to say which can be effectively suppressed by the optical diffraction component, can correspond to the target wavelengths and/or can lie between the target wavelengths and/or can lie outside a wavelength range between the target wavelengths. For suppressing a wavelength of 10.2 µm, by way of example, a first target wavelength, for which the first diffraction structure group is designed, can be 10.25 µm and a second target wavelength, for which the second diffraction structure group is designed, can be 10.55 µm. The choice of the target wavelengths arises depending on the desired properties of the optical diffraction component for suppressing optionally a plurality of different wavelengths or wavelength bandwidths. In this case, a position of further minima of destructive interference besides the target wavelengths can also be taken into account or it is possible to take account of which wavelengths are deliberately intended not to be suppressed.

What has already been discussed above in association with the optical diffraction component can hold true here for the choice of the target wavelengths $\lambda_1$ and $\lambda_2$.

In a second general aspect, the disclosure provides an optical diffraction component for suppressing at least one target wavelength by destructive interference. The component includes at least three diffraction structure levels which predefine different structure depths relative to a reference plane. The three diffraction structure levels are assignable to at least two diffraction structure groups. A first of the diffraction structure groups is embodied for suppressing a first target wavelength $\lambda_1$ in the zero order of diffraction. A second of the diffraction structure groups is embodied for suppressing a second target wavelength $\lambda_2$ in the zero order of diffraction. The two target wavelengths $\lambda_1$ and $\lambda_2$ are such that: a topography of the diffraction structure levels can be described as a superimposition of two binary diffraction structure groups wherein each of the binary diffraction structure groups has: first surface sections having a first structure depth; and second surface sections having a second structure depth, which alternate with the first surface sections along a running direction. Boundary regions between adjacent surface sections of each of the binary diffraction structure groups have a linear course, wherein first boundary regions of the first of the two binary diffraction structure groups, second boundary regions of the second of the two binary diffraction structure groups, and they are superimposed on one another at most along sections of their linear course.

Use of an optical diffraction component including at least three diffraction structure levels which are in turn assignable to at least two diffraction structure groups which serve for suppressing respective target wavelengths that are not too far apart from one another surprisingly results in an improvement in a suppression of the target wavelength which distinctly goes beyond the suppression effect of the individual diffraction structure groups. In comparison with optical diffraction components from the prior art, this results in degrees of freedom of design which can be used to enhance the flexibility of the possibilities for use of the optical diffraction component. The different diffraction structure groups can occupy the same optically used area of the optical diffraction component, that is to say do not have to be arranged on mutually separate sections on the optically used area. The optical diffraction component can be designed in particular such that the two diffraction structure groups are designed for suppressing the same target wavelength or stray light wavelength. Alternatively or additionally, the optical diffraction component can be designed for suppressing a plurality of target wavelengths with appropriate design of the diffraction structure groups. In the case of such an optical diffraction component including a plurality of diffraction structure groups, it has been found that a diffractive effect is improved in comparison with an optical diffraction component including exactly one diffraction structure group. With the use of the optical diffraction component including a plurality of diffraction structure groups, the same suppressing effect can thus be achieved with relaxed manufacturing tolerances in comparison with the prior art.

A diffraction structure group is an arrangement of at least two diffraction structure levels which are arranged and fashioned for suppressing exactly one target wavelength. One example of a diffraction structure group is an optical grating. The assignment of the at least three diffraction structure levels to at least two diffraction structure groups is regularly such that at least one diffraction structure level is assigned to a plurality of diffraction structure groups.

The optical diffraction component according to the first aspect discussed initially can also include at least one or else at least two diffraction structure groups of this type.

The advantages regarding the maximum difference between the two target wavelengths correspond to those which have already been explained above. What has already been discussed above in association with the optical diffraction component according to the first aspect can be asserted here for the choice of the target wavelengths $\lambda_1$ and $\lambda_2$.

For the second target wavelength $\lambda_2$, too, it holds true that the latter is attenuated or suppressed by destructive interference on account of an appropriate design of diffraction structures of the optical diffraction component.

The optical diffraction component can include exactly three diffraction structure levels and can include exactly two diffraction structure groups. Alternatively, the optical diffraction component can also include more than three diffraction structure levels, for example four, five, six or even more diffraction structure levels, and correspondingly also more than two diffraction structure groups.

A binary structure is a structure including positive structures ("peaks") and negative structures ("valleys"), wherein the total area of the positive structures corresponds to the total area of the negative structures within predefined tolerances. A difference between the total areas firstly of the positive structures and secondly of the negative structures can be less than 20%, can be less than 10%, can be less than 5%, can be less than 4%, can be less than 3%, can be less than 2% and can also be less than 1%. The total areas can also be exactly identical.

The fact that the boundary regions of the first and second binary structures are superimposed on one another at most along sections of the linear course of the boundary regions affords the possibility of producing the optical diffraction component with the aid of comparatively simply fashioned lithographic mask structures. This affords the possibility of precise production of the optical diffraction component with compliance with narrow tolerances firstly for the areas of the diffraction structure levels and also for the structure depths thereof. In particular, it is possible to produce diffraction structure groups having desirably great and desirably precise sidewall steepness of the boundary regions.

The optical diffraction component can be fashioned such that a rising boundary region, that is to say a rising level sidewall, is assigned a falling boundary region with the same structure depth, that is to say the same structure height difference.

The optical diffraction component according to the second aspect can additionally have features which have already been discussed above.

In the case of the optical diffraction component, the first boundary regions of the first of the two binary diffraction structure groups and the second boundary regions of the second of the two binary diffraction structure groups can run completely separately from one another. Such a completely separated course of the boundary regions results in a further simplification in particular of lithographic production of the optical diffraction component.

A first of the diffraction structure groups can be embodied as a first diffraction grating arranged on a grating surface. The first diffraction grating can have a first grating period and a first structure depth, measured as optical path difference between first diffraction positive structures and first diffraction negative structures perpendicular to a surface section of the grating surface that respectively surrounds these first structures. A second of the diffraction structure groups can be embodied as a second diffraction grating arranged on the grating surface. Such a second diffraction grating can have a second grating period and a second structure depth, measured as optical path difference between second diffraction positive structures and second diffraction negative structures perpendicular to a surface section of the grating surface that respectively surrounds these second structures. With regard to such an embodiment, the use of an optical grating including at least two diffraction gratings having grating periods that are fundamentally independent of one another and structure depths that are fundamentally independent of one another, wherein the structure depth is small compared with the grating period at least in the case of one of the diffraction gratings, results, in comparison with optical gratings of the prior art, in degrees of freedom of design which can be used to enhance the flexibility of the possibilities for use of the optical grating. The two diffraction gratings can occupy the same grating surface, that is to say are then not arranged on separate sections on the grating surface. The two diffraction gratings are then present, therefore, in a manner being superimposed on one another on the grating surface. The optical grating can be designed such that its stray light suppression is improved by virtue of the two diffraction gratings being designed for suppressing identical stray light wavelengths. Alternatively or additionally, the optical grating can be designed such that a plurality of stray light wavelengths can be suppressed. It has surprisingly been found, moreover, that with the use of such an optical grating including a plurality of diffraction gratings, a diffractive effect, in particular a suppressing effect as a result of destructive interference in the zero order of diffraction, is improved in comparison with an optical grating including exactly one diffraction grating. The same suppressing effect can thus be achieved with relaxed manufacturing tolerances with the use of the optical grating including a plurality of diffraction gratings.

The optical grating can be embodied as a reflection grating, but can alternatively also be embodied as a transmission grating, and for example as a phase grating.

The grating surface can be embodied as plane or else curved, e.g. convex or concave. The grating surface can be part of an optical surface of an optical component which additionally has some other optical function, for example on a beam collector or a mirror. The first diffraction grating and/or the second diffraction grating can be embodied as a binary grating in which a surface area of the positive structures is equal to a surface area of the negative structures. In the simplest case, the structure depth can be the height difference between the respective diffraction positive structures and the associated diffraction negative structures.

The optical grating can additionally bear a highly reflective layer and optionally auxiliary layers, in particular for protecting the optical grating and/or the highly reflective layer. The highly reflective layer can be embodied as a multilayer. The highly reflective layer can be embodied for EUV light in a wavelength range of, in particular, between 5 nm and 30 nm.

The optical diffraction component can be embodied as a multilevel diffraction grating having correspondingly arranged diffraction structure levels.

In this case, a structure depth can be one sixth of the target wavelength. With the multilevel grating being fashioned accordingly, a structure depth can also be one quarter of the target wavelength.

Depending on a number m of the different diffraction structure levels, a structure depth depending on the target wavelength $\lambda_N$ can be: $b=\lambda_N/(2m)$.

A grating period can be in the millimetres range and can be for example 1 mm or 2 mm.

The diffraction structure levels can be embodied as plane surfaces.

The grating periods of the different diffraction gratings can be in an integral ratio to one another. The grating periods can have a defined phase offset with respect to one another.

A ratio of the grating periods can be 1:2. With the use of three diffraction gratings, the ratio of the grating periods can be 1:2:4 or else 1:2:2.

A surface area ratio of surface areas of the first diffraction positive structures to surface areas of the first diffraction negative structures can be in the range of between 0.9 and 1.1 (e.g., 0.9, 0.95, 1, 1.05, 1.1). A surface area ratio of surface areas of the second diffraction positive structures to surface areas of the second diffraction negative structures can be in the range of between (e.g., 0.9, 0.95, 1, 1.05, 1.1). Correspondingly precise binary diffraction structure groups result.

A ratio between the first grating period and the first structure depth can be greater than 10. A ratio between the second grating period and the second structure depth can be greater than 10.

Correspondingly different target wavelengths to be suppressed result. Besides the two target wavelengths $\lambda_1$ and $\lambda_2$, a further, more greatly deviating target wavelength can thus also be suppressed. By way of example, it is possible simultaneously to suppress different target wavelengths in the infrared wavelength range and a further target wavelength in the ultraviolet wavelength range.

A period ratio of the first grating period to the second grating period can be in the range of between 0.9 and 1.1 (e.g., 0.9, 0.95, 1, 1.05, 1.1).

An optical diffraction component having such a period ratio can be manufactured well. The grating periods of the first and second diffraction gratings can be exactly equal, but can also be different.

The advantages of such an optical diffraction component make possible, in conjunction with good reflection conditions in particular for EUV wavelengths, a good stray light suppression of higher wavelengths including in the case of the second diffraction grating.

A structure depth ratio of the structure depth of the first diffraction grating to the structure depth of the second diffraction grating can be in the range of between 0.9 and 1.1 (e.g., 0.9, 0.95, 1, 1.05, 1.1). The structure depths of the first and second diffraction gratings can be different from one another, but can also be equal. A significantly larger structure depth ratio between the two diffraction gratings in the range of between 1.1 and 20 is also possible, for example a structure depth ratio in the region of 10.

In the case of the optical diffraction component including the two diffraction gratings arranged on a grating surface, the first grating period can run along a first period running direction of the first diffraction grating and the second grating period can run along a second period running direction of the second diffraction grating, wherein the two period running directions cannot run parallel to one another. Such an optical diffraction component in which the period running directions of the first and second diffraction gratings do not run parallel to one another has proved to be worthwhile. A smallest angle between the period running directions can be 90°, such that the two period running directions are perpendicular to one another. A smaller smallest angle, for example in the region of 60°, 55°, 45° or 30°, is also possible.

Alternatively, an embodiment of the optical diffraction component in which the two period running directions of the at least two diffraction structure groups run parallel to one another is also possible.

The optical diffraction component including the two diffraction gratings arranged on the grating surface can include at least one further diffraction grating arranged on the grating surface. The further diffraction grating can include further diffraction positive structures and further diffraction negative structures, wherein a surface area ratio of surface areas of the further diffraction positive structures to surface areas of the further diffraction negative structures is in the range of between 0.9 and 1.1 (e.g., 0.9, 0.95, 1, 1.05, 1.1). The further diffraction grating has a further grating period and a further structure depth, which is measured as optical path difference between the further diffraction positive structures and the further diffraction negative structures perpendicular to a surface section of the grating surface that respectively surrounds these further structures. Such an optical diffraction component including at least one further diffraction grating results in a corresponding further increase in the available degrees of freedom of design. At least two of the period running directions of the at least three diffraction gratings can have mutually different directions. Alternatively, it is also possible for all the period running directions of the at least three diffraction gratings to run parallel to one another.

In the case of the optical diffraction component including the first diffraction grating, the second diffraction grating and the further diffraction grating all arranged on the grating surface, a ratio between the further grating period and the further structure depth can be greater than 10. A period ratio of the first grating period to the further grating period can be in the range of between 0.9 and 1.1 (e.g., 0.9, 0.95, 1, 1.05, 1.1). The first grating period can run along a first period running direction of the first diffraction grating and the further grating period can run along a further period running direction of the further diffraction grating, wherein the two period running directions do not run parallel to one another.

The advantages of such an optical diffraction component correspond to those which have already been explained above. The grating periods of the first diffraction grating and of the further diffraction grating can be identical, but can also be different. Corresponding period ratios in the range of between 0.9 and 1.1 (e.g., 0.9, 0.95, 1.05, 1.1) or else identical grating periods can also be present between the second diffraction grating and the at least one further diffraction grating.

A structure depth ratio of the first diffraction grating with respect to the further diffraction grating can be in the range of between 0.9 and 1.1 (e.g., 0.9, 0.95, 1.05, 1.1); structure depths of the first and further diffraction gratings can be different from one another, but can also be equal. Corresponding structure depth ratios in the range of between 0.9 and 1.1 (e.g., 0.9, 0.95, 1.05, 1.1) or else identical structure depths can also be present between the second diffraction grating and the at least one further diffraction grating. A significantly greater structure depth ratio between the structure depths of the further diffraction grating and the first and/or second diffraction grating in the range of between 1.1 and 20, for example in the region of 10, is also possible.

A smallest angle between the period running directions of the first diffraction grating and the further diffraction grating can be in the range of between 20° and 25°. Some other smallest angle e.g. in the range of between 10° and 80° is also possible. Corresponding running direction angles can also be present between a period running direction of the second diffraction grating and the period running direction of the at least one further diffraction grating.

The surface areas of the diffraction positive structures and of the diffraction negative structures of the various diffraction structure groups can make identical contributions to the entire grating surface. Such identical surface area contributions yield, in particular, binary gratings for the different diffraction structure groups of the optical diffraction component. This ensures a high stray light suppression in the region of the zero order of diffraction in the case of appropriate design of the optical diffraction component.

The above-discussed features of the optical diffraction components of the two aspects can also be combined with one another.

The optical diffraction component of the type of at least one of the two aspects discussed above can be produced by a mask etching method in which at least one mask structure is used. A plurality of mask structures can also be used, which differ in the positions of their mask regions and/or their mask gaps. A substrate can then be etched with sequential use of these different masks or by displacement of one and the same mask structure in at least two sequential etching steps. Three or more different mask structures can also be used in such a mask etching method for producing the optical diffraction component.

The advantages of a collector or a collector mirror which can be used in a projection exposure apparatus, and in particular in an EUV projection exposure apparatus, and has an optical diffraction component having the properties described above correspond to those which have already been explained above with reference to the optical diffraction component. These advantages are evident particularly in the case of use in association with an EUV light source in which plasma is produced by laser-induced discharge. The collector or the collector mirror can be an EUV collector/collector mirror for a wavelength range of, in particular, between 5 nm and 30 nm and/or a DUV (Deep UltraViolet) collector/collector mirror, that is to say a collector mirror for a wavelength range of, in particular, between 150 nm and 250 nm.

This applies particularly to an EUV collector mirror in which the collector mirror is embodied in such a way that it guides EUV radiation towards a focal region, wherein the optical diffraction component is embodied in such a way that it guides the radiation of the at least one target wavelength away from the focal region. The radiation of the at least one target wavelength is also referred to as stray light.

An illumination system can include such a collector, in particular an EUV collector, and an illumination optical unit for illuminating an object field, in which an object to be imaged is arrangeable. DUV or EUV used light can be used as illumination light. The advantages of such an illumination system correspond to those that have already been explained above with reference to the collector according to the invention. The used light is precisely not suppressed by the optical diffraction component, that is to say has a different wavelength from that of stray light to be suppressed.

The illumination system can be fashioned with the optical diffraction component embodied as described above so as to result in a homogeneous distribution of the stray light in the region of stray light removal locations and for example in the region of beam dumps provided for this purpose. Alternatively or additionally, it is possible to ensure a predefined distribution function of the used light in particular in specific sections of an illumination beam path of the illumination system, for example in the region of a pupil plane.

An optical system can include such an illumination system and a projection optical unit for imaging the object field into an image field, wherein a substrate is arrangeable in the image field, and wherein a section of the object to be imaged is able to be imaged onto the substrate. A projection exposure apparatus can include such an optical system and a light source, in particular an EUV light source. In order to produce a structured component, a reticle and a wafer can be provided. A structure on the reticle can be projected onto a light-sensitive layer of the wafer with the aid of such a projection exposure apparatus. With this approach, it is possible to produce a microstructure and/or nanostructure on the wafer. The advantages of such an optical system, of such a projection exposure apparatus, of such a production method and of such a microstructured and/or nanostructured component correspond to those which have already been explained above with reference to the collector according to the invention.

Insofar as an EUV light source is used, it can include a pump light source for producing a plasma that generates EUV wavelengths. The pump light source can be embodied for producing a prepulse having a prepulse light wavelength and for producing a main pulse having a main pulse light source. The prepulse light wavelength can differ from the main pulse wavelength. Corresponding differences between the wavelengths firstly of the prepulse light and secondly of the main pulse light in the case of the pump light source of the EUV light source of the projection exposure apparatus can have upper and/or lower limit values which have already been explained above in association with the target wavelengths $\lambda_1$ and $\lambda_2$.

In particular, a semiconductor component, for example a memory chip, can be produced using the projection exposure apparatus.

In a general aspect, a component, includes a periodic grating structure profile including diffraction structures configured so that a wavelength range around a first wavelength, $\lambda_1$, is diffracted by the periodic grating structure profile. The first wavelength, $\lambda_1$, is in the infrared wavelength range. The wavelength range includes radiation components including at least three different phases which interfere with each other destructively in at least one order of diffraction. The at least one order of diffraction is selected from the group consisting of: the zero order of diffraction of the first wavelength, $\lambda_1$; the + first order of diffraction of the first wavelength, $\lambda_1$; and the − first order of diffraction of the first wavelength, $\lambda_1$. The diffraction structures include diffraction structure levels. The diffraction structure levels include: a neutral diffraction structure level corresponding to a reference height of zero; a positive diffraction structure level arranged higher by an optical path length of $\lambda_1/4 +/- 20\%$ relative to the neutral diffraction structure level; and a negative diffraction structure level arranged lower by an optical path length of $\lambda_1/4 +/- 20\%$ relative to the neutral diffraction structure level. The diffraction structure levels define a topography of a grating period of a grating structure profile that is repeated regularly along a direction.

The grating period can include at least one neutral diffraction structure section having the neutral diffraction structure level. The grating period can include two neutral diffraction structure sections having the neutral diffraction structure level. The grating period can include a positive diffraction structure section having the positive diffraction structure level. The grating period can include a positive diffraction structure section having the negative diffraction structure level. The grating period can include: a first neutral diffraction structure section having the neutral diffraction structure level; a second neutral diffraction structure section having the neutral diffraction structure level; a positive diffraction structure section having the positive diffraction level; and a negative diffraction structure section having the negative diffraction structure level. The diffraction structure sections have the following sequence: the positive diffraction structure level; the first neutral diffraction structure level; the negative diffraction structure level; and the second neutral diffraction structure level.

Along the direction, the diffraction structure sections have the same length within +/−20% (e.g., within +/−15%, within +/−10%, within +/−5%, within +/−4%, within +/−3%, within +/−2%, within +/−1%).

The wavelength range can further include a second wavelength, $\lambda_2$, wherein: the wavelength, $\lambda_2$, is different from the first wavelength, $\lambda_1$; and the second wavelength, $\lambda_2$, is in the infrared wavelength range. The diffraction structures can be configured so that the wavelength range further includes radiation components including at least three additional different phases which interfere with each other destructively in at least one order of diffraction selected from the group consisting of: the zero order of diffraction of the first wavelength, $\lambda_2$; the + first order of diffraction of the first wavelength, $\lambda_2$; and the − first order of diffraction of the first wavelength, $\lambda_2$. In some embodiments, $(\lambda_1-\lambda_2)^2/+\lambda_2)^2<20\%$ (e.g., <15%, <10%, <5%, <4%, <3%, <2%, <1%, <0.5%, <0.2%, <0.1%, <0.05%, <0.01%, <0.001%, <0.0002%). Optionally, in such embodiments, $(\lambda_1-\lambda_2)^2/(\lambda_1+\lambda_2)^2>0.0001\%$ (e.g., >0.001%, >0.01%, >0.1%, >0.5%, >0.7%). The wavelength range can include radiation components including at least three different phases which interfere with one each other destructively in the zero order of diffraction of the first wavelength, $\lambda_2$. The wavelength range can include radiation components including at least three different phases which interfere with one each other destructively in the + first order of diffraction of the first wavelength, $\lambda_2$. The wavelength range can include radiation components including at least three different phases which interfere with one each other destructively in the − first order of diffraction of the first wavelength, $\lambda_2$.

The wavelength range can include radiation components including at least three different phases which interfere with one each other destructively in the zero order of diffraction of the first wavelength, $\lambda_1$. The wavelength range can include radiation components including at least three different phases which interfere with one each other destructively in the + first order of diffraction of the first wavelength, $\lambda_1$. The wavelength range can include radiation components including at least three different phases which interfere with one each other destructively in the − first order of diffraction of the first wavelength, $\lambda_1$.

The positive diffraction structure level can be higher by an optical path length of $\lambda_1/4 +/-15\%$ (e.g., +/−10%, +/−5%, +/−4%, +/−3%, +/−2%, +/−1%) relative to the neutral diffraction structure level.

The negative diffraction structure level can lower by an optical path length of $\lambda_1/4 +/-15\%$ (e.g., +/−10%, +/−5%, +/−4%, +/−3%, +/−2%, +/−1%) relative to the neutral diffraction structure level.

In a general aspect, the disclosure provides a component that includes at least three diffraction structure levels defining different structure depths relative to a reference plane. The three diffraction structure levels are assignable to at least first and second diffraction structure groups. The first diffraction structure group is configured to suppress the zero order of diffraction of a first wavelength, $\lambda_1$. The second diffraction structure group is configured to suppress the zero order of diffraction of a second wavelength, $\lambda_2$. $(\lambda_1-\lambda_2)^2/(\lambda_1+\lambda_2)^2<20\%$. A topography of the diffraction structure levels includes a superimposition of first and second binary diffraction structure groups. For each of the first and second binary diffraction structure groups: the binary diffraction structure group includes first surface sections having a first structure depth and second surface sections having a second structure depth; and the first and second surface sections alternate along a direction. Boundary regions between adjacent surface sections of the first and second binary diffraction structure groups have a linear course. Boundary regions of the first binary diffraction structure group and boundary regions of the second binary diffraction structure group are superimposed on each other at most along sections of their linear course.

The boundary regions of the first binary diffraction structure group and the boundary regions of the second diffraction structure group can run completely separately from one another.

The boundary regions of the first binary diffraction structure group and boundary regions of the second binary diffraction structure group can be superimposed on each other.

The first diffraction structure group can include a first diffraction grating supported by a grating surface. The first diffraction grating can have a first grating period. The first diffraction grating can include first diffraction positive structures and first diffraction negative structures. The first diffraction positive structures can be perpendicular to a section of the grating surface surrounding the first diffraction positive structures. The first diffraction negative structures can be perpendicular to a section of the grating surface surrounding the first diffraction negative structures. The first diffraction grating can have a first structure depth that is an optical path difference between the first diffraction positive structures and the first diffraction negative structures. The second diffraction structure group can include a second diffraction grating supported by the grating surface. The second diffraction grating can have a second grating period. The second diffraction grating can include second diffraction positive structures and second diffraction negative structures. The second diffraction positive structures can be perpendicular to a section of the grating surface surrounding the second diffraction positive structures. The second diffraction negative structures can be perpendicular to a section of the grating surface surrounding the second diffraction negative structures. The second diffraction grating can have a second structure depth that is an optical path difference between the second diffraction positive structures and the second diffraction negative structures. The first grating period can along a direction that is not parallel to a direction along which the second grating period runs.

The component can be configured so that, for the first and second diffraction gratings, surface areas of the diffraction positive structures and of the diffraction negative structures make identical contributions to the entire grating surface. The component can be configured so that, for the first and second diffraction gratings, surface areas of the diffraction positive structures and of the diffraction negative structures make contributions to the entire grating surface that differ by at most 20% (e.g., at most 10%, at most 5%, at most 4%, at most 3%, at most 2%, at most 1%) from each other.

The component can further include a third diffraction grating supported by the grating surface. The following may hold: the third diffraction grating includes third diffraction positive structures and third diffraction negative structures; the third diffraction grating has a third grating period; the third diffraction positive structures are perpendicular to a section of the grating surface surrounding the third diffraction positive structures; the third diffraction negative structures are perpendicular to a section of the grating surface surrounding the third diffraction negative structures; the third diffraction grating has a third structure depth that is an optical path difference between the third diffraction positive structures and the third diffraction negative structures. A ratio of surface areas of the third diffraction positive structures to surface areas of the third diffraction negative structures can be between 0.9 and 1.1 (e.g., 0.9, 0.95, 1, 1.05, 1.1). A ratio of the third grating period to the third structure depth can be greater than 10. A ratio of the first grating period to the third grating period can be between 0.9 and 1.1 (e.g., 0.9, 0.95, 1, 1.05, 1.1).

The first grating period can run along a direction that is not parallel to a direction along which the third grating period runs.

The component can be configured so that, for at each of at least two of the diffraction gratings, surface areas of the diffraction positive structures and of the diffraction negative structures make identical contributions to the entire grating surface. The component can be configured so that, for each of at least two of the diffraction gratings, surface areas of the diffraction positive structures and of the diffraction negative structures make contributions to the entire grating surface that differ by at most 20% (e.g., at most 10%, at most 5%, at most 4%, at most 3%, at most 2%, at most 1%) from each other.

The component can configured so that, for each of the diffraction gratings, surface areas of the diffraction positive structures and of the diffraction negative structures make identical contributions to the entire grating surface. The component can be configured so that, for each of the diffraction gratings, surface areas of the diffraction positive structures and of the diffraction negative structures make contributions to the entire grating surface that differ by at most 20% e.g., at most 10%, at most 5%, at most 4%, at most 3%, at most 2%, at most 1%) from each other.

In a general aspect, the disclosure provides a lithograph collector that includes a component as described herein. The collector mirror can be configured to guide: used radiation toward a focal region; and radiation having the first wavelength, $\lambda_1$, away from the focal region. The collector can be an EUV lithography collector.

In a general aspect, the disclosure provides an illumination system that includes a collector as described herein, and an illumination optical unit configured to illuminate an object field.

In a general aspect, the disclosure provides an optical system that includes: a collector according as described herein; an illumination optical unit configured to illuminate an object field; and a projection optical unit configured to image the object field into an image field.

In a general aspect, the disclosure provides an apparatus, that includes: a light source; a collector as described herein; an illumination optical unit configured to illuminate an object field; and a projection optical unit configured to image the object field into an image field. The apparatus is a projection exposure apparatus. The light source can include an EUV light source. An EUV light source can include a pump light source configured to produce a plasma that generates EUV wavelengths. Optionally: the pump light source is configured to produce a prepulse and a main pulse; the prepulse has a prepulse light wavelength; the main pulse has a main pulse light wavelength; and the prepulse light wavelength differs from the main pulse light wavelength.

In a general aspect, the disclosure provides a method of using a projection exposure apparatus including an illumination optical unit and a projection optical unit. The method includes: using the illumination optical unit to illuminate a reticle in an object field of the projection optical unit; and using the projection optical unit to project a structure of the reticle onto a light-sensitive material in an image field of the projection optical unit. The illumination optical unit includes a collector as described herein.

In a general aspect, the disclosure provides a method that includes making a component as described herein. The method can include: disposing a first mask structure between a substrate and an etching medium, the first mask substrate including first mask regions and first gaps between the first mask regions, the first mask regions being impenetrable to the etching medium; and using the etching medium to etch the substrate. The method can further include: exchanging the first mask structure with a second mask structure different from the first mask structure, the second mask substrate including second mask regions and second gaps between the second mask regions, the second mask regions being impenetrable to the etching medium; and using the etching medium to further etch the substrate.

In a general aspect, the disclosure provides a method that includes impinging a wavelength range of light onto a collector so that light having a first wavelength, $\lambda_1$, is diffracted away from a focal region of the collector. The first wavelength, $\lambda_1$, is within the wavelength range. The first wavelength, is in the infrared wavelength range. The wavelength range includes radiation components including at least three different phases which interfere with each other destructively in at least one order of diffraction; and The at least one order of diffraction is selected from the group consisting of: the zero order of diffraction of the first wavelength, $\lambda_1$; the + first order of diffraction of the first wavelength, $\lambda_1$; and the − first order of diffraction of the first wavelength, $\lambda_1$. The method can further include, simultaneously with impinging the wavelength range of light onto the collector, impinging EUV light onto the collector so that the EUV light is diffracted toward the focal region of the collector. Optionally: the wavelength range further includes a second wavelength, $\lambda_2$; the method further includes diffracting light having the second wavelength, $\lambda_2$, away from the focal region of the collector; the wavelength, $\lambda_2$, is different from the first wavelength, $\lambda_1$; and the second wavelength, $\lambda_2$, is in the infrared wavelength range. The diffraction structures can be configured so that the wavelength range further includes radiation components including at least three additional different phases which interfere with each other destructively in at least one order of diffraction selected from the group consisting of: the zero order of diffraction of the first wavelength, $\lambda_2$; the + first order of diffraction of the first wavelength, $\lambda_2$; and the − first order of diffraction of the first wavelength, $\lambda_2$. $(\lambda_1-\lambda_2)^2/(\lambda_1+\lambda_2)^2$ can be <20% (e.g., <15%, <10%, <5%, <4%, <3%, <2%, <1%). The collector can include a periodic grating structure profile including diffraction structures. The wavelength range can include radiation components including at least three different phases which interfere with one each other destructively in the zero order of diffraction of the first wavelength, $\lambda_2$. The wavelength range can include radiation components including at least three different phases which interfere with one each other destructively in the + first order of diffraction of the first wavelength, $\lambda_2$. The method wavelength range can include radiation components including at least three different phases which interfere with one each other destructively in the − first order of diffraction of the first wavelength, $\lambda_2$. The wavelength range can include radiation components including at least three different phases which interfere with one each other destructively in the zero order of diffraction of the first wavelength, $\lambda_1$. The wavelength range can include radiation components including at least three different phases which interfere with one each other destructively in the + first order of diffraction of the first wavelength, $\lambda_1$. The wavelength range can include radiation components including at least three different phases which interfere with one each other destructively in the − first order of diffraction of the first wavelength, $\lambda_1$. The method can further include using an illumination system to illuminate a reticle with the EUV light. The method can further include using a projection optical unit to project an illuminated structure of the reticle onto a light sensitive material. The collector can include a component as described herein.

BRIEF DESCRIPTION OF THE DRAWINGS

Exemplary embodiments of the invention are explained in greater detail below with reference to the drawing. In the drawing.

DESCRIPTION OF EXEMPLARY EMBODIMENTS

Figure 1:
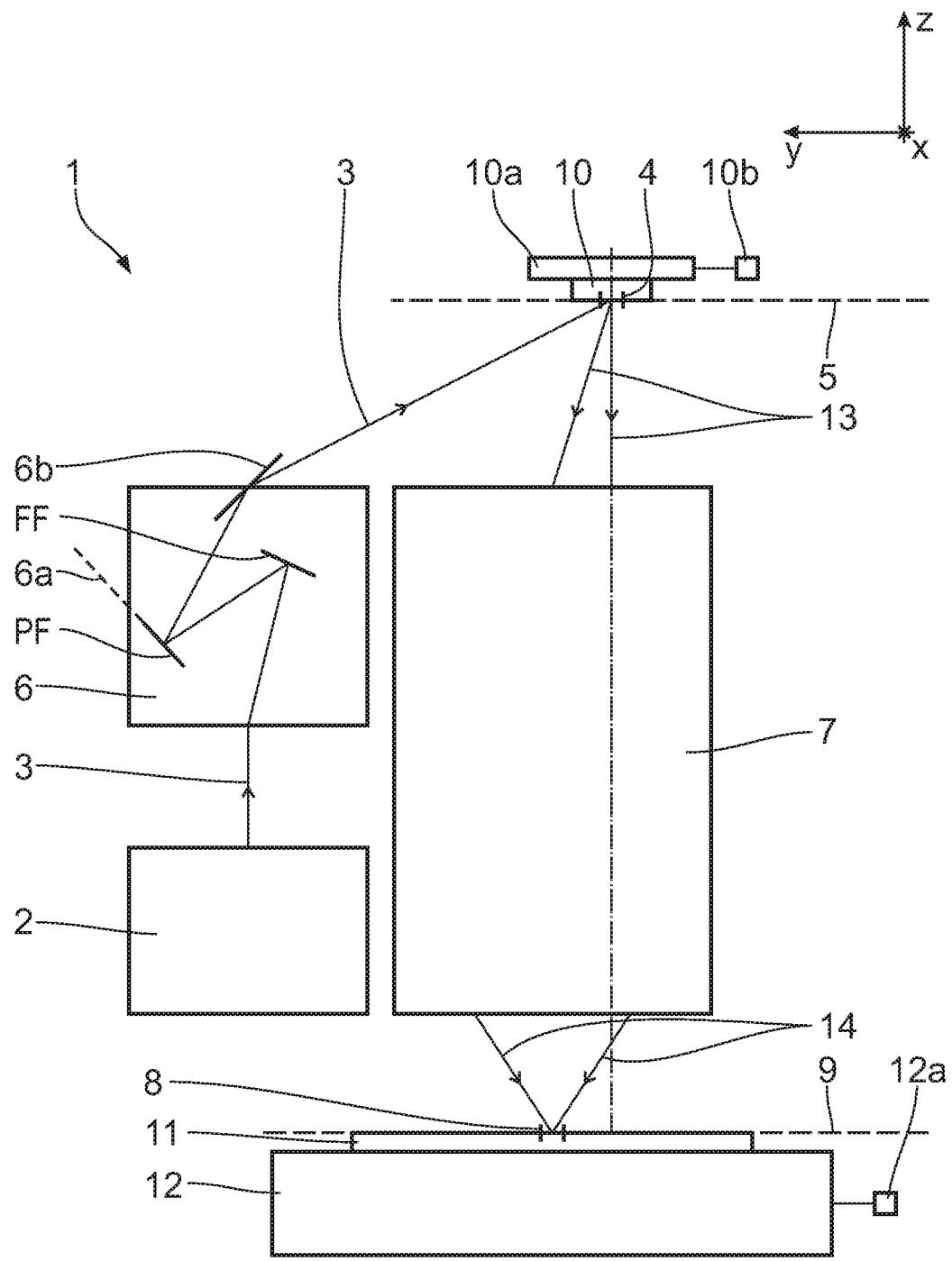
FIG. 1 schematically shows a projection exposure apparatus for EUV microlithography.

A projection exposure apparatus 1 for microlithography includes a light source 2 for illumination light or imaging light 3, which will be explained in yet more detail below. The light source 2 is an EUV light source, which produces light in a wavelength range of, for example, between 5 nm and 30 nm, in particular between 5 nm and 15 nm. The illumination light or imaging light 3 is also referred to as EUV used light below.

In particular, the light source 2 can be a light source with a wavelength of 13.5 nm or a light source with a wavelength of 6.9 nm. Other EUV wavelengths or else wavelengths in the DUV range of between 150 nm and 250 nm, for example of 193 nm, are also possible. A beam path of the illumination light 3 is illustrated extremely schematically in FIG. 1.

An illumination optical unit 6 serves to guide the illumination light 3 from the light source 2 to an object field 4 in an object plane 5. The illumination optical unit includes a field facet mirror FF illustrated highly schematically in FIG.

1 and a pupil facet mirror PF disposed downstream in the beam path of the illumination light 3 and likewise illustrated highly very schematically. A field-forming mirror 6b for grazing incidence (GI mirror; grazing incidence mirror) is arranged in the beam path of the illumination light 3 between the pupil facet mirror PF, which is arranged in a pupil plane 6a of the illumination optical unit, and the object field 4. Such a GI mirror 6b is not mandatory.

Pupil facets (not illustrated in any more detail) of the pupil facet mirror PF are part of a transfer optical unit, which transfer, and in particular image, field facets (likewise not illustrated) of the field facet mirror FF into the object field 4 in a manner being superimposed on one another. An embodiment known from the prior art can be used for the field facet mirror FF on the one hand and the pupil facet mirror PF on the other hand. By way of example, such an illumination optical unit is known from DE 10 2009 045 096 A1.

Using a projection optical unit or imaging optical unit 7, the object field 4 is imaged into an image field 8 in an image plane 9 with a predetermined reduction scale. Projection optical units which may be used to this end are known from e.g. DE 10 2012 202 675 A1.

In order to facilitate the description of the projection exposure apparatus 1 and the various embodiments of the projection optical unit 7, a Cartesian xyz-coordinate system is indicated in the drawing, from which system the respective positional relationship of the components illustrated in the figures is evident. In FIG. 1, the x-direction runs perpendicular to the plane of the drawing into the latter. The y-direction extends towards the left in FIG. 1 and the z-direction runs upwards in FIG. 1. The object plane 5 runs parallel to the xy-plane.

The object field 4 and the image field 8 are rectangular. Alternatively, it is also possible for the object field 4 and the image field 8 to have a bent or curved embodiment, that is to say, in particular, a partial ring shape. The object field 4 and the image field 8 have an x/y-aspect ratio of greater than 1. Therefore, the object field 4 has a longer object field dimension in the x-direction and a shorter object field dimension in the y-direction. These object field dimensions extend along the field coordinates x and y.

One of the exemplary embodiments known from the prior art can be used for the projection optical unit 7. What is imaged in this case is a portion of a reflection mask 10, also referred to as reticle, coinciding with the object field 4. The reticle 10 is carried by a reticle holder 10a. The reticle holder 10a is displaced by a reticle displacement drive 10b.

The imaging by way of the projection optical unit 7 is implemented on the surface of a substrate 11 in the form of a wafer, which is carried by a substrate holder 12. The substrate holder 12 is displaced by a wafer or substrate displacement drive 12a.

FIG. 1 schematically illustrates, between the reticle 10 and the projection optical unit 7, a ray beam 13 of the illumination light 3 that enters into the projection optical unit and, between the projection optical unit 7 and the substrate 11, a ray beam 14 of the illumination light 3 that emerges from the projection optical unit 7. An image field-side numerical aperture (NA) of the projection optical unit 7 is not reproduced to scale in FIG. 1.

The projection exposure apparatus 1 is of the scanner type. Both the reticle 10 and the substrate 11 are scanned in the y-direction during the operation of the projection exposure apparatus 1. A stepper type of the projection exposure apparatus 1, in which a stepwise displacement of the reticle 10 and the substrate 11 in the y-direction is implemented between individual exposures of the substrate 11, is also possible. These displacements are effected synchronously with one another by an appropriate actuation of the displacement drives 10b and 12a.

Figure 2:
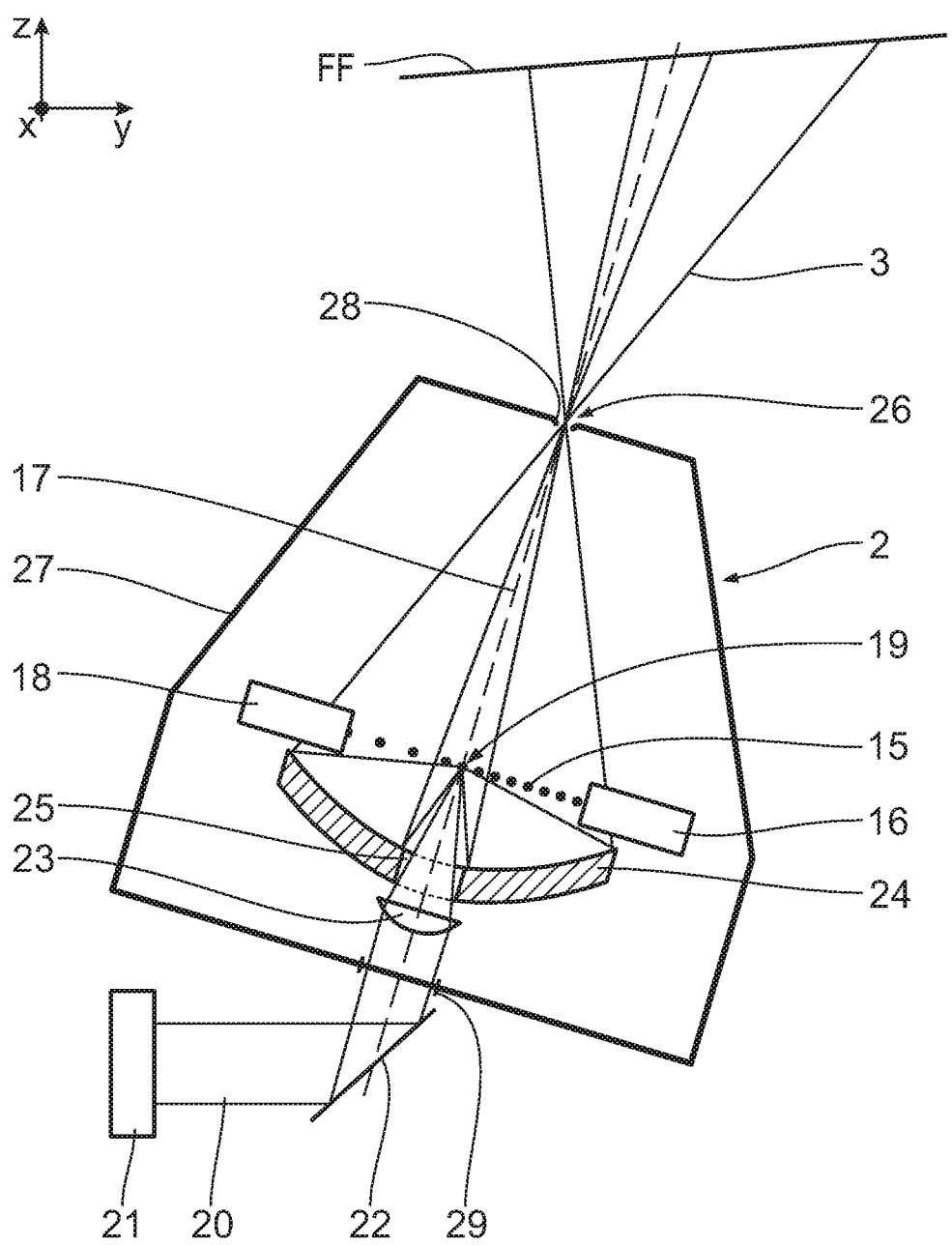
FIG. 2 shows details of a light source of the projection exposure apparatus in the environment of an EUV collector for guiding EUV used light from a plasma source region to a field facet mirror of an illumination optical unit of the projection exposure apparatus, with the EUV collector being illustrated in a meridional section.

FIG. 2 shows details of the light source 2.

The light source 2 is an LPP (laser produced plasma) source. For the purposes of producing plasma, tin droplets 15 are generated as a continuous droplet sequence by a tin droplet generator 16. A trajectory of the tin droplets 15 extends transversely to a principal ray direction 17 of the EUV used light 3. Here, the tin droplets 15 drop freely between the tin droplet generator 16 and a tin capturing device 18, with the droplets passing through a plasma source region 19. The EUV used light 3 is emitted by the plasma source region 19. When the tin droplet 15 arrives in the plasma source region 19, it is impinged upon there by pump light 20 from a pump light source 21. The pump light source 21 can be an infrared laser source in the form of e.g. a $CO_2$ laser. Some other IR laser source is also possible, in particular a solid-state laser, for example an Nd:YAG laser. The pump light source 21 can include a light source unit for producing a light prepulse and a light source unit for producing a main light pulse. The light prepulse, on the one hand, and the main light pulse, on the other hand, can have different light wavelengths.

The pump light 20 is transferred into the plasma source region 19 by way of a mirror 22, which can be a mirror that is tiltable in a controlled fashion, and by way of a focusing lens element 23. A plasma emitting the EUV used light 3 is produced by the pump light impingement from the tin droplet 15 arriving in the plasma source region 19. A beam path of the EUV used light 3 is illustrated in FIG. 2 between the plasma source region 19 and the field facet mirror FF, to the extent that the EUV used light is reflected by a collector mirror 24, which is also referred to as EUV collector 24 below. The EUV collector 24 includes a central passage opening 25 for the pump light 20 focussed towards the plasma source region 19 by way of the focusing lens element 23. The collector 24 is embodied as an ellipsoid mirror and transfers the EUV used light 3 emitted by the plasma source region 19, which is arranged at one ellipsoid focus, to an intermediate focus 26 of the EUV used light 3, which is arranged at the other ellipsoid focus of the collector 24.

The field facet mirror FF is disposed downstream of the intermediate focus 26 in the beam path of the EUV used light 3, in the region of a far field of the EUV used light 3.

The EUV collector 24 and further components of the light source 2, which may be the tin droplet generator 16, the tin capturing device 18 and the focusing lens element 23, are arranged in a vacuum housing 27. The vacuum housing 27 has a passage opening 28 in the region of the intermediate focus 26. In the region of an entrance of the pump light 20 into the vacuum housing 27, the latter includes a pump light entrance window 29 for the light prepulse and for the main light pulse.

Figure 3:
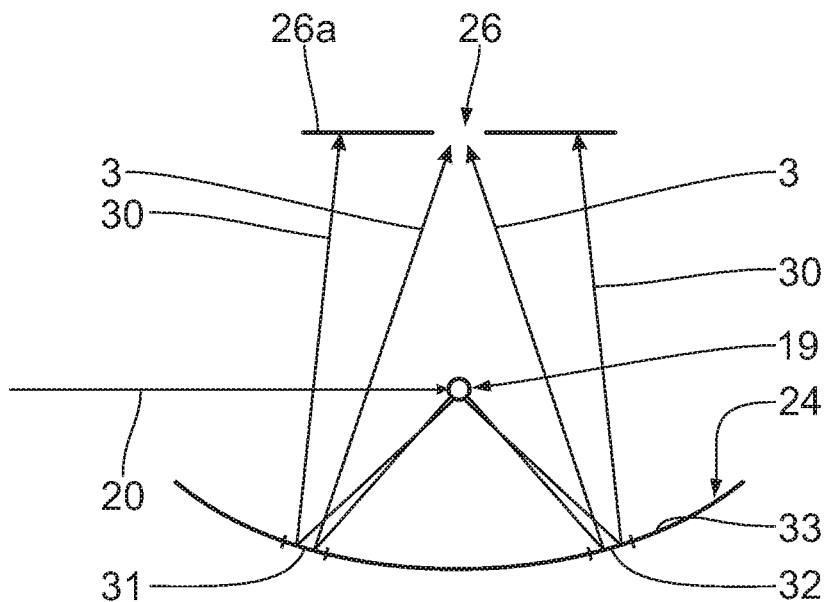
FIG. 3 shows, in a more abstract illustration in comparison with FIG. 3, guidance firstly of EUV used light and secondly of wavelength-different stray light components in the case of reflection/diffraction at the EUV collector.

FIG. 3 shows highly abstractly guidance firstly of EUV used light, that is to say the illumination light 3, and secondly of stray light 30, in particular of radiation of longer wavelength, for example IR radiation having the wavelengths of the light prepulse and/or of the main light pulse, between the plasma source region 19 of the light source 2 and an intermediate focal plane 26a, in which the intermediate focus 26 is arranged. At the same time FIG. 3 shows a variant the manner in which of the pump light 20 is guided to the plasma source region 19, that is to say guidance which does not involve a passage opening of the type of the passage opening 25 in the EUV collector 24. In the case of FIG. 3, the pump light is laterally guided to the plasma source region 19. However, other approaches may be used with or without a passage opening 25 in the EUV collector 24.

Optionally, guidance of the pump light 20 to the source region 19 may include multiple passage openings in the collector 24 and/or may involve guidance of the pump light 20 to the source region 19 from multiple different directions without having the pump light 20 pass through a passage opening in the collector 24. Referring again to FIG. 3, both the used light 3 and the stray light 30 emanate from the plasma source region 19. Both the used light 3 and the stray light 30 are incident on surface sections 31, 32 of an entire impingement surface 33 of the EUV collector 24. The surface sections 31, 32 are sections of a grating surface— likewise designated by 33 in the drawing—of the EUV collector 24. An optical grating for diffractively dumping the stray light radiation 30 is arranged on the grating surface. Embodiments of the optical grating are described below. The grating surface can be arranged exclusively at the location of the surface sections 31, 32 on which the stray light 30 impinges, or can alternatively also cover larger sections of the impingement surface 33, and cover the entire impingement surface 33 in a further variant. In general, the grating surface can have any configuration that may be effective in diffractively directing undesired light (e.g., the stray light 30) from the beam path of the used light 3.

Figure 4:
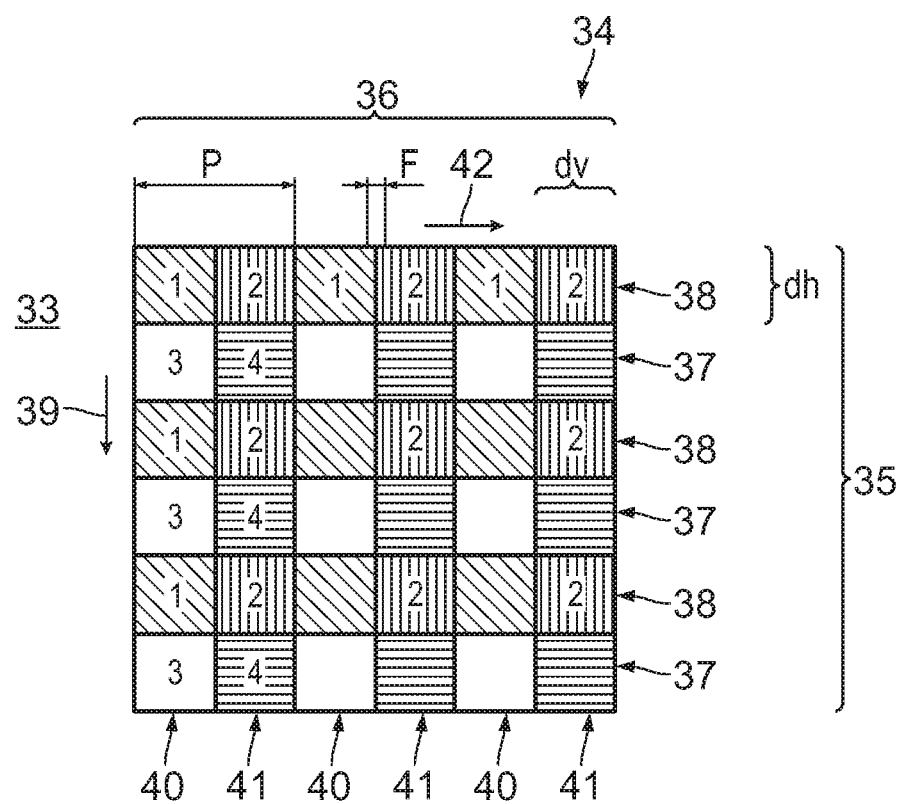
FIG. 4 shows a plan view of a section of a grating surface of an optical grating including two diffraction gratings as diffraction structure groups having mutually perpendicular period running directions and identical grating periods, wherein structure depths predefining three diffraction structure levels of diffraction structures which are square in FIG. 4 are illustrated via different types of hatching, wherein the optical grating constitutes one embodiment of an optical diffraction component for suppressing at least one target wavelength by destructive interference.

FIG. 4 shows an embodiment of an optical grating 34 on a section of the grating surface 33. The optical grating 34 constitutes an optical diffraction component for suppressing at least one target wavelength by destructive interference.

The grating surface of the optical grating 34 can be embodied as plane or else curved, e.g. concave like the impingement surface 33 in the case of the collector mirror 24 according to FIGS. 2 and 3, or else convex. Combinations of shapes of the optical grating 34 are also possible. As an example, one or more different regions of the optical grating 34 may be concave, while one or more different regions of the optical grating 34 may be convex, and/or while one or more different regions of the optical grating 34 may be planar.

The optical grating 34 has, as diffraction structure groups, two diffraction gratings 35, 36 arranged on the grating surface 33. The diffraction grating 35 is also referred to hereinafter as first diffraction grating. The diffraction grating 36 is also referred to hereinafter as second diffraction grating.

In the case of the diffraction grating 35, diffraction positive structures 37 and diffraction negative structures 38 run alternately in each case horizontally in FIG. 4. A period running direction 39 of this first diffraction grating 35 runs perpendicularly. For this horizontal course of the diffraction structures 37, 38, the period running direction 39 thus runs vertically in FIG. 4.

In FIG. 4, the second diffraction grating 36 has vertically running diffraction positive structures 40 and diffraction negative structures 41 respectively alternating therewith. A period running direction 42 of the second diffraction grating 36 once again runs perpendicularly to the diffraction structures 40, 41, that is to say horizontally, in FIG. 4.

The diffraction structures 37, 38 and 40, 41 of the two diffraction gratings 35, 36 of the optical grating 34 are realized by four diffraction structure types or diffraction structure levels, which differ in their structure depth and are illustrated in FIG. 4 by different types of hatching and by numerals 1, 2, 3, 4 applied to the respective diffraction structure. The diffraction structure type "1" has the structure depth 0. The diffraction structure type "2" has the structure depth "dv". That surface section of the grating surface which is occupied by the respective diffraction structure type "2" is thus at a location deeper than the diffraction structure type "1" by the structure depth dv perpendicularly to the plane of the drawing in FIG. 4.

The respective structure depth can be assigned a depth value relative to a reference plane, wherein as a general rule the reference plane chosen is the one for which no material is removed (structure depth=0).

The respective areas of the diffraction structure types "1" to "4" are square in each case. Other boundary shapes of the diffraction structure types which result in complete coverage of the grating surface are also possible. Such boundary shapes include, for example, those having straight sides, such as, for example, rectangular, trapezoidal, triangular, scalene, pentagonal, hexagonal, octagonal, and/or parallelogram, generally so long as complete coverage of the grating surface is achieved via the use such boundary shapes.

The diffraction structure type "3" has a structure depth dh, once again measured relative to the diffraction structure type "1" perpendicularly to the plane of the drawing in FIG. 4. The diffraction structure type "4" has a correspondingly measured structure depth dv+dh.

In the case of the optical grating 34, the four diffraction structure types "1" to "4" are respectively arranged in a 2×2 array, wherein the diffraction structure type "1" is arranged at the top left, the diffraction structure type "2" is arranged at the top right, the diffraction structure type "3" is arranged at the bottom left and the diffraction structure type "4" is arranged at the bottom right. These 2×2 arrays of such groups of the 4 diffraction structure types in each case are in turn arranged in a superstructure in the form of a 3×3 array in the embodiment according to FIG. 4. Generally, the optical grating 34 on the grating surface 33 can, of course, be extended in any desired way horizontally and vertically by attachments of further corresponding 2×2 arrays of the four diffraction structure types "1" to "4".

Diffraction positive structures 37 and diffraction negative structures 38 situated at a position deeper by the structure depth dh in comparison therewith thus succeed one another in the period running direction 39 of the first diffraction grating 35. In the case of the second diffraction grating 36, one of the diffraction positive structures 40 is respectively followed, in the period running direction 42, by a diffraction negative structure 41 situated at a position deeper by the structure depth dv. Two diffraction gratings 35, 36 being superimposed on one another and having respective structure depths dh and dv are thus realized in the optical grating 34.

In the case of the embodiment according to FIG. 4, the structure depth is the height difference between the respective diffraction positive structures and the associated diffraction negative structures. More generally, the structure depth can be understood as an optical path difference between the diffraction positive structures and the associated diffraction negative structures.

On the diffraction positive structures 37, 40 and the diffraction negative structures 38, 41, over the whole area it is possible to apply a highly reflective coating on the optical grating 34, and optionally also an auxiliary layer.

The auxiliary layer, which is arranged below the highly reflective coating, can be a layer that increases a lifetime of the optical grating 34. Alternatively or additionally, an auxiliary layer can also be applied on the highly reflective coating in order to protect the latter against damage.

The highly reflective coating can be a multilayer, such as is known for the highly effective reflection of, in particular, radiation having EUV wavelengths.

The diffraction gratings 35, 36 of the optical grating 34 are embodied in each case as a binary grating. Here the surface area of the diffraction positive structures is equal to the surface area of the diffraction negative structures.

A grating period of the diffraction grating 35 can be in the range of between 0.5 mm and 5 mm (e.g., from 0.5 mm to 4.5 mm, from 0.5 mm to 4 mm, from 0.5 mm to 3.5 mm, from 0.5 mm to 3 mm, from 0.5 mm to 2.5 mm, from 0.5 mm to 2 mm, from 0.5 mm to 1.5 mm, from 0.5 mm to 1 mm, from 1 mm to 5 mm, from 1.5 mm to 5 mm, from 2 mm to 5 mm, from 2.5 mm to 5 mm, from 3 mm to 5 mm, from 3.5 mm to 5 mm, from 4 mm to 5 mm, from 4.5 mm to 5, 2 mm). A grating period of the diffraction grating 36 can be in the range of between 0.5 mm and 5 mm (e.g., from 0.5 mm to 4.5 mm, from 0.5 mm to 4 mm, from 0.5 mm to 3.5 mm, from 0.5 mm to 3 mm, from 0.5 mm to 2.5 mm, from 0.5 mm to 2 mm, from 0.5 mm to 1.5 mm, from 0.5 mm to 1 mm, from 1 mm to 5 mm, from 1.5 mm to 5 mm, from 2 mm to 5 mm, from 2.5 mm to 5 mm, from 3 mm to 5 mm, from 3.5 mm to 5 mm, from 4 mm to 5 mm, from 4.5 mm to 5, 0.5 mm, 1 mm, 1.5 mm, 2 mm, 2.5 mm, 3 mm, 3.5 mm, 4 mm, 4.5 mm, 5 mm).

Such a grating period is designated by P for the second diffraction grating 36 in FIG. 4. A structure sidewall of the respective diffraction structures 37, 38, 40, 41 can have an extent in the range of between 1 μm and 10 μm (e.g., from 1 μm to 9 μm, from 1 μm to 8 μm, from 1 μm to 7 μm, from 1 μm to 6 μm, from 1 μm to 5 μm, from 1 μm to 4 μm, from 1 μm to 3 μm, from 1 μm to 2 μm, from 2 μm to 10 μm, from 3 μm to 10 μm, from 4 μm to 10 μm, from 5 μm to 10 μm, from 6 μm to 10 μm, from 7 μm to 10 μm, from 8 μm to 10 μm, from 9 μm to 10 μm, 1 μm, 2 μm, 3 μm, 4 μm, 5 μm, 6 μm, 7 μm, 8 μm, 9 μm, 10 μm), perpendicularly to the extension of the respective diffraction structure, that is to say measured in the respective period running direction 39 to 42. Such a sidewall extent or sidewall extension is indicated at F with a greatly exaggerated size for the second diffraction grating 36 in FIG. 4.

Figure 5:
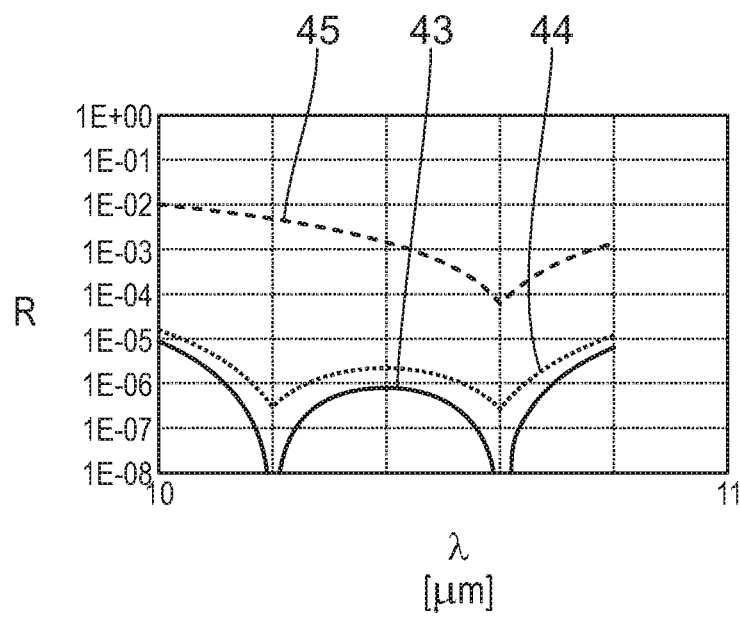
FIG. 5 shows, in a diagram, a wavelength-dependent reflectivity R of the optical grating according to FIG. 4 for a calculated ideal case and for a further, calculated, more realistic case and for a reference grating not according to the invention, wherein the two diffraction gratings of the optical grating are embodied for suppressing two different wavelengths.

FIG. 5 shows, in a diagram, the result of a calculation of a wavelength-dependent reflectivity of the optical grating 34 for the design parameters dv=2.65 μm and dh=2.55 μm. A reflectivity of the optical grating 34 is plotted at 43, the reflectivity resulting as the result of a calculation in which it is additionally assumed that the sidewall extension F is 0, that is to say the result in the case of an optical grating 34 having ideally steep sidewalls between the diffraction structures. In the case of the suppression design wavelengths 10.2 μm and 10.6 μm for corresponding stray light wavelengths, which are referred to as target wavelengths, the result is a reflectivity suppression of the optical grating 34 in the ideal case of the reflectivity curve 43 of better than $10^{-8}$. These two wavelengths correspond to the wavelengths of the prepulse and of the main pulse of the pump light source 21.

For the two target wavelengths 10.2 μm ($\lambda_1$) and 10.6 μm ($\lambda_2$) it holds true that:

$$(\lambda_1-\lambda_2)^2/(\lambda_1+\lambda_2)^2=3.77 \cdot 10^{-4}$$

For this normalized target wavelength ratio it thus holds true that:

$$(\lambda_1-\lambda_2)^2/(\lambda_1+\lambda_2)^2<10\%$$

This normalized target wavelength ratio can also be less than 20%.

A reflectivity curve R ($\lambda$) taking account of specific tolerances as far as firstly the accuracy of the production of the structure depths dv and dh and also the sidewall steepness are concerned is plotted at 44 in FIG. 5. In the case of the target wavelengths 10.2 μm and 10.6 μm, the result is a reflectivity suppression that is better than $10^{-6}$.

A reference reflectivity curve 45 is also entered in FIG. 5 for comparison purposes, the reference reflectivity curve representing the suppression result for an optical reference grating including exactly one diffraction grating, that is to say e.g. either the diffraction grating 35 having the horizontal diffraction structures or the diffraction grating 36 having the vertical diffraction structures. The same tolerances for the structure depth production and for the sidewall steepness as in the case of the reflectivity curve 44 are taken into account here. It is evident that, despite the same tolerances, the reference reflectivity curve 45 exhibits a significantly lower optimum reflectivity suppression in the region of $10^{-4}$. Since the reference grating for which the reference reflectivity curve 45 was calculated includes moreover just one diffraction grating, only exactly one wavelength is also suppressed here, namely 10.6 μm.

The two diffraction gratings 35, 36 have a ratio between a grating period (2 mm) and a structure depth (in the region of 2.6 μm) which is significantly greater than 10 and is actually greater than 500 and is in the region of 1000. Exemplary ratios include 100, 150, 200, 250, 300, 350, 400, 450, 500, 550, 600, 650 700, 750, 800, 850, 900, 950 and 1000.

On account of the embodiment of the two diffraction gratings 35, 36 as binary gratings, a surface area ratio of the surface areas of the diffraction positive structures 37, 40 to surface areas of the diffraction negative structures 38, 41 is 1. Depending on the embodiment of the optical grating 34, the surface area ratio can also deviate from 1 and can be in the range of between 0.9 and 1.1 (e.g., 0.9, 0.95, 1, 1.05, 1.1).

The two diffraction gratings 35, 36 have the same grating period p, and so a period ratio of the two grating periods is 1 (e.g., 0.9, 0.95, 1, 1.05, 1.1). Depending on the embodiment of the optical grating 34, the period ratio can be in the range of between 0.9 and 1.1 (e.g., 0.9, 0.95, 1, 1.05, 1.1). The differences between the two grating periods can also be significantly greater, such that for example a period ratio of 1:2 or of 1:5 results.

The optical grating 34 constitutes an optical diffraction component for suppressing at least one target wavelength $\lambda_1$, $\lambda_2$ by destructive interference including at least three diffraction structure levels corresponding to the diffraction structure types 1 to 4. The diffraction structure levels $N_1$ to $N_4$ predefine different structure depths $d_i$ relative to a reference plane. The diffraction structure levels $N_1$ to $N_4$ can be assigned to the two diffraction gratings, that is to say two diffraction structure groups 35, 36, which in turn serve for suppressing respectively one of the two target wavelengths $\lambda_1$, $\lambda_2$. The first of the diffraction structure groups, that is to say the diffraction grating 35, serves for suppressing the first target wavelength $\lambda_1$ in the zero order of diffraction and the second of the diffraction structure groups, that is to say the diffraction grating 36, serves for suppressing the second target wavelength $\lambda_2$ in the zero order of diffraction.

The topography of the diffraction structure levels $N_1$ to $N_4$ can be described as a superimposition of the two binary diffraction structure groups 35 and 36. Each of these two binary diffraction structure groups has first surface sections having a first structure depth and second surface sections having a second structure depth, which alternate with the first surface sections along a running direction of the respective diffraction structure group 35, 36. Boundary regions between these adjacent surface sections of each of the binary diffraction structure groups have a linear course. Depending on the embodiment of the optical grating 34, the linear course corresponds to the rows and columns of the diffraction structure type arrangement resembling a checkerboard in FIG. 4. First boundary regions of the first of the two binary diffraction structure groups 35, that is to say the row lines in FIG. 4, and second boundary regions of the second of the two binary diffraction structure groups 36, that is to say the column lines in FIG. 4, are superimposed on one another at most along sections of their linear course, namely in the region of the points of intersection between the row and column lines in the illustration according to FIG. 4.

The diffraction grating 35 has a first grating period having a first structure depth, measured as optical path difference between first diffraction positive structures 37 and first diffraction negative structures 38 perpendicular to a surface section of the grating surface 33 that respectively surrounds these first structures. The second diffraction grating 36 has a second grating period and a second structure depth, which is in turn embodied as optical path difference between the second diffraction positive structures 40 and second diffraction negative structures 41 perpendicular to a surface section of the grating surface 33 that respectively surrounds these second structures. The two period running directions along which the two grating periods of these gratings 35, 36 run are perpendicular to one another, that is to say do not run parallel to one another.

On account of the optical grating 34, the collector mirror of the EUV collector 24 is embodied such that it guides the EUV radiation 3 through towards the focal region 26, wherein the grating 34 is embodied as an optical diffraction component such that the optical diffraction component guides the radiation 30 of the at least one target wavelength, that is to say the stray light, away from the focal region 26.

Figure 6:
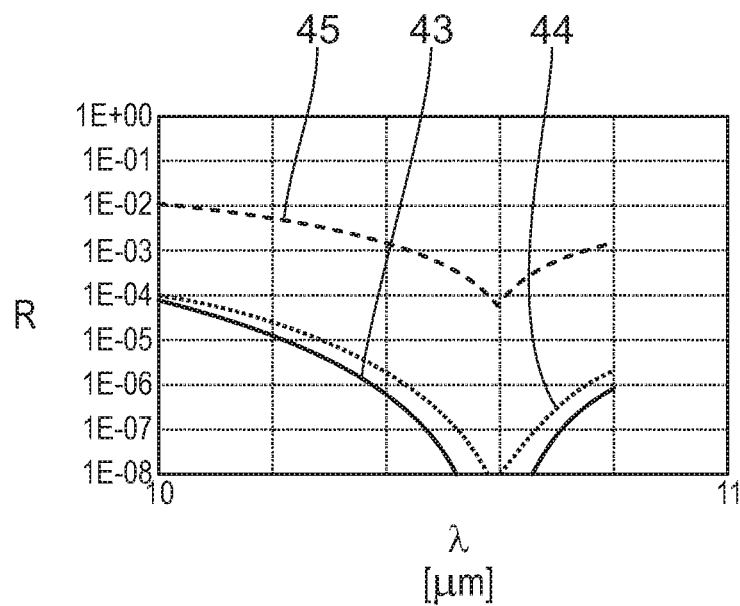
FIG. 6 shows, in a diagram similar to FIG. 5, the relations in the case of an optical grating according to FIG. 4, wherein the two diffraction gratings have identical structure depths, such that the optical grating is embodied for suppressing exactly one wavelength.

FIG. 6 shows, in an illustration similar to FIG. 5, reflectivity relations in a variant of the optical grating 34 in which the structure depths dv, dh are equal in magnitude and have an absolute value of 2.65 µm. Both diffraction gratings 35, 36 then contribute to suppressing the stray light wavelength of 10.6 µm. Accordingly, once again better suppression relations arise in the case of the ideal reflectivity curve 43 and in the case of the reflectivity curve 44 calculated with the design tolerances.

Figure 7:
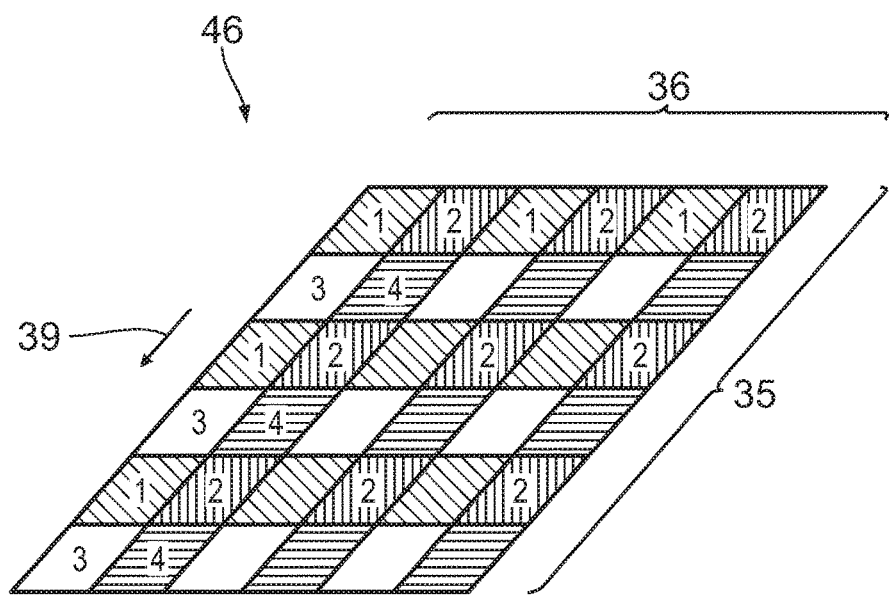
FIG. 7 shows, in an illustration similar to FIG. 4, a further embodiment of an optical grating including two diffraction gratings as diffraction structure groups having period running directions which assume an angle of 45° with respect to one another, wherein the optical grating constitutes one embodiment of an optical diffraction component for suppressing at least one target wavelength by destructive interference.

FIG. 7 shows, in an illustration similar to FIG. 4, a variant of the optical grating which can be used instead of the optical grating 34 according to FIG. 4 as an optical diffraction component for suppressing at least one target wavelength by destructive interference. Components and functions corresponding to those which have already been explained above with reference to FIG. 4 bear the same reference signs and will not be discussed in detail again.

The optical grating 46 according to FIG. 7 differs from that from FIG. 4 preliminary in that a period running direction 39 of the first diffraction grating 35 does not run vertically, but rather at an angle of 45° with respect to the horizontal. Accordingly, the diffraction structure types "1" to "4" arise with rhombic areas.

Figure 8:
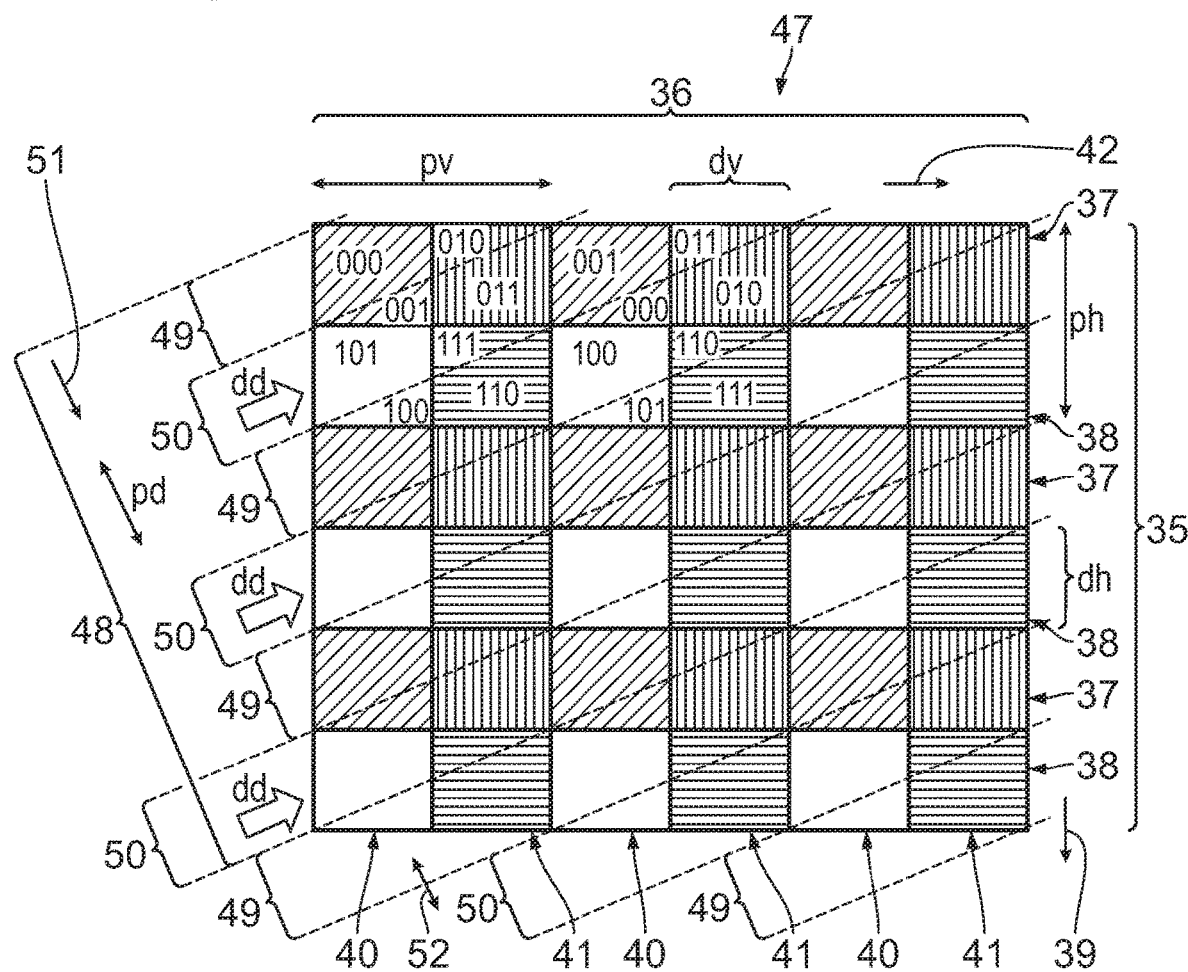
FIG. 8 shows, in an illustration similar to FIG. 4 and FIG. 7, a further embodiment of an optical grating including three diffraction gratings as diffraction structure groups, two of which have period running directions which are perpendicular to one another, and a third diffraction grating of which has a diagonal period running direction relative thereto, wherein the optical grating constitutes one embodiment of an optical diffraction component for suppressing at least one target wavelength by destructive interference.

FIG. 8 shows a further embodiment of an optical grating 47 which can be used as an alternative or in addition to the above-described optical gratings as an optical diffraction component for suppressing at least one target wavelength by destructive interference. Components and functions corresponding to those which have already been explained above with reference to FIG. 1 to FIG. 7, and particularly with reference to FIG. 4 to FIG. 7, bear the same reference signs and will not be discussed in detail again.

The optical grating 47 has a total of three diffraction gratings as diffraction structure groups, wherein two of these three diffraction gratings correspond to the diffraction gratings 35 and 36 of the embodiment according to FIG. 4. In FIG. 8, a grating period of the diffraction grating 35 is illustrated at ph, and a grating period of the diffraction grating 36 at pv.

A third diffraction grating 48 of the optical grating 47 has diffraction positive structures 49 and diffractive negative structures 50 running diagonally with respect to the diffraction structures 37, 38 and 40, 41 of the first two diffraction gratings 35, 36. In comparison with the diffraction positive structures 49, the diffraction negative structures 50 have a structure depth illustrated by dd in FIG. 8.

An overall height profile over the entire illustrated section of the grating surface of the optical grating 47 can be understood as a juxtaposition of basic sections in the form of 2×4 arrays, which are predefined by the boundaries of the horizontally running diffraction structures 37, 38 of the diffraction grating 35 and the vertically running diffraction structures 40, 41 of the diffraction grating 36. Diffraction structure types or diffraction structure levels on this 2×4 array are designated by "000", "001", "010", "011", "100", "101", "110" and "111" on the 2×4 array arranged at the top left in FIG. 8.

The table below indicates the structure depths of these diffraction structure types and also the surface area proportions thereof in units of the grating periods ph, pv:

TABLE 1

| Diffraction structure type | Structure depth | Surface area proportion |
|---|---|---|
| 000 | 0 | (ph + pv)/4 |
| 001 | dd | (ph + pv)/4 |
| 010 | dv | (ph + pv)/4 |
| 011 | dv + dd | (ph + pv)/4 |
| 100 | dh | (ph + pv)/4 |
| 101 | dh + dd | (ph + pv)/4 |
| 110 | dh + dv | (ph + pv)/4 |
| 111 | dh + dv + dd | (ph + pv)/4 |

All diffraction structure types "000" to "111" have the same surface area proportion (ph+pv)/4 of the total surface area of the optical grating 47. This ensures that all three diffraction gratings 35, 36 and 48 of the optical grating 47 constitute binary gratings and the diffraction positive structures 37, 40, 49 thereof have a surface area ratio of 1 in each case with respect to the diffraction negative structures 38, 41, 50 thereof.

A period running direction 51 of the third diffraction grating 48 runs along a grating period pd at an angle of approximately 23° with respect to the period running direction 39 of the diffraction grating 35. This period running direction 51 is chosen together with an offset of an arrangement of the diffraction structures 49, 50 of the third diffraction grating 48 such that boundaries between the diffraction structures 49, 50 of the third diffraction grating 48 run along diagonals of two structure zones lying horizontally next to one another, which are formed by the diffraction structures 37, 38, firstly, and 40, 41, secondly, that intersect one another. An offset variation of this arrangement of the diffraction structures 49, 50 along the period running direction 51 of the third diffraction grating 48 is possible, as indicated by a double-headed arrow 52 in FIG. 8.

The grating period pd of the third diffraction grating 48 is of the order of magnitude of the grating periods ph, pv and is approximately 1.7 mm in the case of the optical grating 47.

Figure 9:
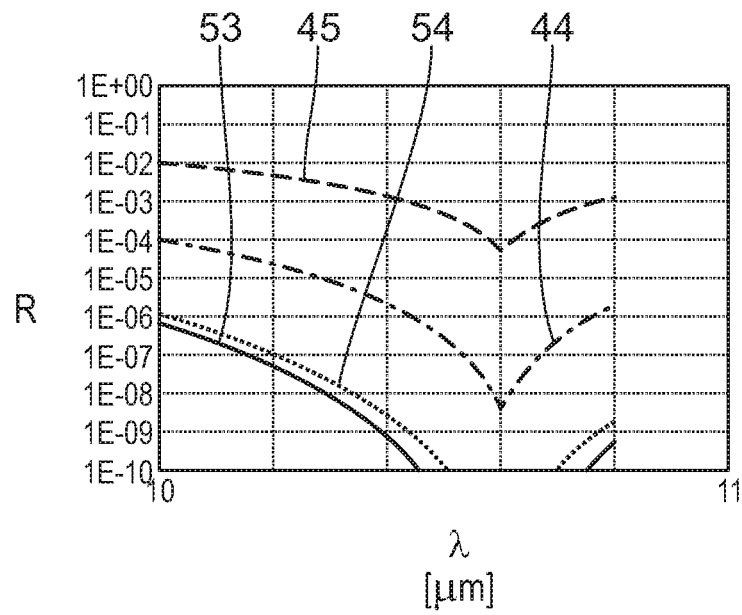
FIG. 9 shows, in a diagram similar to FIG. 5 and FIG. 6, reflection relations in the case of an optical grating according to FIG. 8, in which all three diffraction gratings are embodied for suppressing one and the same wavelength.

FIG. 9 shows, in an illustration similar to FIGS. 5 and 6, data concerning the wavelength-dependent reflectivity R for the case where the structure depths dh, dv and dd are each equal in magnitude and have the value 2.65 µm in the example described.

A reflectivity for the ideal case of preferably steep sidewalls (sidewall extension 0) for the diffraction gratings 35, 36 and 48 is illustrated at 53 in FIG. 9. A reflectivity suppression of a target wavelength of 10.6 µm is better than $10^{-10}$ by orders of magnitude. 54 illustrates the calculated result of the wavelength-dependent reflectivity, wherein once again realistic tolerances would be assumed for the structure depths of the diffraction structures 37, 38, 40, 41, 49, 50 and for the sidewall extensions. The result for the optical grating 47 including the three diffraction gratings 35, 36, 48 is a reflectivity suppression which although lower than in the ideal case, is still distinctly better than $10^{-10}$.

As reference values, FIG. 9 also depicts the reflectivity curves 44 and 45 in accordance with FIG. 6 firstly for the optical grating 34 including the two diffraction gratings 35, 36 and for the conventional optical grating including exactly one diffraction grating.

FIG. 10 shows, once again in a wavelength-dependent diagram, the reflectivity relations of an embodiment of the optical grating 47 having the following structure depths:

dh=2.55 µm, dv=2.65 µm and dd=0.26 µm.

The structure depth dd of the diagonally running diffraction structures 49, 50 is thus smaller than the structure depths of the diffraction structures 37, 38, 40, 41 of the diffraction gratings 35, 36 of the optical grating 47 by approximately a factor of 10.

Figure 10:
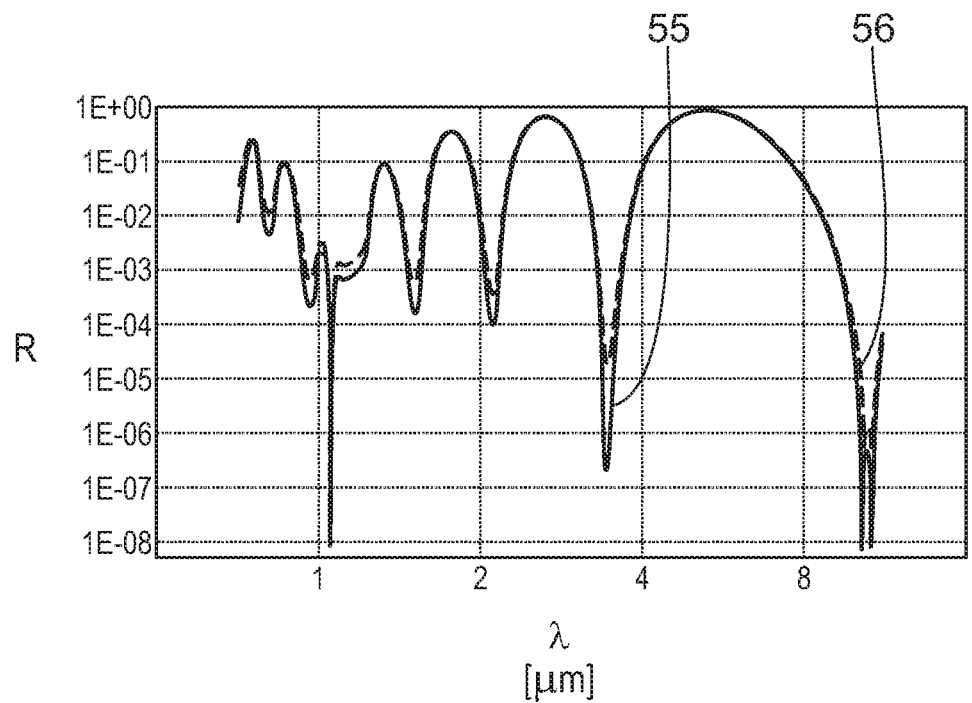
FIG. 10 shows, in a diagram similar to FIG. 9, the reflection relations in the case of an optical grating of the type from FIG. 8, wherein the three diffraction gratings have different structure depths, such that the optical grating is embodied for suppressing different wavelengths.

The reflectivity once again for an ideal design of such an optical grating 47 with a sidewall extension 0 is illustrated at 55 in FIG. 10. For the two suppression wavelengths at approximately 10.2 µm ($\lambda_1$) and approximately 10.59 µm ($\lambda_2$) and also at a further wavelength in the region of 1.05 µm, a reflectivity suppression of the optical grating is in each case in the region of $10^{-8}$ or better.

For the two IR wavelengths $\lambda_2$ that are suppressed as target wavelengths by the optical grating 47, the explanation given above in association with the optical grating 34 according to FIG. 4 holds true in turn for the normalized difference in the target wavelengths.

A reflectivity curve having predefined tolerances for the structure depths, firstly, and the sidewall extension, secondly, is in turn calculated at 56 in FIG. 10.

In the case of the optical grating 47, a diffraction grating 48 having a further grating period pd and a further structure depth dd is thus present, the structure depth being measured as optical path difference between the diffraction positive structures 49 and the diffraction negative structures 50 perpendicular to a surface section of the grating surface 33 that respectively surrounds these two structures 49, 50. The ratio pd/dd between the grating period pd of the diffraction grating 48 and the structure depth dd of the diffraction grating 48 is greater than 10. Alternatively or additionally, the period ratio ph/pd can be in the range of between 0.9 and 1.1 (e.g., 0.9, 0.95, 1, 1.05, 1.1). Alternatively or additionally, the first grating period ph can run along the first period running direction 39 of the first diffraction grating 35 and the further grating period pd can run along the further period running direction 51 of the further diffraction grating 48 and the two period running directions 39, 51 run parallel to one another.

The surface areas of the diffraction positive structures 37, 40, 49 and of the diffraction negative structures 38, 41, 50 of the various diffraction structure groups 35, 46, 48 make identical contributions to the entire grating surface 33.

A further embodiment of an optical grating 57, once again including three diffraction gratings 35, 36, 48, is described below with reference to FIG. 11. Components and functions corresponding to those which have already been explained above with reference to FIGS. 1 to 10, and particularly with reference to FIG. 8, bear the same reference signs and will not be discussed in detail again.

The optical grating 57 differs from the optical grating 47 primarily in the orientation of the three period running directions 39, 42 and 51 of the three diffraction gratings 35, 36 and 48 placed one above another. The period running direction 39 of the first diffraction grating 35 runs at an angle of approximately 23° with respect to the vertical in FIG. 11.

The period running direction 42 of the second diffraction grating 36 runs horizontally.

The period running direction 51 of the third diffraction grating 48 runs in turn at an angle of approximately 23° with respect to the vertical, wherein the two period running directions 39 and 51 firstly of the first diffraction grating 35 and secondly of the third diffraction grating 48 assume an angle of approximately 46° with respect to one another.

Figure 11:
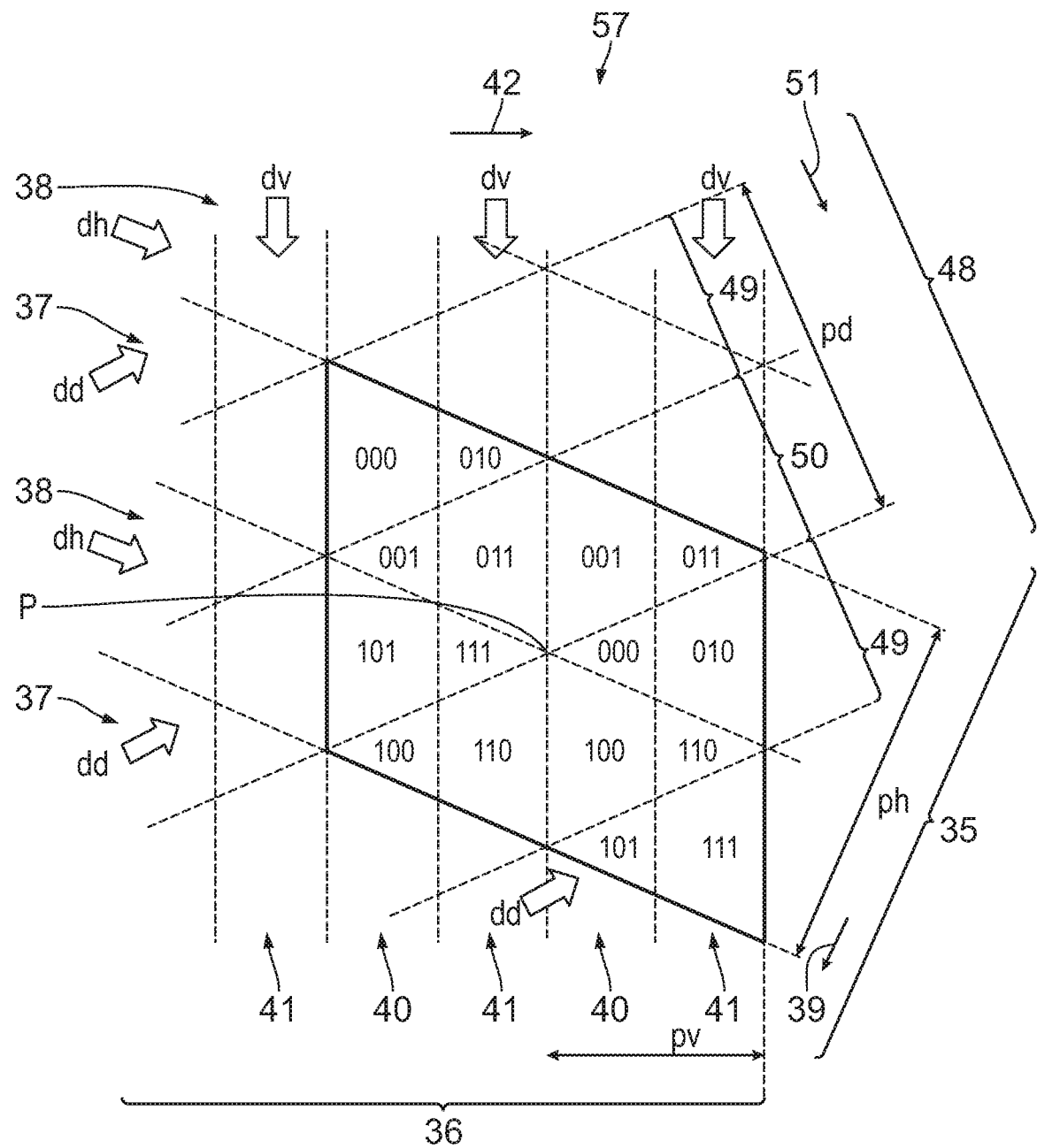
FIG. 11 shows, in an illustration similar to FIG. 8, a further embodiment of an optical grating including three diffraction gratings as diffraction structure groups having respective period running directions which assume in pairs an angle different from zero, wherein the optical grating constitutes one embodiment of an optical diffraction component for suppressing at least one target wavelength by destructive interference.

FIG. 11 highlights a rhombic basic section of the optical grating 57 corresponding to the 2×4 array of the optical grating 47 once again with diffraction structure types "000" to "111". An assignment of the structure depths and also of the surface area proportions in the case of these diffraction structure types "000" to "111" of the optical grating 57 is just like as indicated above in Table 1 concerning FIG. 8.

In the case of the optical grating 57, an offset of structure boundaries of the third diffraction grating 48 along the period running direction 51 is such that structure boundaries between the diffraction structures 37, 38 of the first diffraction grating 35, between the diffraction structures 40, 41 of the second diffraction grating 36 and between the diffraction structures 49, 50 of the third diffraction grating 48 intersect in each case at a point P in the centre of the basic section illustrated in FIG. 11.

In the case of the optical grating 57, the grating period ph is approximately 3.25 mm, the grating period pv is 2 mm and the grating period pd is of exactly the same magnitude as the grating period ph.

Figure 12:
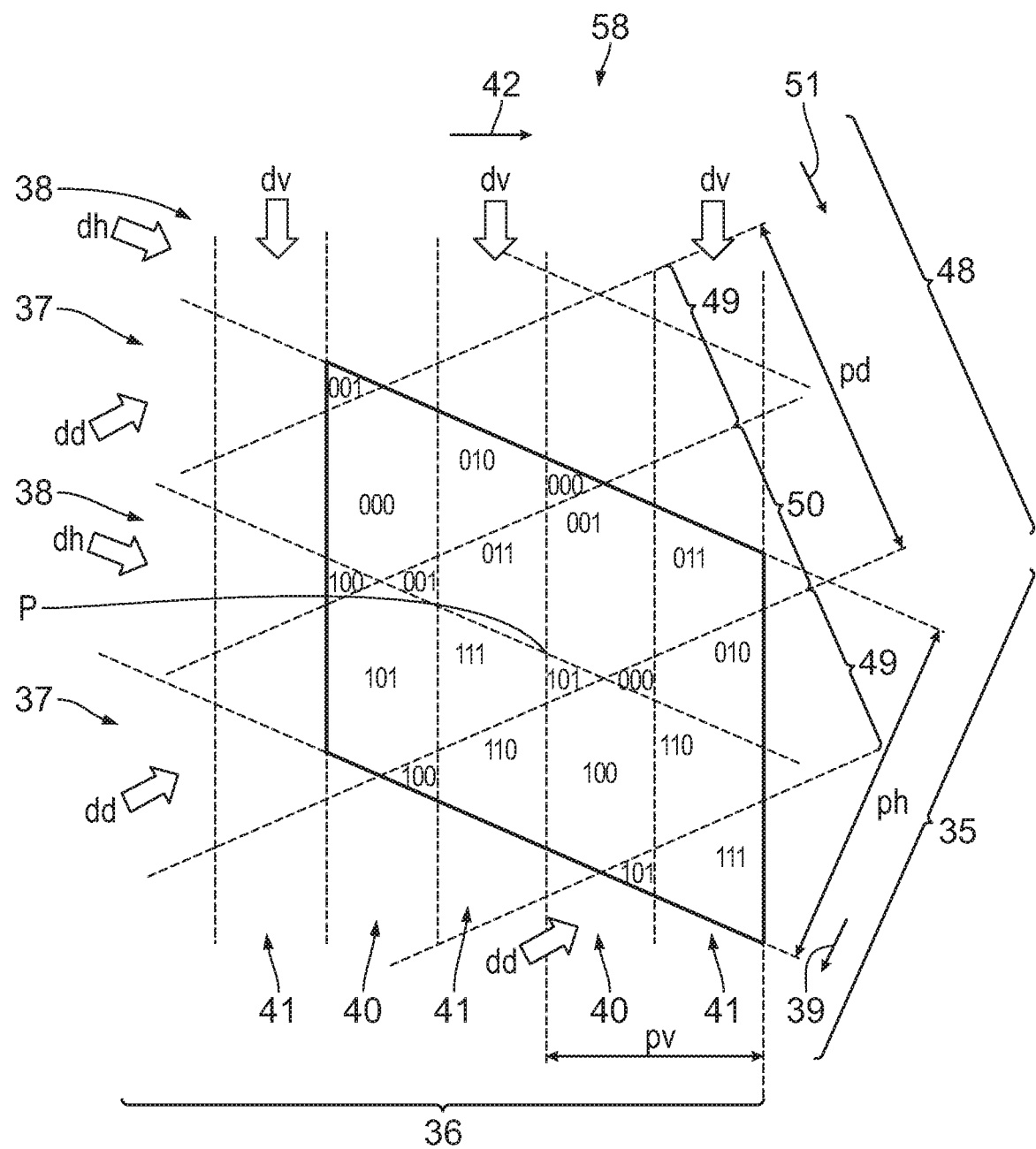
FIGS. 12 and 13 show, in an illustration similar to FIG. 11, further embodiments of optical gratings each including three diffraction gratings as diffraction structure groups having period running directions corresponding to those of the embodiment according to FIG. 11, wherein the diffraction structures of the embodiments according to FIGS. 12 and 13 are arranged in a manner offset with respect to one another and in relation to the embodiment according to FIG. 11 in the respective period running direction, wherein the optical gratings constitute further embodiments of optical diffraction components for suppressing at least one target wavelength by destructive interference.
Figure 13:
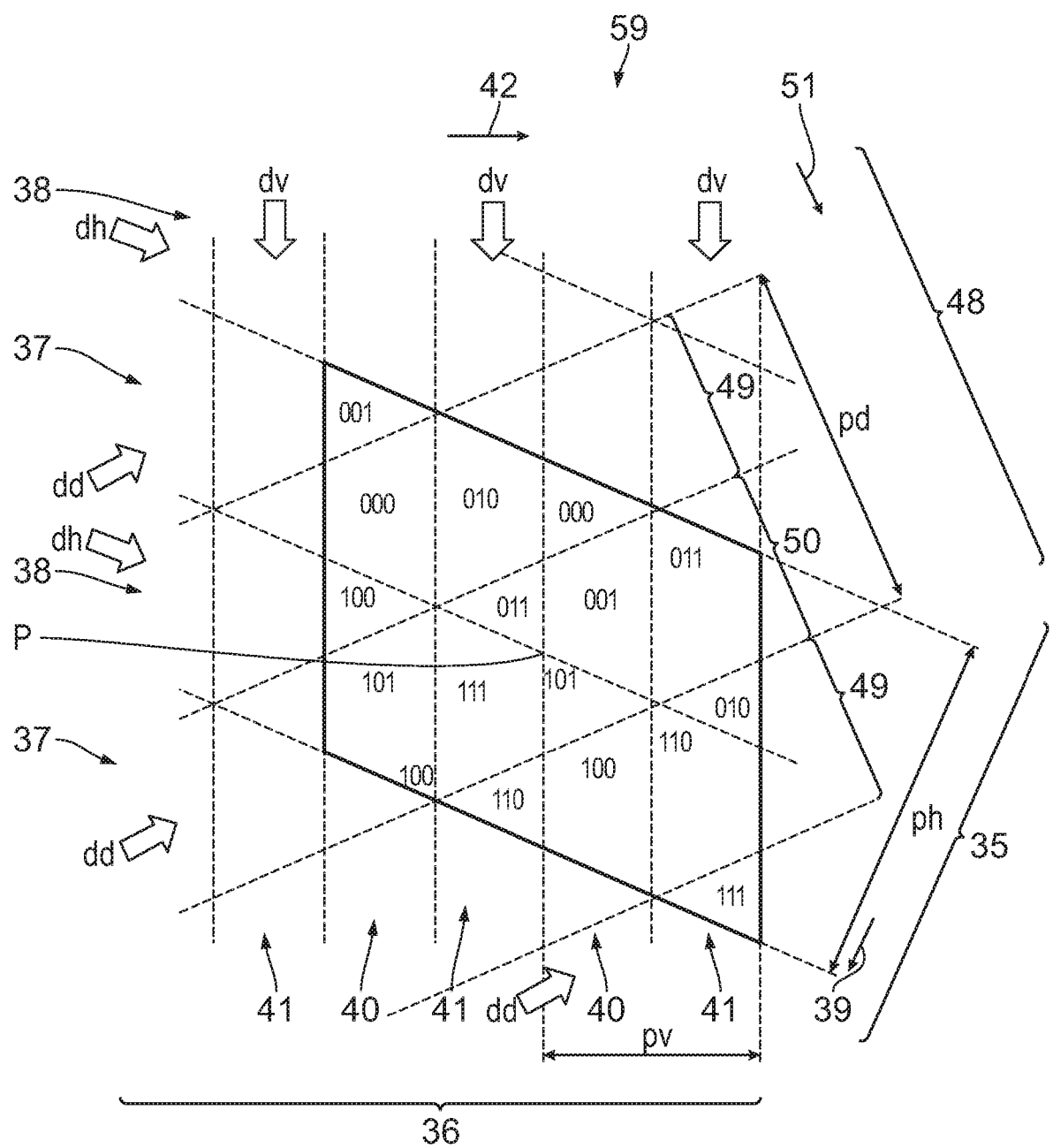

FIGS. 12 and 13 show further embodiments of optical gratings 58, 59, which differ from the optical grating 57 merely in the size of the offset of the arrangement of the structure boundaries between the diffraction structures 49, 50 along the period running direction 51. In the case of the optical grating 58 according to FIG. 12, the offset is such that the structure boundaries of the various diffraction gratings 35, 36, 48 do not intersect at a point in the respective basic section. In the case of the optical grating 59 according to FIG. 13, the offset is such that the structure boundaries of the three diffraction gratings 35, 36, 48 intersect at different positions within the respective basic section in comparison with the embodiment according to FIG. 11, thus resulting in turn in a different distribution of the diffraction structure types "000" to "111".

The assignment of the structure depths and the surface area proportions of the diffraction structure types "000" to "111" indicated within the highlighted unit cells in FIGS. 12 and 13 is once again as indicated in Table 1 concerning FIG. 8.

A further embodiment of an optical grating 60 as an optical diffraction component for suppressing at least one target wavelength by destructive interference is explained below with reference to FIGS. 14 to 16. Components and functions corresponding to those which were already explained above with reference to FIGS. 1 to 13 are denoted by the same reference signs and are not discussed in detail again.

Figure 14:
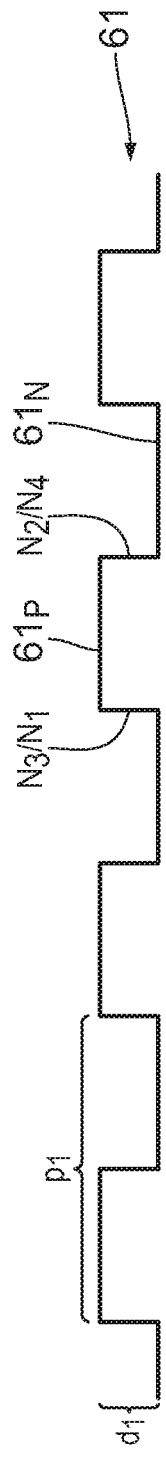
FIG. 14 shows, in a side view, a first diffraction structure group belonging to a further embodiment of an optical diffraction component for suppressing at least one target wavelength by destructive interference, embodied as a binary grating having a first grating period and a first structure depth.
Figure 15:
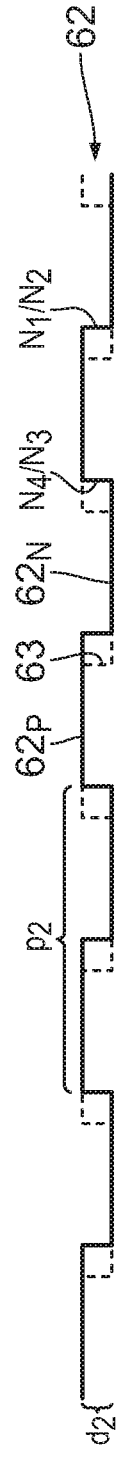
FIG. 15 shows, in an illustration similar to FIG. 14, a further diffraction structure group as part of the optical diffraction component, wherein the further diffraction structure group is in turn embodied as a binary grating having a grating period and a structure depth, wherein a possible overlay error during the production of this diffraction structure group is additionally indicated in a dashed manner.

The optical grating 60 is embodied as a superimposition of two diffraction gratings 61, 62, which are illustrated individually in FIG. 14 (diffraction grating 61) and FIG. 15 (diffraction grating 62). The diffraction gratings 61, 62 constitute diffraction structure groups for suppressing a respective target wavelength.

The diffraction grating 61 has a structure depth $d_1$ and a grating period $p_1$. The diffraction grating 62 has a structure depth $d_2$ and a grating period $p_2$. The two diffraction gratings 61, 62 are embodied in each case as a binary grating.

The optical grating 60 resulting from the superimposition of the two diffraction gratings 61, 62 has a total of three diffraction structure levels or diffraction structure types having structure depths 0 (diffraction structure level $N_1$), structure depth $d_2$ (diffraction structure level $N_2$), having structure depth $d_1$ (diffraction structure level $N_3$) and having structure depth $d_1+d_2$ (diffraction structure level $N_4$).

The grating periods $p_1$ and $p_2$ are identical in the case of the optical grating 60. The structure depths $d_1$, $d_2$ are different in the case of the optical grating 60. In relation to a common period running direction x of the diffraction gratings 61 and 62, these two diffraction gratings 61 and 62 are phase-shifted with respect to one another by one quarter of the common period, that is to say by $p_1/4=p_2/4$ with respect to one another.

Figure 16:
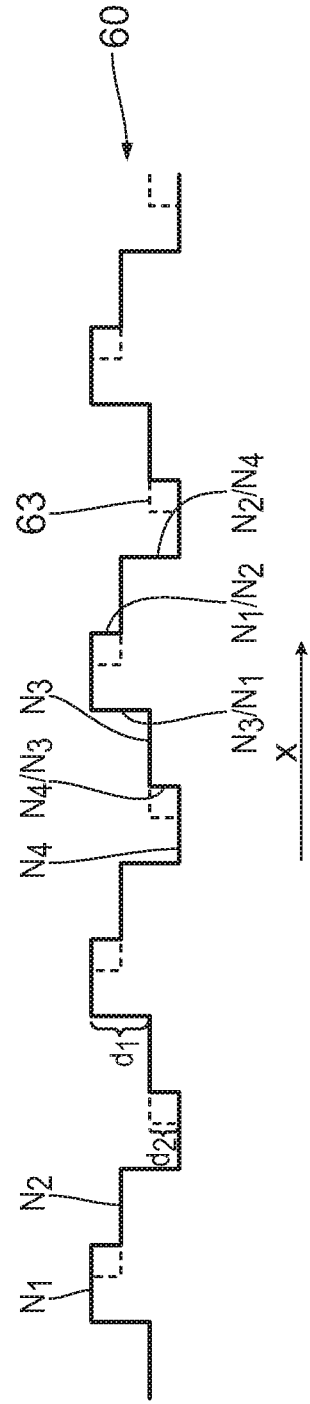
FIG. 16 shows the optical diffraction component arising as a superimposition of the two diffraction structure groups according to FIGS. 14 and 15.

An overlay error 63 along the period running direction x is illustrated in a dashed manner in FIGS. 15 and 16. Such an overlay error 63 can be understood as a phase error of the superimposition of the two diffraction gratings 61, 62 along the period running direction and leads to a change of extensions of the various diffraction structure levels $N_1$, $N_2$, $N_3$, $N_4$ along the period running direction pixel x.

For the case where the two structure depths $d_1$ and $d_2$ are identical in an alternative embodiment of the optical grating 60, the two diffraction structure levels $N_2$, $N_3$ degenerate into a common structure level, with the result that such an optical grating consisting of two diffraction gratings having identical structure depths has exactly three diffraction structure levels.

In the case of the optical grating 60, the surface sections of the diffraction structure groups are designated by $61_P$ and $61_N$. Boundary regions of the first 61 of the two binary diffraction structure groups 61, 62 of the optical grating 60, that is to say the sidewalls between the levels $N_i$ of the diffraction structure group 61, and boundary regions of the second 62 of the two binary diffraction structure groups 61, 62, that is to say the level sidewalls $N_i/N_j$ in FIG. 15, run completely separately from one another.

A further embodiment of an optical grating 60 as an optical diffraction component for suppressing at least one target wavelength by destructive interference is explained below with reference to FIGS. 17 to 19. Components and functions corresponding to those which have already been explained above with reference to FIGS. 1 to 16, and particularly with reference to FIGS. 14 to 16, bear the same reference signs and will not be discussed in detail again.

Figures 17, 18, 19:
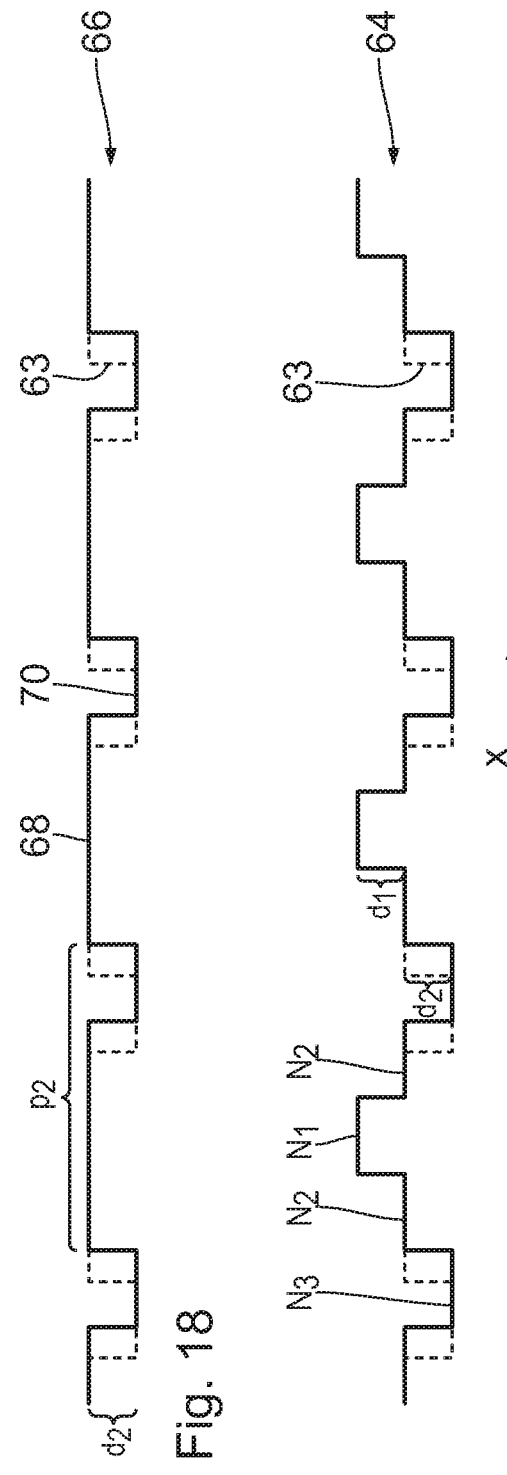
FIGS. 17 to 19 show, in illustrations similar to FIGS. 14 to 16, two diffraction structure groups and the further optical diffraction component arising therefrom as a result of superimposition.

FIG. 19 shows an optical grating 64 that results as a superimposition of two diffraction structure groups in the form once again of diffraction gratings 65 (FIG. 17) and 66 (FIG. 18).

In the case of the diffraction gratings 65, 66 it holds true that:

$p_1=p_2$ and $d_1=d_2$.

A phase offset of the two diffraction gratings 65, 66 with respect to one another along the period running direction x is $p_1/4=p_2/4$.

An extension ratio between diffraction positive structures 67, 68 of the diffraction gratings 65, 66, firstly, and the associated diffraction negative structures 69, 70, secondly, is exactly inverted with respect to one another, with the result that the diffraction positive structures 67 have the same extension along the period running direction x as the diffraction negative structures 70 of the diffraction grating 66 and the diffraction negative structures 69 of the diffraction grating 65 have the same extension along the period running direction x as the diffraction positive structures 68 of the diffraction grating 66. The extensions of the diffraction positive structures 67, 68, firstly, and of the diffraction negative structures 69, 70, secondly, are thus not identical in the respective diffraction grating 65, 66, and so in this sense the two diffraction gratings 65, 66 are not binary gratings. The extension ratio can deviate very significantly from 1:1 and is approximately 1:3 in the case of the diffraction gratings 65, 66. A different extension ratio between the diffraction positive structures 67, 68, firstly, and the diffraction negative structures 69, 70, secondly, of the respective diffraction grating 65, 66 in the range of between 10:1 and 1:10 is also possible.

An overlay error 63 is once again indicated in FIGS. 18 and 19. Unlike in the case of the optical grating 60, the overlay error 63 in the case of the optical grating 64 does not lead to a change of the surface area ratios between the three diffraction structure levels $N_1$ (structure depth 0), $N_2$ (structure depth $d_1=d_2$), and $N_3$ (structure depth $d_1+d_2$) along the period running direction x.

The optical grating 64 thus constitutes an optical diffraction component including a periodic grating structure profile including diffraction structures, having three diffraction structure levels ($N_1$ to $N_3$), which predefine different structure depths $d_i$ relative to a reference plane.

In the case of the optical grating 64, the arrangement of the diffraction structures is such that a wavelength range around a first target wavelength $\lambda_1$ in the infrared wavelength range, which first target wavelength is diffracted by the grating structure profile, has radiation components having at least three different phases which interfere with one another destructively at least in the zero and/or +/− first order(s) of diffraction of the first target wavelength $\lambda_1$.

The diffraction structure levels $N_1$ to $N_3$ predefine a topography of a grating period of the grating structure profile that is repeated regularly along a period running direction x. The diffraction structure levels $N_1$ to $N_3$ include the neutral diffraction structure level $N_2$ having a reference height of 0, the positive diffraction structure level $N_1$, which is arranged higher by an optical path length of $\lambda_1/4$ relative to the neutral diffraction structure level $N_2$, wherein a tolerance of +/−20% is possible for the optical path length, and the negative diffraction structure level $N_3$ which is arranged lower by an optical path length of $\lambda_1/4+/−20\%$ relative to the neutral diffraction structure level $N_2$.

The grating period of the grating structure profile of the optical grating 64 is subdivided into four period sections of the diffraction structure levels $N_1$ to $N_3$, wherein two of the four period sections, namely the two sections having the diffraction structure level $N_2$, are embodied as neutral diffraction structure sections, one of the four period sections, namely the period section having the diffraction structure level $N_1$, is embodied as a positive diffraction structure section and one of the four period sections, namely the period section having the diffraction structure level $N_3$, is embodied as a negative diffraction structure section.

These four period sections (sequence e.g. $N_2$, $N_1$, $N_2$, $N_3$) have in each case the same length along the period running direction x, once again a tolerance range of +/−20% being possible here, too.

Figure 20:
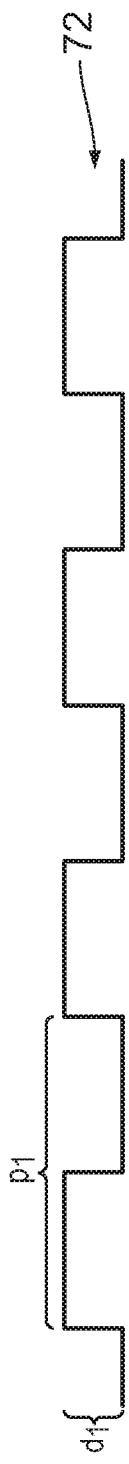
FIGS. 20 to 22 show, in illustrations similar to FIGS. 14 to 16, two diffraction structure groups and the further optical diffraction component arising therefrom as a result of superimposition.

A further embodiment of an optical grating 60 as an optical diffraction component for suppressing at least one target wavelength by destructive interference is explained below with reference to FIGS. 20 to 22. Components and functions corresponding to those which have already been explained above with reference to FIGS. 1 to 19, and particularly with reference to FIGS. 14 to 19, bear the same reference signs and will not be discussed in detail again.

Figure 21:
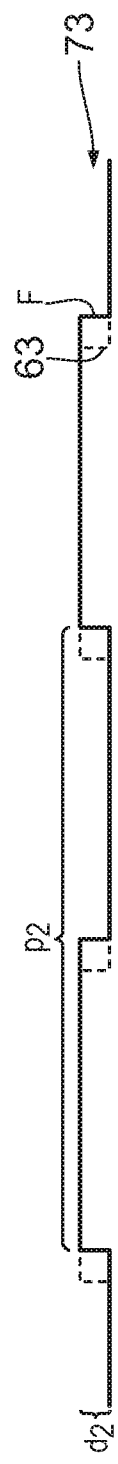
Figure 22:
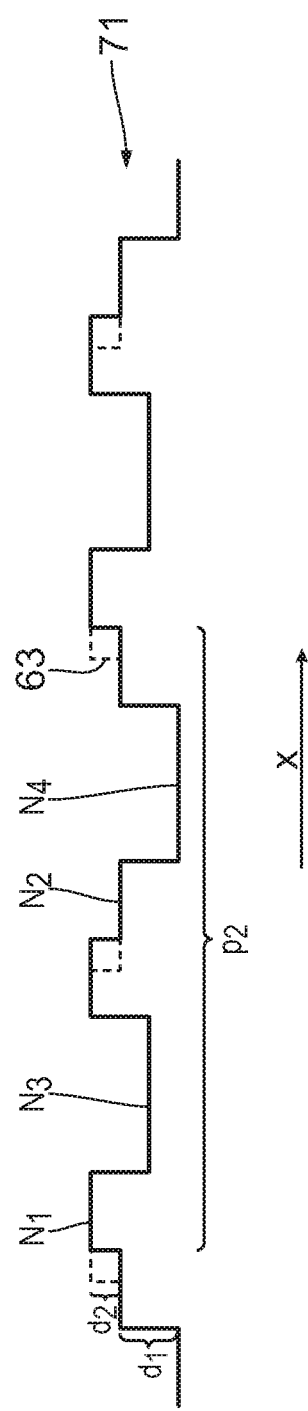

FIG. 22 shows an optical grating 71 that results as a superimposition of two diffraction gratings 72 (FIG. 20) and 73 (FIG. 21).

The diffraction grating 72 has a structure depth $d_1$ and a grating period $p_1$. The diffraction grating 73 has a structure depth $d_2$ and a grating period.

$p_2=2p_1$. It holds true that: $d_1 \, d_2$.

Both diffraction gratings 72, 73 are embodied as binary gratings having an identical extension of the diffraction positive structures and of the diffractive negative structures along the period running direction x.

The optical grating 71 has four diffraction structure levels, namely $N_1$ (structure depth 0), $N_2$ (structure depth $d_2$), $N_3$ (structure depth $d_1$) and $N_4$ (structure depth $d_1+d_2$).

FIGS. 21 and 22 once again illustrate in a dashed manner an overlay error 63 on account of a phase offset of the two diffraction gratings 72, 73 along the period running direction x.

On account of the dimensional ratios of the two diffraction gratings 72, 73, the overlay errors 63, as far as the relative extensions of the diffraction structure levels N and $N_2$ are concerned, indeed stand out such that, as viewed in each case over a period $p_2$ of the optical grating 71, the ratio of extensions of the diffraction structure levels $N_1$ and $N_2$ does not change independently of the size of the overlay error 63.

On account of the dimensional ratios of the two diffraction gratings 72, 73, level changes arise which are brought about by the diffraction grating 73, respectively for one diffraction structure type of the diffraction grating 72, in this case for the diffraction positive structures thereof. The phase relationship between the two diffraction gratings 72, 73 along the period running direction x is such that sidewalls F of the diffraction gratings 72, 73 are not superimposed at the same location along the period running direction x.

Figure 23:
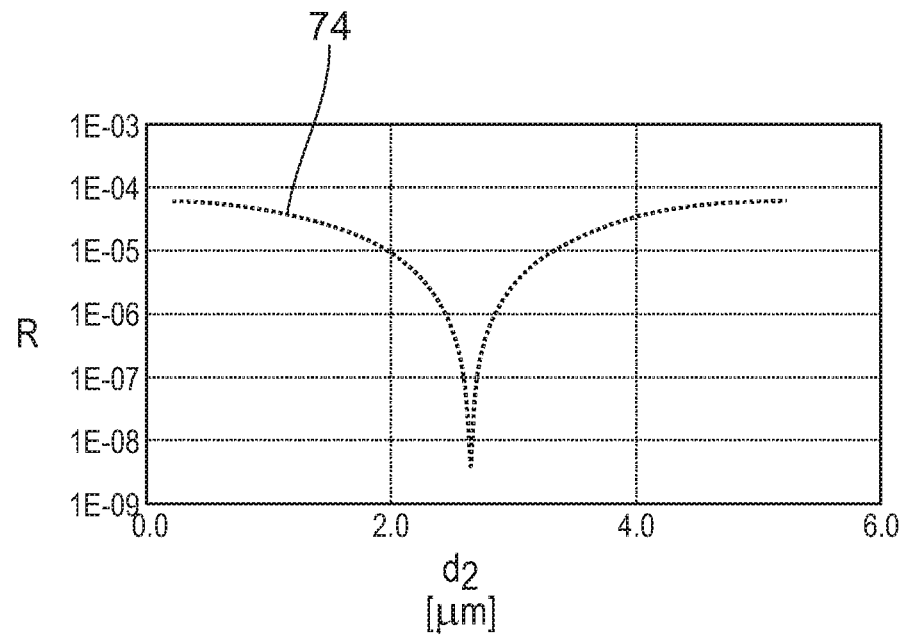
FIG. 23 shows, in a diagram, a reflectivity of an optical diffraction component of the type of that from FIG. 16, 19 or 22, wherein the structure height of the respective first diffraction structure group is fixed at a value for suppressing a target wavelength and the reflectivity is plotted as a function of the structure height of the other diffraction structure group.

FIG. 23 shows, for an optical grating of the type of that of the optical gratings 60, 64 or 71 described above with reference to FIGS. 14 to 22, the dependence of a reflectivity R of the optical grating, the respective first diffraction grating having a structure depth $d_1$ being designed for suppressing a target wavelength of 10.6 µm by destructive interference, on the structure depth $d_2$ of the respective second diffraction grating from which this optical grating is constructed. The maximum suppression of the target wavelength (reflectivity less than $10^{-8}$) results for a structure depth $d_2$ of 2.65 µm, that is to say at approximately one quarter of the target wavelength.

Tolerances of the structure depths and/or of the sidewall steepness are taken into account in the associated reflectivity curve 74.

The nearer the second structure depth $d_2$ comes to the fixed first structure depth $d_1$ of 2.65 µm, the better the suppression of the target wavelength. An improvement in the suppression effect achieved by the first diffraction grating having a structure depth $d_1$ is already evident in the range of the structure depth $d_2$ of between 0 and approximately double the structure depth $d_1$, that is to say in the range of between approximately 0.2 µm and 5 µm in FIG. 23. For the design of the two structure depths $d_1$ and $d_2$, it becomes apparent that starting from a certain nearness of the two structure depths to one another, the suppression effect of the two diffraction gratings having the structure depths $d_1$ and $d_2$ is mutually reinforced. As a condition for a separation between the two target wavelengths $\lambda_1$ (for the first diffraction grating) and $\lambda_2$ (for the second diffraction grating) in order that a suppression effect is mutually reinforced, the following relationship has been found:

$$|\lambda_2-\lambda_1|/\lambda_1<0.5$$

Assuming that the two target wavelengths do not differ from one another to an excessively great extent, this condition can be written as follows independently of whether it is related to the first wavelength $\lambda_1$ or to the second wavelength $\lambda_2$ and without an absolute value:

$$(\lambda_1-\lambda_2)^2/(\lambda_1+\lambda_2)^2<0.1$$

In so far as this condition is met for the two target wavelengths $\lambda_2$ which are intended to be suppressed with the two diffraction gratings, that is to say the two diffraction structure groups of the optical diffraction component, the suppressions are mutually reinforced in the case of the two target wavelengths $\lambda_1$, $\lambda_2$.

Figure 24:
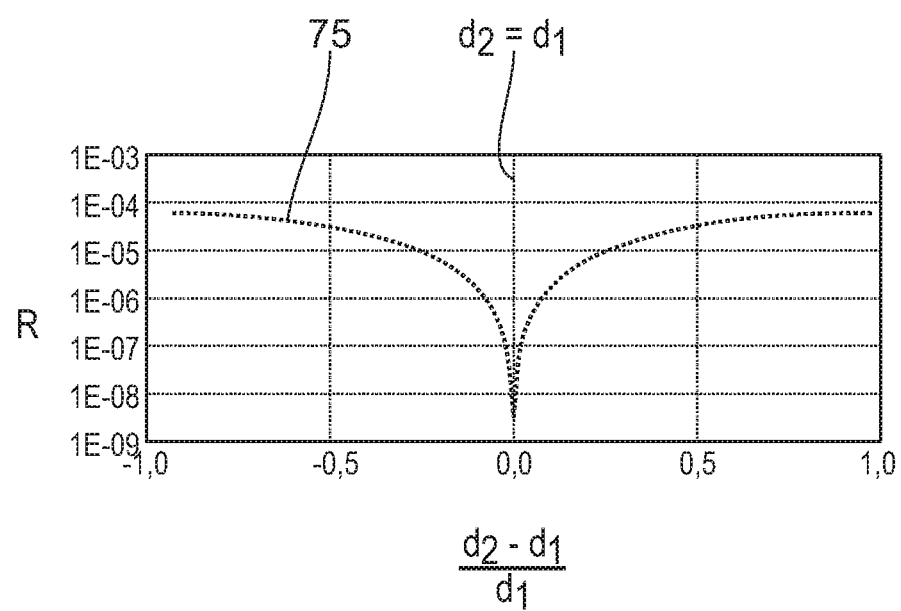
FIG. 24 shows, once again in a diagram, the reflectivity of the optical diffraction component, once again with a fixed structure depth of the first diffraction structure group, plotted as a function of a difference between the structure depths of the two diffraction structure groups and normalized to the structure depth of the first diffraction structure group.
Figure 25:
FIG. 25 shows, in an illustration similar to FIG. 14, a diffraction structure group, embodied as a binary grating having a grating period and a structure depth, as part of a further embodiment of an optical diffraction component for suppressing at least one target wavelength by destructive interference, the further embodiment arising as a result of superimposition of three diffraction structure groups.
Figure 26:
FIG. 26 shows a further diffraction structure group, once again embodied as a binary grating, for the embodiment of this variant of the optical diffraction component.

This is plotted in FIG. 24 as a dependence of the reflectivity on the structure depth difference normalized to the first structure depth $(d_2-d_1)/(d_1)$ in the value range of between −1.0 and 1.0. Between the values of −0.5 and 0.5 for this normalized structure depth difference, the corresponding reflectivity curve 75 is already distinctly below an asymptotic reflectivity value for larger structure depth differences.

A further embodiment of an optical grating 60 as an optical diffraction component for suppressing at least one target wavelength by destructive interference is explained below with reference to FIGS. 25 to 28. Components and functions corresponding to those which have already been explained above with reference to FIGS. 1 to 24, and particularly with reference to FIGS. 14 to 22, bear the same reference signs and will not be discussed in detail again.

Figure 27:
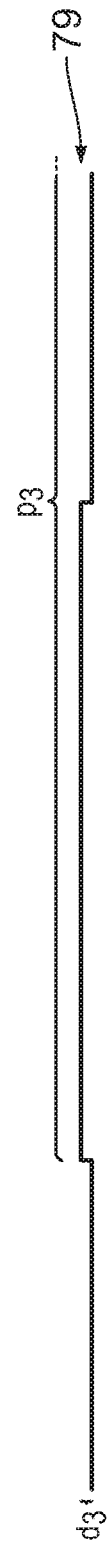
FIG. 27 shows a further diffraction structure group, once again embodied as a binary grating, for the embodiment of this variant of the optical diffraction component.
Figure 28:
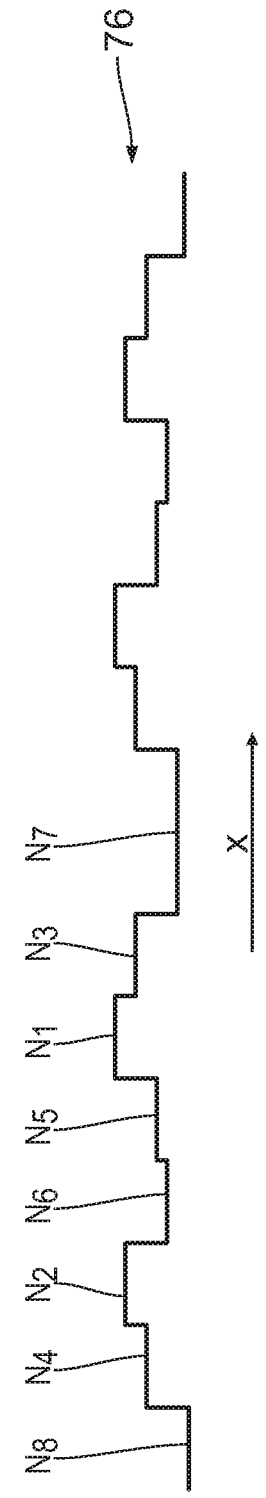
FIG. 28 shows the optical diffraction component, formed as a superimposition of the three diffraction structure groups according to FIGS. 25 to 27.
Figure 29:
FIGS. 29 to 32 show, in an illustration similar to FIGS. 25 to 28, three diffraction structure groups, once again embodied in each case as a binary grating having a grating period and a structure depth, and a further embodiment of an optical diffraction component for suppressing at least one target wavelength by destructive interference, the further embodiment arising therefrom as a result of superimposition.
Figure 30:
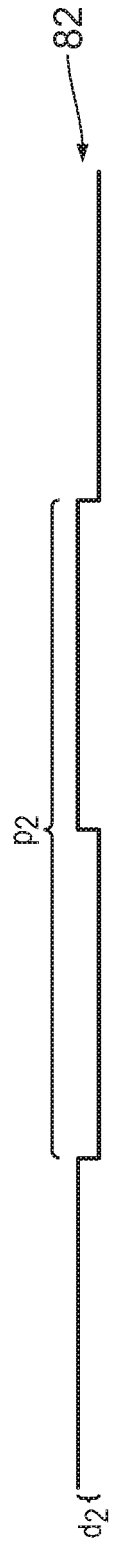

FIG. 28 shows an optical grating 76 that results as a superimposition of three diffraction gratings 77 (FIG. 25), 78 (FIG. 26) and 79 (FIG. 27). For the structure depths $d_1$, $d_2$, $d_3$ of these three diffraction gratings 77 to 79 it holds true that:

$d_1>d_2>d_3$.

The three diffraction gratings 77 to 79 are embodied in each case as a binary grating.

For the ratio of the grating periods $p_1$, $p_2$ and $p_3$ of the three diffraction gratings 77 to 79 it holds true that:

$p_1:p_2:p_3=1:2:4$.

The result is an optical diffraction component with which, in principle, three different target wavelengths can be suppressed by destructive interference and which includes three diffraction structure groups with the three diffraction gratings 77 to 79. On account of this period ratio, the optical grating 76 is not sensitive to an overlay error, that is to say in relation to a possible phase offset of the diffraction structures of the three diffraction gratings 77 to 79 along the period running direction x.

The optical grating 76 has the following eight diffraction structure levels: $N_1$ (structure depth 0), $N_2$ (structure depth $d_3$), $N_3$ (structure depth $d_2$), $N_4$ (structure depth $d_1$), $N_5$ (structure depth $d_2+d_3$), $N_6$ (structure depth $d_3+d_1$), $N_7$ (structure depth $d_1+d_2$) and Ng (structure depth $d_1+d_2+d_3$). These diffraction structure levels can be assigned to the three diffraction structure groups of the three diffraction gratings 77 to 79.

A further embodiment of an optical grating 60 as an optical diffraction component for suppressing at least one target wavelength by destructive interference is explained below with reference to FIGS. 29 to 32. Components and functions corresponding to those which have already been explained above with reference to FIGS. 1 to 28, and particularly with reference to FIGS. 25 to 28, bear the same reference signs and will not be discussed in detail again.

Figure 31:
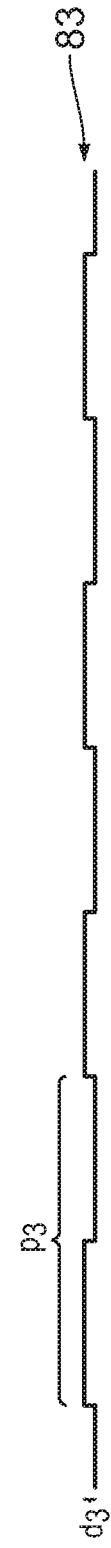
Figure 32:
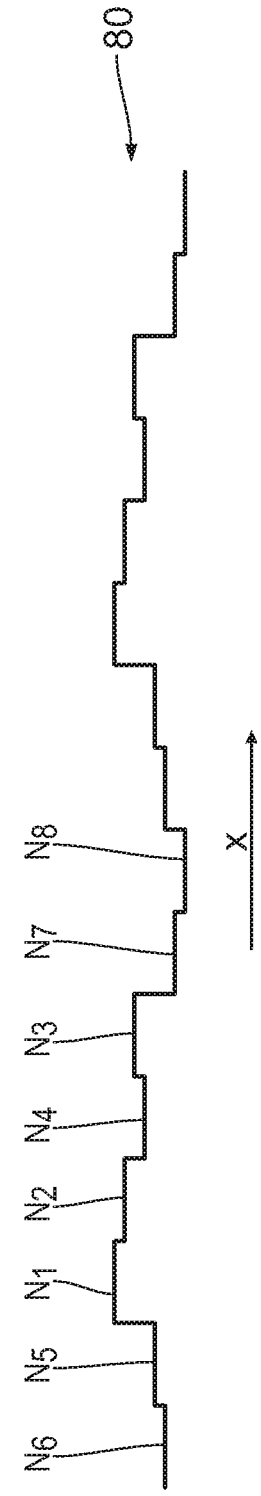

FIG. 32 shows an optical grating 80 that results from the superimposition of three binary diffraction gratings 81 (FIG. 29), 82 (FIG. 30) and 83 (FIG. 31). For the structure depths $d_1$, $d_2$, $d_3$ of the three diffraction gratings 81 to 83 it holds true that: $d_1 > d_2 > d_3$. For the grating periods $p_1$, $p_2$ and $p_3$ of the diffraction gratings 81 to 83 it holds true that:

$p_1 : p_2 : p_3 = 2:2:1$.

An overlay error of a phase relationship between the diffraction structures of the three diffraction gratings 81 to 83 along the period running direction x, in line with what has been explained above concerning the embodiments according to FIGS. 14 to 22 and 25 to 28, plays a part only in relation to the ratio between the diffraction gratings 81 and 82, since the latter have the same grating period.

The optical grating 80 also has correspondingly eight different diffraction structure levels which can be assigned to the three diffraction structure groups of the three diffraction gratings 81 to 83.

Figure 33:
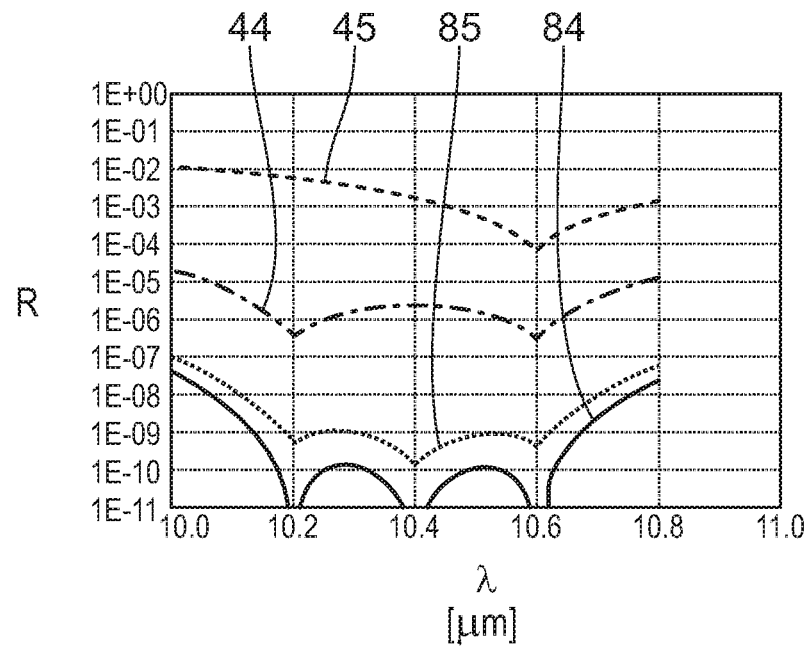
FIG. 33 shows, in a diagram similar to FIGS. 9 and 10, wavelength-dependent reflection relations in the case of optical diffraction components of the type of those according to any of FIG. 8, 11 to 13, 28 or 32, wherein the diffraction structure groups have different structure depths, such that the optical grating is embodied for suppressing different wavelengths, which however are closer to one another in comparison with the variant according to FIG. 10.

FIG. 33 shows, in an illustration similar to FIGS. 5 and 10, for example, the suppression effect of an optical grating of the type of the embodiments according to FIGS. 28 and 32, including three diffraction structure groups for suppressing three different target wavelengths.

A reflectivity curve 84 shows the wavelength-dependent suppression for the structure depths $d_1=2.65$ μm, $d_2=2.55$ μm and $d_3=2.60$ μm, that is to say embodied for suppressing the target wavelengths 10.2 μm, 10.40 μm and 10.6 μm, assuming a sidewall extension F of 0 along the period running direction x, that is to say an ideally steep course of the diffraction structures of the associated diffraction gratings. A suppression of better than $10^{-11}$ results for the three target wavelengths.

A reflectivity curve that in turn takes account of structure depth and/or sidewall steepness tolerances is plotted at 85 in FIG. 33. In the case of the reflectivity curve 85, a suppression of better than $10^{-9}$ results for the marginal target wavelengths 10.2 μm and 10.6 μm and a suppression in the region of $10^{-10}$ results for the central target wavelength 10.40 μm.

The reflectivity curves 44 and 45 for an optical grating including exactly two diffraction gratings and for an optical grating including exactly one diffraction grating (cf. also FIG. 5) are depicted as references in FIG. 33.

Figure 34:
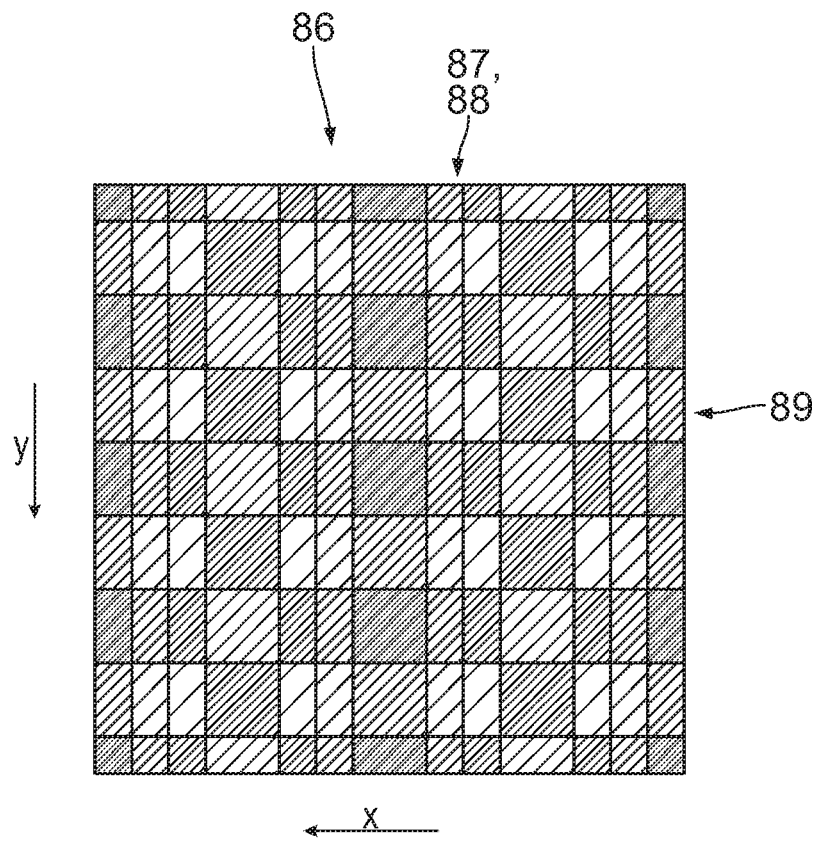
FIG. 34 shows, in an illustration similar to FIG. 4, a section of a grating surface of an optical grating including three diffraction gratings as diffraction structure groups, wherein two of the gratings have parallel period running directions and a third grating has a period running direction perpendicular thereto and wherein the diffraction structure groups having the same period running direction are superimposed in the manner of the embodiment according to FIG. 16, 19 or 22, wherein structure depths of diffraction structures that are rectangular in FIG. 34 are illustrated via different types of hatching, as a further embodiment of an optical diffraction component for suppressing at least one target wavelength by destructive interference.

FIG. 34 shows a further embodiment of an optical grating 86 as an optical diffraction component for suppressing at least one target wavelength by destructive interference. Components and functions corresponding to those which have already been explained above with reference to FIGS. 1 to 33, and particularly with reference to FIGS. 4 to 8, bear the same reference signs and will not be discussed in detail again.

The optical grating 86 results as a superimposition of a total of three diffraction gratings 87, 88, 89. Two of these diffraction gratings, namely the diffraction gratings 87 and 88, have a period running direction x that runs horizontally in FIG. 34. The third diffraction grating 89 has a period running direction y that runs vertically in FIG. 34. In a manner similar to that in FIGS. 4 and 7, in the case of the optical grating 86, diffraction structure types, that is to say different diffraction structure levels, are highlighted by different hatchings. If the three diffraction gratings 87 to 89 have three different structure depths $d_1$, $d_2$ and $d_3$, the result is once again eight different diffraction structure levels, corresponding to the eight different types of hatching. If two of the three structure depths $d_1$, $d_2$ and $d_3$ of the diffraction gratings 87 to 89 or else all three structure depths are identical, the result is a correspondingly smaller number of different diffraction structure levels.

In the case of the embodiment in accordance with the optical grating 86, a suppression of the respective target wavelength is independent of overlay errors.

As far as the number of diffraction structure levels is concerned, reference is made to the above explanations concerning the embodiments of the optical gratings 76 according to FIGS. 28 and 80 according to FIG. 32.

Figure 35:
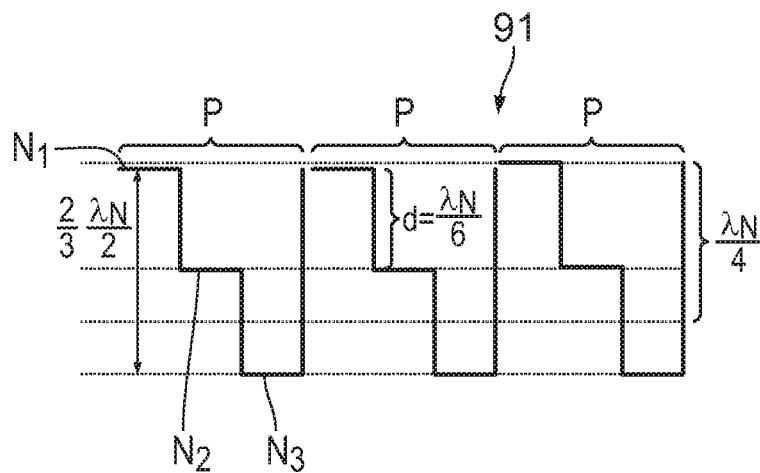
FIG. 35 shows a further embodiment of an optical diffraction component for suppressing at least one target wavelength by destructive interference, embodied as a three-level grating, embodied for suppressing exactly one target wavelength, once again in a schematic side view.

On the basis of the example of an optical diffraction component 91 including three diffraction structure levels as illustrated in FIG. 35, basic properties of such diffraction components will also be explained below. Components and functions corresponding to those which have already been explained above with reference to FIGS. 1 to 34 bear the same reference signs and will not be discussed in detail again. The diffraction structure levels are designated by $N_1$, $N_2$ and $N_3$ in FIG. 35.

The target wavelength to be suppressed has a wavelength of $\lambda_N$.

The diffraction structure level $N_1$ has a structure depth of 0. The diffraction structure level $N_2$ has a structure depth d of $\lambda_N/6$. The deepest diffraction structure level $N_3$ has a structure depth of 2d ($=\lambda_N/3$).

A superimposition of a total of n diffraction gratings having structure depths $d_1$, $d_2$, do is suitable for suppressing a total of n target wavelengths $\lambda_1$, $\lambda_2$, ... $\lambda_n$. In this case, the number of possible diffraction structure levels is $2^n$. Given three structure depths $d_1$, $d_2$, $d_3$, therefore, as explained above, eight diffraction structure levels $N_1$ to $N_8$ result. Preferably, the various diffraction structure levels $N_1$ are arranged such that all the diffraction structure levels $N_1$ occupy identical surface area proportions of the total surface area of the diffraction component 91.

The optical diffraction component 91 constitutes as a variant a so-called m-level grating having in this case three levels. Such an m-level grating consists of m different diffraction structure levels, which each occupy identical surface areas and have structure height differences of in each case $d=\lambda^N/(2m)$ with respect to one another. A good suppression of the target wavelength $\lambda_N$ once again results, with lower wavelength sensitivity.

The three-level grating according to FIG. 35 is assigned a grating period p, according to which the sequence of the three diffraction structure levels $N_1$, $N_2$, $N_3$ is repeated identically.

Figure 36:
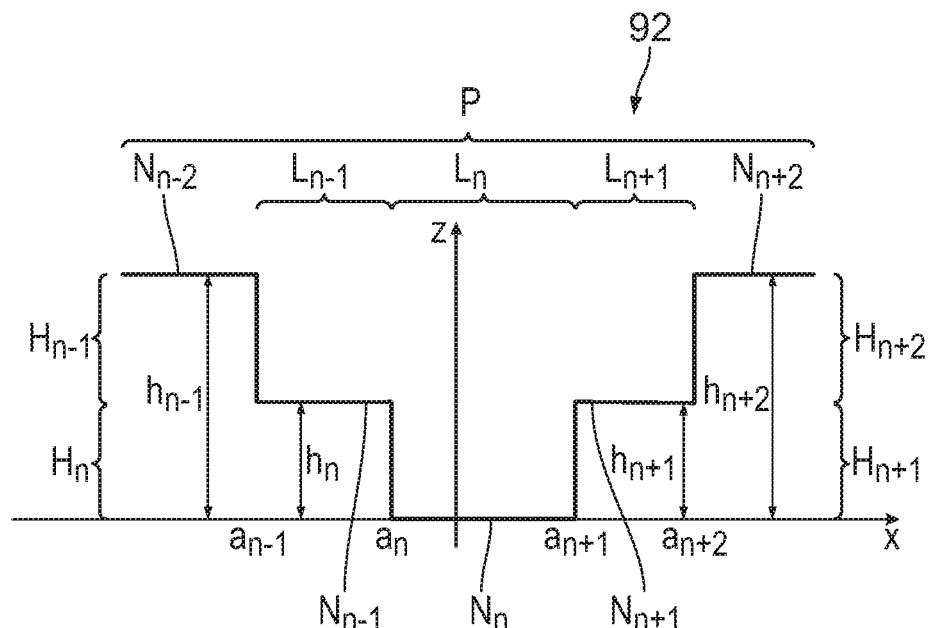
FIG. 36 shows, in an illustration similar to FIG. 35, a further embodiment of an optical diffraction component for suppressing at least one target wavelength by destructive interference, once again fashioned with three diffraction structure levels which are assignable to two diffraction structure groups, variables being depicted which are depicted for the theoretical description of a calculation of an efficiency of the suppression of the at least one target wavelength.

FIG. 36 shows a further embodiment of an optical diffraction component 92 for suppressing at least one target wavelength by destructive interference. The illustration shows the diffraction structure levels $N_1$ in the region around a deepest diffraction structure level $N_n$, namely the diffraction structure levels $N_{n-2}$, $N_{n-1}$, $N_n$, $N_{n+1}$, $N_{n+2}$.

An intensity of reflected light in the zero order of diffraction can be written as follows, proceeding from the Fraunhofer approximation for the diffracted far field, in a simplified manner for an N-level, periodic phase grating:

$$I(0) = |E(0)|^2 = \left| \sum_{n=0}^{N-1} L_n e^{-i4\pi \frac{h_n}{\lambda}} \right|^2$$

In this case, I(0) is the intensity in the zero order of diffraction, that is to say the square of the absolute value of the field amplitude of the diffracted far field.

N is the number of levels of the phase grating. $L_n$ is a phase term, assigned to the respective grating level. This phase term $L_n$, which corresponds to the extension of the respective diffraction structure level $N_i$ along the period running direction x, is illustrated in FIG. 36. $h_n$ is a measure of the structure depth of the respective diffraction structure level (cf. FIG. 36). $\lambda$ is the wavelength of the diffracted light.

A further embodiment of an optical diffraction component 93 for suppressing at least one target wavelength by destructive interference is explained below with reference to FIG. 37. Components and functions corresponding to those which have already been explained above with reference to FIGS. 1 to 36, and particularly with reference to FIG. 36, bear the same reference signs and will not be discussed in detail again.

Figure 37:
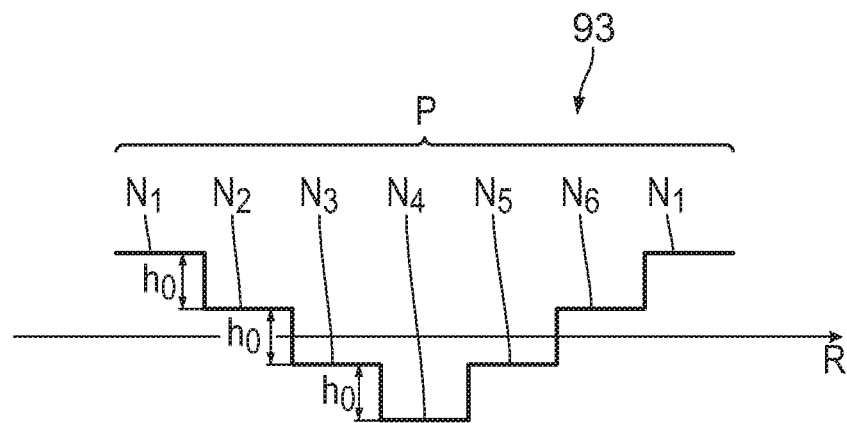
FIG. 37 shows, in an illustration similar to FIGS. 35 and 36, a further embodiment of an optical diffraction component for suppressing at least one target wavelength by destructive interference, embodied with four diffraction structure levels which are assignable to a corresponding plurality of diffraction structure groups.

FIG. 37 shows a further embodiment of a stepped grating having identical structure depths of the various grating levels, designated here as $h_0$, and identical lengths of the diffraction structure levels $N_1$, $N_2$, $N_3$ and $N_4$ along the period running direction, designated by R in this case. The period running direction R can also be the radius of a concentric diffraction structure, wherein a centre of this diffraction structure can coincide with a centre of the collector mirror 24.

The diffraction component 93 thus has a total of four diffraction structure levels $N_1$ to $N_4$, the structure depths of which differ in each case by $h_0$. It holds true here that $h_0=\lambda_N/4$, wherein $\lambda_N$ is the target wavelength to be suppressed.

One complete period p of the diffraction component in the period running direction R includes firstly the four descending diffraction structure levels $N_1$ to $N_4$ and then two succeeding, reascending diffraction structure levels $N_5$, $N_6$, wherein a structure depth of the diffraction structure level $N_5$ corresponds to that of the diffraction structure level $N_3$ and a structure depth of the diffraction structure level $N_6$ corresponds to that of the diffraction structure level $N_2$.

Further embodiments of optical diffraction components 94, 95 for suppressing at least one target wavelength by destructive interference are described below with reference to FIGS. 38 and 39. Components and functions corresponding to those which have already been explained above with reference to FIGS. 1 to 37, and particularly with reference to FIGS. 36 and 37, bear the same reference signs and will not be discussed in detail again.

Figure 38:
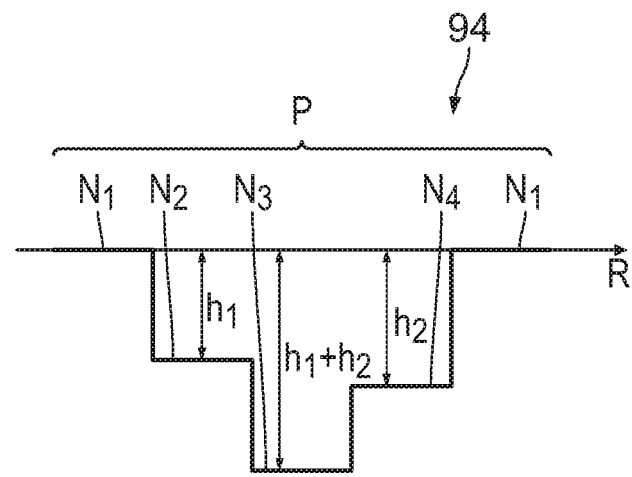
FIGS. 38 and 39 show, in illustrations similar to FIG. 37, two further embodiments of optical diffraction components for suppressing at least one target wavelength by destructive interference, embodied once again with four diffraction structure levels.

The diffraction component 94 according to FIG. 38 has, succeeding one another along a period running direction R within one grating period p, diffraction structure levels $N_1$ having a structure depth 0, $N_2$ having a structure depth $h_1$, $N_3$ having a structure depth $h_1+h_2$ and $N_4$ having a structure depth $h_2$. It holds true that: $h_1<h_2$.

Figure 39:
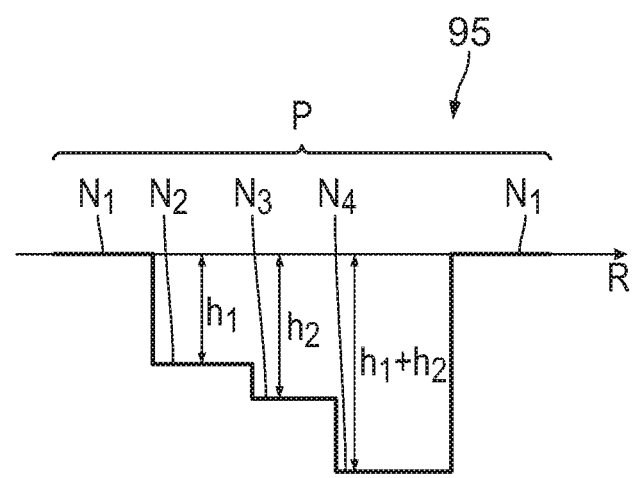

In the case of the diffraction component 95 according to FIG. 39, along the period running direction R within one period p the following succeed one another: a diffraction structure level $N_1$ having a structure depth 0, a diffraction structure level $N_2$ having a structure depth $h_1$, a diffraction structure level $N_3$ having a structure depth $h_2$ and a diffraction structure level $N_4$ having a structure depth $h_1+h_2$. Here, too, it holds true that: $h_1<h_2$.

Proceeding from the equation described above in association with FIG. 36, an intensity in the zero order of diffraction can be specified as:

$$I(0) = \left| 1 + \exp\left(i\pi\frac{\lambda_1}{\lambda}\right) + \exp\left(i\pi\frac{\lambda_2}{\lambda}\right) + \exp\left(i\pi\frac{\lambda_1+\lambda_2}{\lambda}\right) \right|^2$$

In this case, $\lambda_1$ and $\lambda_2$ are the two target wavelengths which are intended to be suppressed by destructive interference via the diffraction components 94 and 95, respectively. It holds true that: $h_1=\lambda_1/4$ and $h_2=\lambda_2/4$.

For $\lambda=\lambda_1$ and also for $\lambda=\lambda_2$ it holds true that: I (0)=0. These two wavelengths are thus optimally suppressed.

Such a multilevel grating of the type of the gratings of the embodiments in FIGS. 35 to 39 can be generalized for the suppression of a number n of target wavelengths by destructive interference. In order that n wavelengths are suppressed, 2n different diffraction structure levels $N_i$ having the following heights are used: $h_1$, $h_2$, . . . $h_n$, 0, $h_1+h_2$, $h_1+h_3$, . . . , $h_1+h_n$, wherein in addition the different structure depths $h_1$ to $h_n$ satisfy the following relations:

$$h_1<h_i<h_{i+1}<2h_1$$

With the optical diffraction components described above, as an alternative or in addition to target wavelengths suppressed in the infrared wavelength range, for example, wavelengths in other wavelength ranges can also be suppressed, for example in the range of DUV wavelengths.

Figure 40:
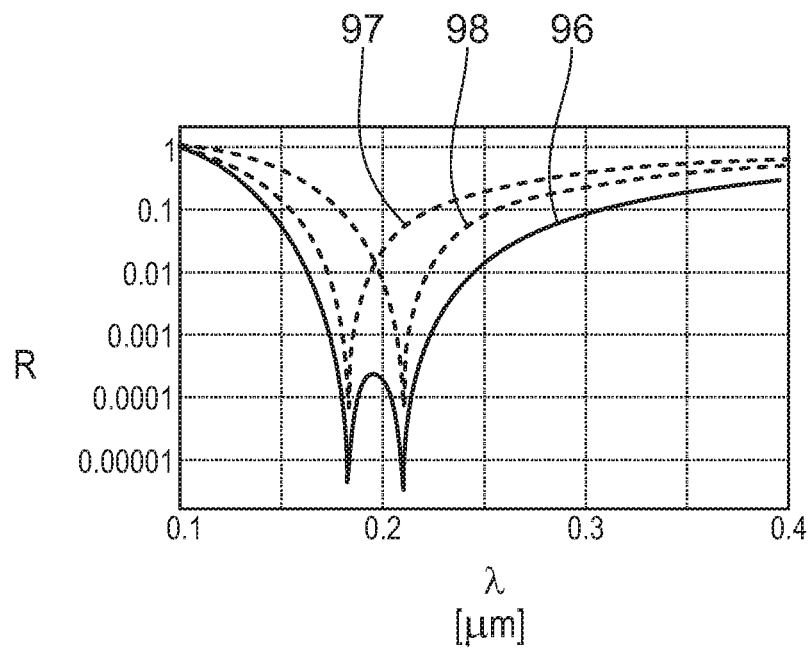
FIG. 40 shows, in a diagram, a wavelength-dependent reflectivity of an optical diffraction component including two diffraction structure groups of the type for example of the embodiments according to FIGS. 4, 7, 16, 19, 22, 35, 36, wherein the two diffraction structure groups are embodied with structure depths for suppressing two DUV wavelengths.

FIG. 40 shows, in a diagram, a wavelength-dependent reflectivity R of a variant of the optical diffraction component with two structure depths $d_1$ and $d_2$, for example of the type of the optical gratings 60, 64 or 71 according to FIGS. 16, 19 and 22. In this case, structure depths present are as follows: $d_1=45$ nm and $d_2=52$ nm. The result is a reflectivity curve 96 shown as a solid line in FIG. 40. In addition, depicted by dashed lines are reflectivity curves 97 and 98 for corresponding optical gratings including exactly one diffraction grating, designed with a structure depth $d_1$ (reflectivity curve 97) and $d_2$ (reflectivity curve 98).

The reflectivity curve 96 shows a suppression for the two target wavelengths $\lambda_1 \approx 180$ nm and $\lambda_2 \approx 210$ nm.

For the difference measure of these two target wavelengths $\lambda_1$, $\lambda_2$ it holds true that:

$$(\lambda_1-\lambda_2)^2/(\lambda_1+\lambda_2)^2=0.006$$

The suppression at these two DUV wavelengths here is better than $10^{-5}$.

Figure 41:
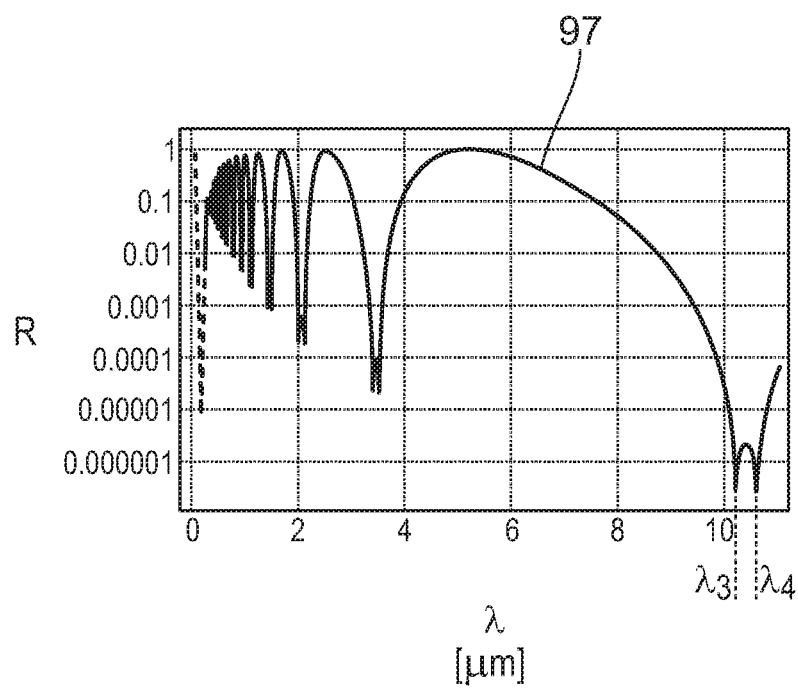
FIG. 41 shows, in an illustration similar to FIG. 40, a wavelength-dependent reflectivity for an optical diffraction component including a total of five diffraction structure levels, to which four diffraction structure groups having different structure depths are assignable, wherein two target wavelengths in the IR range above 10 µm and two target wavelengths in the DUV range comparable to the target wavelengths according to FIG. 40 are suppressed.

FIG. 41 shows the reflectivity R of an embodiment of an optical diffraction component of the type of that from FIG. 14 to 22 or 25 to 32, in this case fashioned as a superimposition of a total of four diffraction gratings having different structure depths $d_1$ to $d_4$. It holds true here that: $d_1=45$ nm, $d_2=2$ nm, $d_3=2.55$ μm and $d_4=2.65$ μm.

A wavelength-dependent reflectivity curve 97 shown in FIG. 41 shows, corresponding to the structure depths $d_3$ and $d_4$, two reflectivity minima with a suppression of better than $10^{-6}$ at $\lambda_3=10.2$ μm and at $\lambda_4=10.6$ μm.

Figure 42:
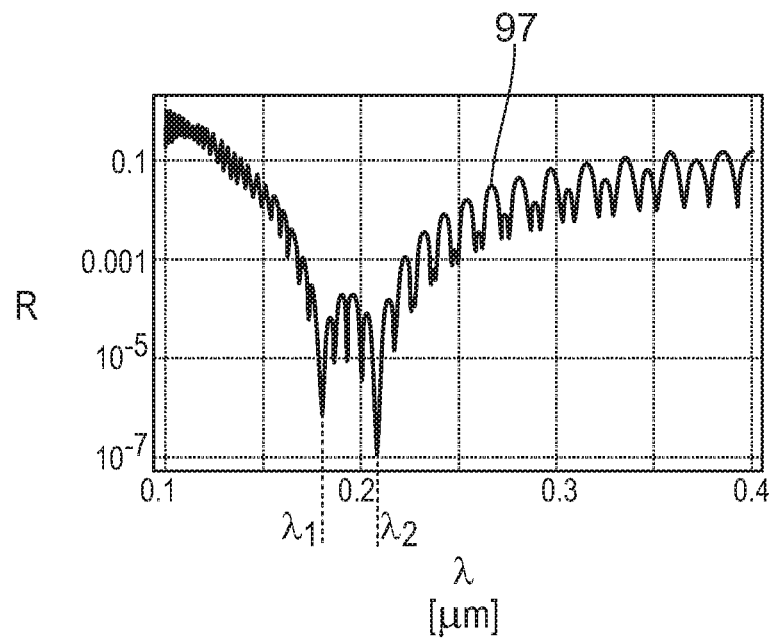
FIG. 42 shows a magnified detail from FIG. 41 in the DUV range of between 0.1 µm and 0.4 µm.

In addition, corresponding to the two structure depths $d_1$ and $d_2$, the grating with the reflectivity curve 97 also suppresses the two DUV wavelengths $\lambda_1 \approx$ equal to 180 nm and $\lambda_2 \approx$ equal to 210 nm with a suppression of better than $10^{-6}$, as shown by the magnified detail in the DUV range in FIG. 42.

Figure 43:
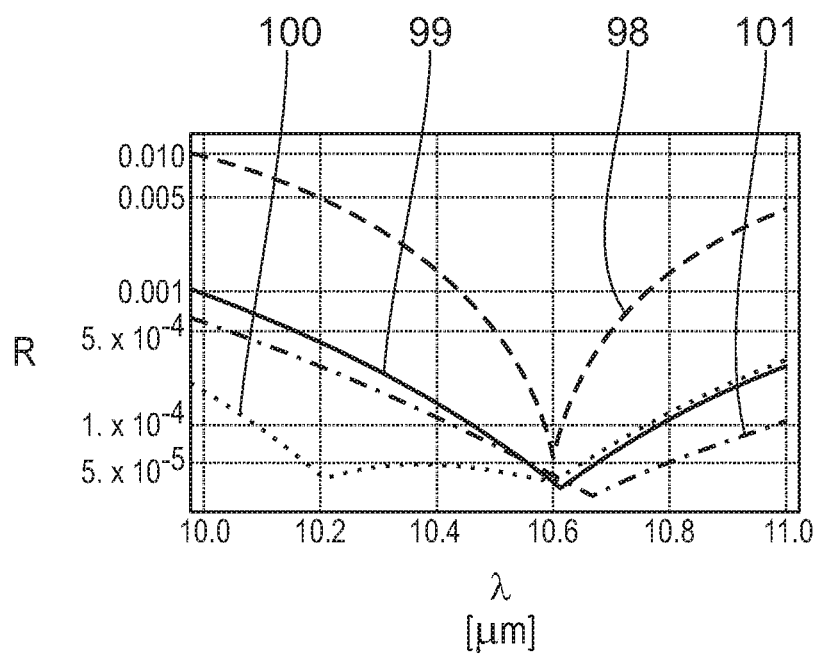
FIG. 43 shows, once again in a diagram, a wavelength-dependent reflectivity of between 10.0 µm and 11.0 µm for various optical diffraction components having a different sidewall steepness tolerance of the diffraction structure groups.

FIG. 43 illustrates, in a diagram, how, with the use of an optical diffraction component composed of plurality of diffraction structure groups, the desired properties with respect to a structure depth and/or sidewall steepness tolerance are relaxed as the number of diffraction structure groups increases. The illustration shows once again a reflectivity as a function of a wavelength in the range of between 10.0 and 11.0 μm. In this case, a target wavelength in the region of 10.6 μm is intended to be suppressed with a suppression of better than $10^{-4}$.

A reflectivity curve for an optical diffraction component including exactly one diffraction structure group, that is to say including exactly one diffraction grating, is illustrated at 98 in FIG. 43, the value 2.65 μm being assumed for a structure depth d, which is permitted to fluctuate within a tolerance bandwidth of 0.5%.

99 indicates a reflectivity curve for an optical diffraction component including two diffraction gratings as diffraction structure groups, which have identical structure depths $d_1=d_2$ of 2.65 μm in each case and for which a ten-fold tolerance bandwidth of 5% is permitted. In the region of the target wavelength, in the case of the reflectivity curve 99, a suppression results which, despite the tolerance bandwidth being ten times higher, is better than in the case of the reflectivity curve 98.

In FIG. 43, 100 indicates a reflectivity curve for an optical diffraction component including two diffraction gratings as diffraction structure groups, the structure depths of which are different ($d_1=2.65$ μm, $d_2=2.55$ μm), a tolerance bandwidth of 3.5% being permitted in each case. A suppression corresponding to that of the reflectivity curve 99 results at the target wavelength 10.6 μm.

In FIG. 43, 101 indicates a reflectivity curve for an optical diffraction component including three diffraction structure groups in the form of three diffraction gratings having an identical structure depth $d_1=d_2=d_3$ of 2.65 μm and a tolerance bandwidth of 12% for the structure depth.

On account of the mutually reinforcing suppression effects of the three diffraction gratings in the region of the target wavelength, this very high tolerance bandwidth in turn results in a very good suppression corresponding to the "suppression better than $10^{-4}$".

Figure 44:
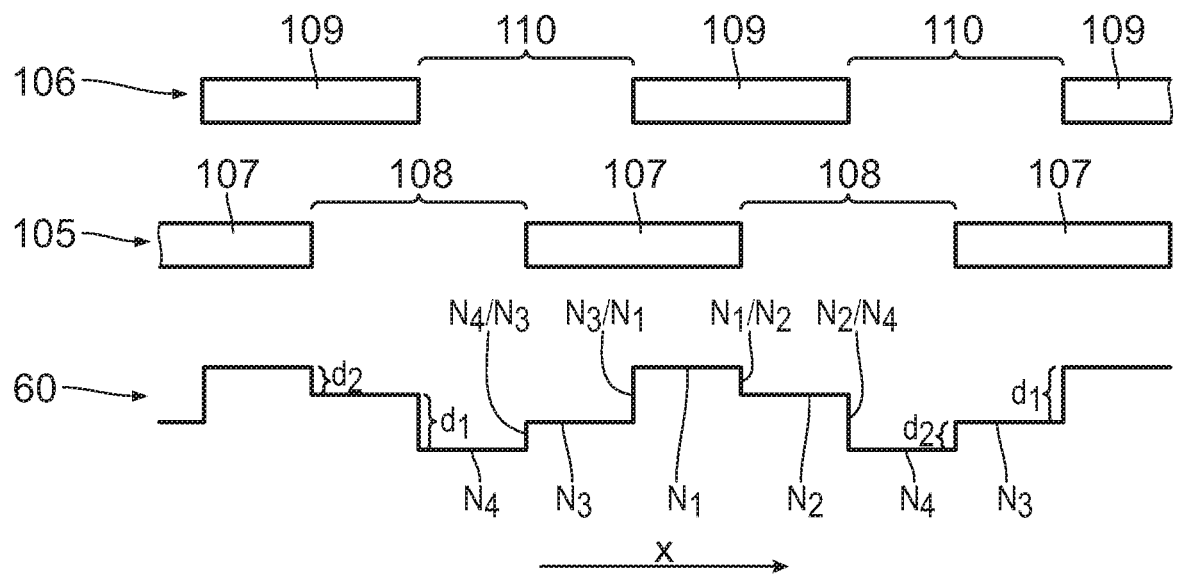
FIG. 44 shows the optical diffraction component according to FIG. 16 together with two lithographic mask structures, which can be used in the production of the optical diffraction component for predefining boundary regions between adjacent surface sections of binary structures of the optical diffraction component, the binary structures being superimposed on one another.

FIG. 44 shows again the optical grating 60 including the diffraction structure levels $N_1$ to $N_4$, as already explained above in particular with reference to FIGS. 14 to 16. FIG. 44 additionally illustrates two lithographic mask structures 105, 106, which can be used during lithographic production of the optical grating 60.

The lithographic mask structure 105 illustrated as closest adjacent to the optical grating 60 in FIG. 44 has mask regions 107, which are impermeable to an etching medium, and intervening mask gaps 108, which are permeable to the etching medium. A periodicity of the mask structure 105 corresponds to that of the diffraction grating 62 according to FIG. 15. The mask structure 105 defines level sidewalls $N_4/N_3$ between the diffraction structure levels $N_4$ and $N_3$, firstly, and $N_1/N_2$ between the diffraction structure levels $N_1$ and $N_2$, secondly.

Arranged offset with respect hereto along the period running direction x is the second lithographic mask structure 106 having mask regions 109 and mask gaps 110. A periodicity of this second lithographic mask structure 106 corresponds to that of the diffraction grating 61 according to FIG. 14. The second lithographic mask structure 106 defines the position of the level sidewalls $N_3/N_1$ between the diffraction structure levels $N_3$ and $N_1$, firstly, and $N_2/N_4$ between the diffraction structure levels $N_2$ and $N_4$, secondly.

A topography of the diffraction structure levels $N_1$ to $N_4$ of the optical grating 60 can be described as a superimposition of two binary structures, namely of the diffraction structure groups 61, 62 that are producible with the aid of the lithographic mask structures 105, 106 (also cf. FIGS. 14 and 15). Each of these binary structures 61, 62 has first surface sections having a first structure depth, namely the positive structures $61_P$, $62_P$ of the structure groups 61, 62, and second surface sections having a second structure depth, namely the negative structures $61_N$, $62_N$, which alternate with the first surface sections $61_P$, $62_P$ along the period running direction x. Boundary regions between these adjacent surface sections $61_P/61_N$, firstly, and $62_P/62_N$, secondly, that is to say the level sidewalls $N_i/N_j$ explained above, of each of the binary structures 61, 62 have a linear course perpendicular to the period running direction and perpendicular to the plane of the drawing in FIGS. 14 to 16 and 44. These boundary regions $N_3/N_1$, $N_2/N_4$ of the first binary structure 61 and the boundary regions $N_4/N_3$, $N_1/N_2$ of the second binary structure 62 run completely separately from one another, that is to say are not superimposed on one another in their course perpendicular to the period running direction x.

A further characteristic of the optical grating 60 is that, as viewed along the period running direction x, each rising level sidewall, that is to say $N_3/N_1$, firstly, and $N_4/N_3$, secondly, is respectively assigned a falling level sidewall of the same structure depth. In this case, the rising level sidewall $N_3/N_1$ is assigned the falling level sidewall $N_2/N_4$. The rising level sidewall $N_4/N_3$ is assigned the falling level sidewall $N_1/N_2$. The firstly assigned level sidewalls $N_3/N_1$ and $N_2/N_4$ in this case have the structure depth $d_1$. The level sidewalls $N_4/N_3$ and $N_1/N_2$ likewise assigned to one another have the structure depth $d_2$.

During the production of the optical grating 60, firstly one of the two mask structures 105, 106, for example the mask structure 105, is used and, in the region of the mask gaps 108, in a first etching step using an etching region, provided by a corresponding source, negative structures having the width of the mask gaps 108 with a predefined first etching depth $d_2$ are produced in a substrate. Afterwards, the mask structure 105 is removed and the mask structure 106 is used and, in a further etching step, the substrate is etched further with the depth $d_1$ until the diffraction structure levels $N_1$ to $N_4$ corresponding to the illustration at the bottom of FIG. 44 have arisen. The mask production of the optical grating 60 thus involves using firstly a first mask structure for lithographically etching a substrate and then a second mask structure, which is different with regard to the positions of mask regions and mask gaps. This difference in the position of the mask regions/mask gaps can be achieved by exchanging a first mask structure for a further mask structure and/or by displacing a mask structure along the running direction x.

The production method can also include more than two etching steps and it is also possible to use more than two different mask structures and/or more than two etching steps.

Figure 45:
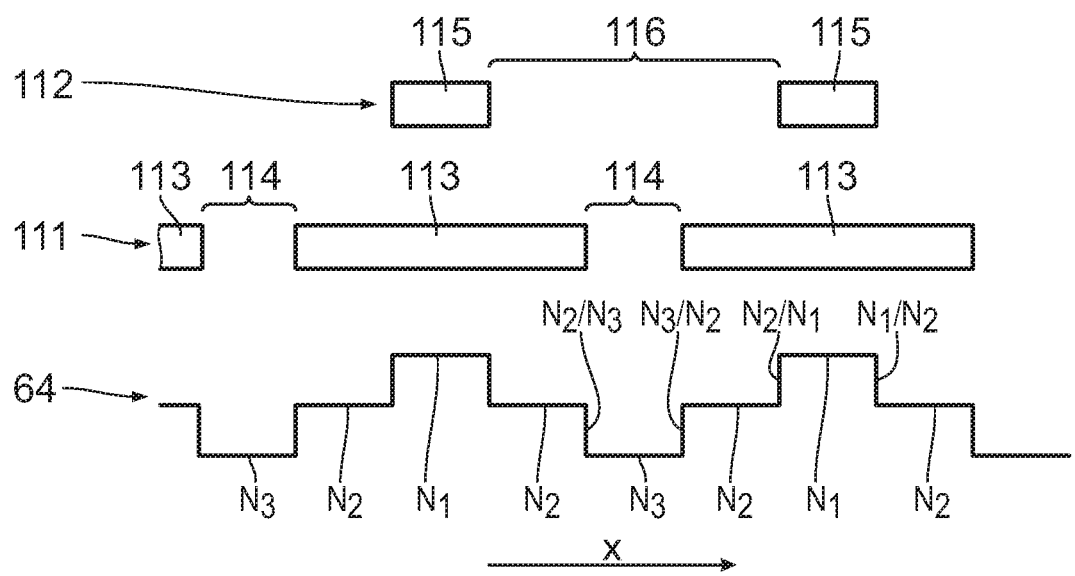
FIG. 45 shows, in an illustration similar to FIG. 44, the optical diffraction component according to FIG. 19 together with two lithographic mask structures, which can be used in the production of the optical diffraction component for predefining once again the boundary regions between the surface sections of the diffraction structure groups.

FIG. 45 shows the relations during lithographic production of the optical grating 64 (also cf. FIGS. 17 to 19).

Components and functions corresponding to those which have already been explained above with reference to FIGS. 1 to 44, and particularly with reference to FIGS. 14 to 19 and 44, bear the same reference signs and will not be discussed in detail again.

In FIG. 45, two lithographic mask structures 111, 112 are illustrated for the optical grating 64, the mask structures once again having periodically successive mask regions and mask gaps. In this case, the lithographic mask structure 111 has mask regions 113 and mask gaps 114 and the lithographic mask structure 112 has mask regions 115 and mask gaps 116.

During the lithographic production of the optical grating 64, the lithography mask structure 111 defines the level sidewalls $N_3/N_2$, firstly, and $N_2/N_3$, secondly, and the further lithographic mask structure 112 defines the level sidewalls $N_2/N_1$, firstly, and $N_1/N_2$, secondly. Here, too, the optical grating 64 results as a superimposition of two binary structures 65, 66 (cf. FIGS. 17 and 18), whose boundary regions, that is to say the level sidewalls $N_i/N_j$, perpendicular to the period running direction x and perpendicular to the plane of the drawing in FIGS. 17 to 19 and 45, run completely separately, that is to say are not superimposed on one another.

Here, too, it holds true again that, as viewed along the period running direction x, each rising level sidewall, that is to say the sidewalls $N_2/N_1$ and $N_3/N_2$, is once again assigned a falling level sidewall of the same structure depth, namely the rising level sidewall $N_2/N_1$ is assigned the falling level sidewall $N_1/N_2$, and the rising level sidewall $N_3/N_2$ is assigned the falling level sidewall $N_2/N_3$.

The optical gratings 71, 76, 80 described above in particular with reference to FIGS. 20 to 22, 25 to 28 and 29 to 32 can also be described as a corresponding superimposition of binary structures whose boundary regions between the surface sections, that is to say whose level sidewalls $N_i/N_j$, are not superimposed on one another, as already explained above with reference to the optical gratings 60 and 64. In the case of the optical gratings 76 and 80, these can be described as a superimposition of three binary structures whose boundary regions, that is to say level sidewalls $N_i$, $N_j$, are not superimposed on one another. For these gratings 71, 76, 80, too, it holds true that, as viewed along the period running direction x, each rising level sidewall is assigned a falling level sidewall of the same structure depth.

In the case of the above-described optical diffraction components having period running directions of the diffraction structure groups that are not parallel to one another, this results in an intersection of the level sidewalls, that is to say of the boundary regions between the different surface sections of the diffraction structures. In this case, too, the boundary regions are superimposed on one another only at points, that is to say at most along sections of the linear course of the level sidewalls, namely where the latter intersect.

A further embodiment of an optical diffraction component 117, once again in the form of an optical grating, for suppressing at least one target wavelength by destructive interference is described below with reference to FIG. 46. Components and functions corresponding to those which were already explained above with reference to FIGS. 1 to 45 are denoted by the same reference signs and are not discussed in detail again.

The optical grating 117 is embodied as a grating structure profile that is periodic along the period running direction x, including diffraction structures having three diffraction structure levels $N_1$, $N_2$, $N_3$.

The middle diffraction structure level $N_2$ predefines a reference height of 0 (d=0) and is therefore also referred to as a neutral diffraction structure level. The further diffraction structure level $N_1$ has a structure depth of d=+λ/4, measured relative to the reference height, and is therefore also referred to as a positive diffraction structure level. The third diffraction structure level $N_3$ has a structure depth of d=−λ/4, measured relative to the reference height, and is therefore also referred to as a negative diffraction structure level.

The three diffraction structure levels $N_1$ to $N_3$ thus predefine different structure depths relative to the reference plane d=0.

A grating period p of the grating structure profile of the optical grating 117 is subdivided into a total of four period sections of the diffraction structure levels $N_1$ to $N_3$. Two of these four period sections are embodied as the neutral diffraction structure level $N_2$, one of the four period sections is embodied as the positive diffraction structure level $N_1$ and the fourth of the four period sections is embodied as the negative diffraction structure level $N_3$. The sequence along the unit cell chosen in FIG. 46, the unit cell being bounded by dashed lines, in the period running direction x is: $N_2$, $N_1$, $N_2$, $N_3$.

Along the period running direction x, the four period sections within one grating period p have the same structure length $x_N$.

Alternatively, it is also possible for the lengths of the period sections, that is to say the x-extensions of the respective diffraction structure levels $N_1$ to $N_3$, to differ from one another in pairs. The following should then be satisfied as a constraint for the lengths $x_{Ni}$ of the period sections of the diffraction structure levels $N_1$ to $N_3$:

$$x_{N1}+x_{N3}=2x_{N2}$$

The sum of the extensions of the levels deviating from the neutral diffraction structure level should thus be, to a good approximation, equal to double the extension of the neutral diffraction structure level.

The described arrangement, that is to say the structure depths and the lengths along the period running direction x, of the diffraction structure levels $N_1$ to $N_3$ is such that a first target wavelength $\lambda_1$ in the infrared wavelength range, which is diffracted by the grating structure profile, has radiation components having three different phases which interfere with one another destructively in the zero order of diffraction of the first target wavelength $\lambda_1$. A suppression effect thus results, as has been explained above inter alia in association with the other optical diffraction components according to FIGS. 1 to 45. As revealed by a theoretical consideration, this suppression effect is squared in comparison with the suppression of a single binary grating (not illustrated), with the result that the optical grating 117 has a suppression effect of $10^{-4}$, for example, if a binary grating in which positive diffraction structure levels $N_1$ were in turn arranged instead of the negative diffraction structure levels $N_3$ has a suppression of $10^{-2}$.

The target wavelength can once again be in the range of between 10 μm and 11 μm.

The influence of a structure depth error on the diffraction efficiency is explained below with reference to FIGS. 47 and 48. It is assumed here that light having the wavelength λ to be suppressed is incident on the optical grating 117 from above with normal incidence in FIGS. 47 and 48. This assumption "normal incidence" serves merely as a model assumption for the following consideration. In practice, the angle of incidence of the light regularly deviates from normal incidence. Accordingly, the structure depths of the optical diffraction components described here are then adapted to the respective angle of incidence. The methods for carrying out this design adaptation are known to the person skilled in the art. In practice, the angles of incidence of the light vary with the wavelength to be suppressed and the structure depths of the optical diffraction component thus also vary over the EUV collector. In the case of an EUV collector 24 having a rotationally symmetrical design, a structure depth of the diffraction structure groups can vary continuously from a centre of the EUV collector 24 towards the edge of the EUV collector 24.

Figure 47:
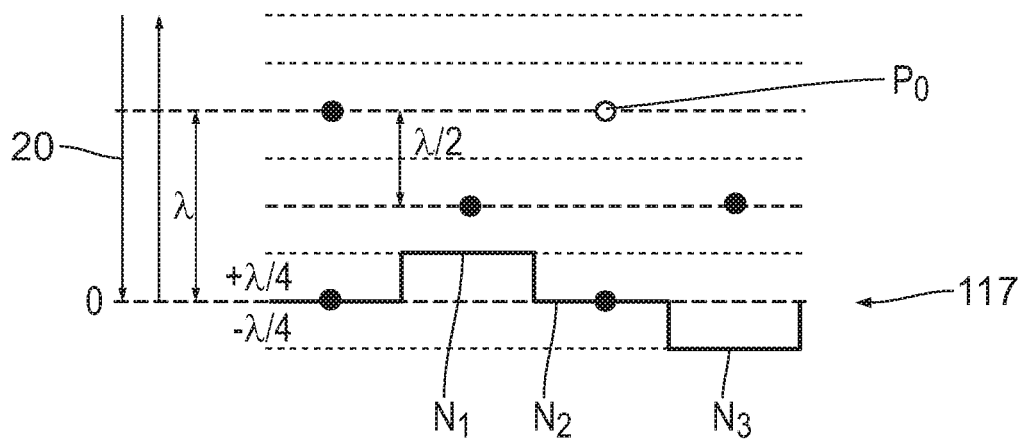
FIG. 47 shows the optical diffraction component according to FIG. 46, wherein the three diffraction structure levels have a height or level difference with respect to one another which leads to perfect destructive interference of the target wavelength in the zero order of diffraction.
Figure 48:
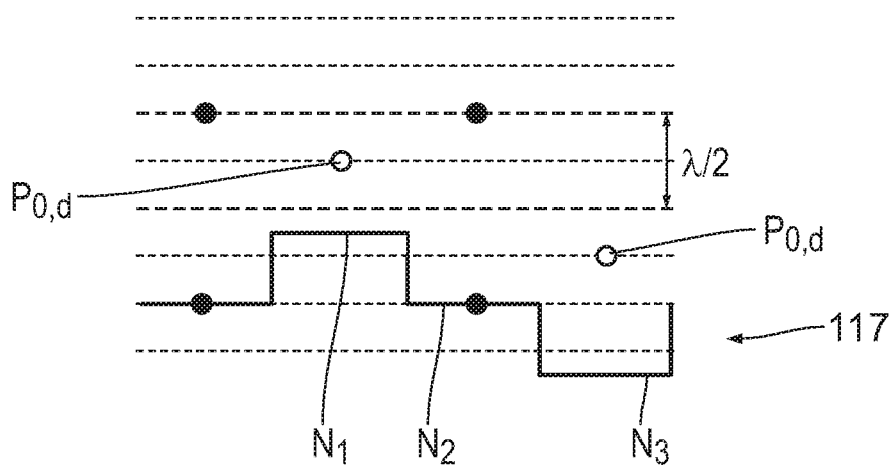
FIG. 48 shows, in an illustration similar to FIG. 47, a variant of the optical diffraction component according to FIG. 46, wherein firstly a positive diffraction structure level and secondly a negative diffraction structure level are embodied with a height difference that is somewhat too large relative to a neutral diffraction structure level, for illustrating a diffraction compensation effect that arises in the case of such a height error.

Regions of identical phase $P_0$ of the wave of the reflected light are illustrated by filled-in dots in FIGS. 47 and 48. Since the diffraction structure levels $N_1$, firstly, and $N_3$, secondly, are offset relative to the neutral diffraction structure level $N_2$ in each case by an optical path length of $\lambda/4$, it is evident that for the total of four period sections of the grating period of the optical grating 117 illustrated in FIG. 47, in each case two regions of the reflected light result whose phase $P_0$ is reflected relative to two further regions in a manner offset exactly by half a wavelength, that is to say by $\lambda/2$, which, in the case of the perfect $\lambda/4$ structure depths in FIG. 47, leads to the perfect suppression of the incident light, that is to say to the destructive interference of the reflected light.

FIG. 47 shows the case in which the positive diffraction structure level $N_1$ has a structure depth which is greater than $\lambda/4$ and the negative diffraction structure level $N_3$ has a structure depth which has the same absolute value as the structure depth of the positive diffraction structure level $N_1$, that is to say is correspondingly likewise greater than $\lambda/4$ in absolute terms. A height error is thus present in the case of the grating according to FIG. 47.

Regions of identical phase $P_0$, d of the light reflected by the positive diffraction structure level $N_1$, firstly, and by the negative diffraction structure level $N_3$, secondly, are illustrated by open circles in FIG. 48.

As shown by the comparison of the positions in the beam direction of the reflected light of these two phases $P_0$, a which are reflected by the levels $N_1$ and $N_3$, respectively, with the corresponding phase positions $P_0$ in the case of the perfect suppression situation according to FIG. 47, in the case of the situation according to FIG. 48 these two phases $P_{0,d}$ are present around the correct phase position in a manner shifted upwards and downwards, respectively, by the same distance, with the result that an average value of the two shifted phases $P_{0,d}$ a becomes located once again at the position of the perfect phase position according to FIG. 47. This averaging brings about an improvement of the suppression in the case of the grating having the three diffraction structure levels $N_1$ to $N_3$ in comparison with a binary grating having only two diffraction structure levels corresponding to the diffraction structure levels $N_1$ and $N_2$ and a corresponding height error.

Figure 49:
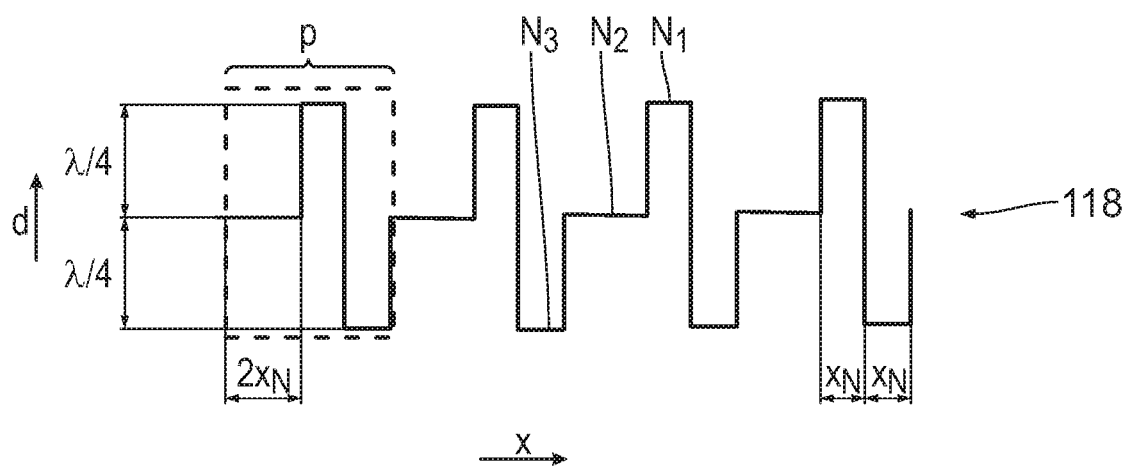
FIG. 49 shows, in an illustration similar to FIG. 46, a further embodiment of an optical diffraction component including three diffraction structure levels in a different sequence in comparison with the embodiment according to FIG. 46.

FIG. 49 shows a further variant of an optical diffraction component for suppressing at least one target wavelength in the form once again of an optical grating 118 including diffraction structures, having once again three diffraction structure levels $N_1$, $N_2$ and $N_3$. Components and functions corresponding to those which have already been explained above with reference to FIGS. 1 to 48, and particularly with reference to FIGS. 46 to 48, bear the same reference signs and will not be discussed in detail again.

FIG. 49 illustrates once again using dashed lines a unit cell extending along the period running direction x over one period p. The neutral diffraction structure level $N_2$, which is present first in this unit cell in the period running direction x, has double the length $2x_N$ in comparison with the other two diffraction structure levels. The sequence of the diffraction structure levels in the period running direction within the unit cell illustrated is thus: neutral diffraction structure level $N_2$ of double length $2x_N$, positive diffraction structure level $N_1$ having single length $x_N$, negative diffraction structure level having single length $x_N$. In the case of the optical grating 118, therefore, within the unit cell a positive diffraction structure level $N_1$ is followed directly by a negative diffraction structure level $N_3$, such that an intervening level sidewall has a structure depth of $\lambda/2$.

Figure 50:
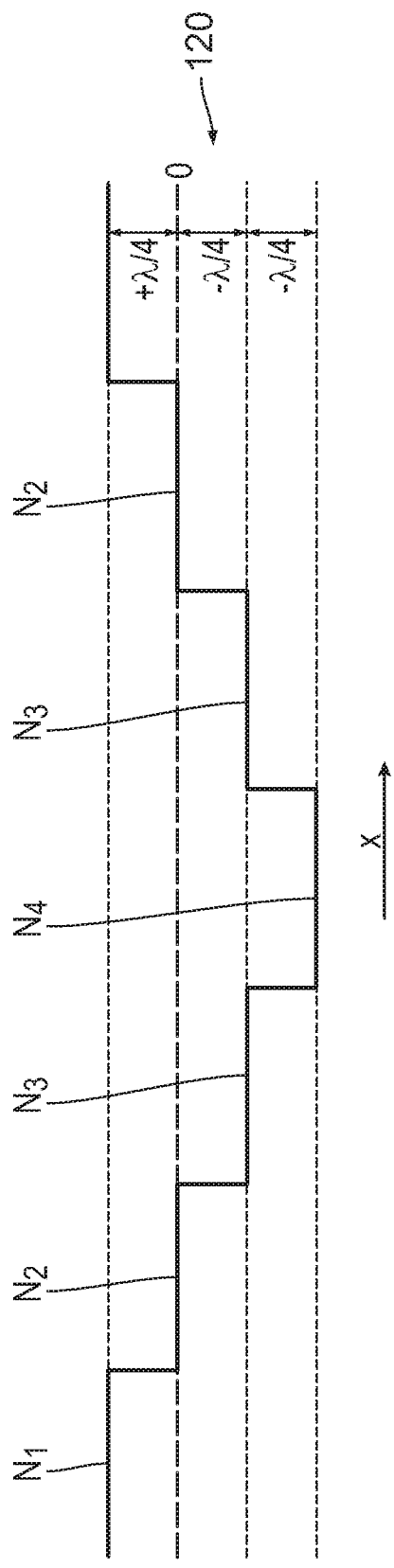
FIG. 50 shows a further embodiment of an optical diffraction component, wherein substantially one grating period is illustrated and wherein a periodic grating structure profile of the optical diffraction component includes diffraction structures having four diffraction structure levels.

FIG. 50 shows a further embodiment of an optical diffraction component for suppressing at least one target wavelength, the optical diffraction component being fashioned as an optical grating 120, once again including diffraction structures having four diffraction structure levels $N_1$ to $N_4$. Components and functions corresponding to those which have already been explained above with reference to FIGS. 1 to 49, and particularly with reference to FIGS. 46 to 49, bear the same reference signs and will not be discussed in detail again. Along the period running direction, the optical grating 120 has the following sequence of diffraction structure levels: positive diffraction structure level $N_1$ having a structure depth+$\lambda/4$, neutral diffraction structure level $N_2$, negative diffraction structure level $N_3$ having a structure depth $-\lambda/4$, doubly negative diffraction structure level $N_4$ having a structure depth $-\lambda/2$, negative diffraction structure level $N_3$ and neutral diffraction structure level $N_2$. The unit cell of the optical grating 120 thus includes the diffraction structure level sequence $N_1$, $N_2$, $N_3$, $N_4$, $N_3$, $N_2$ or a corresponding cyclic interchange.

Figure 51:
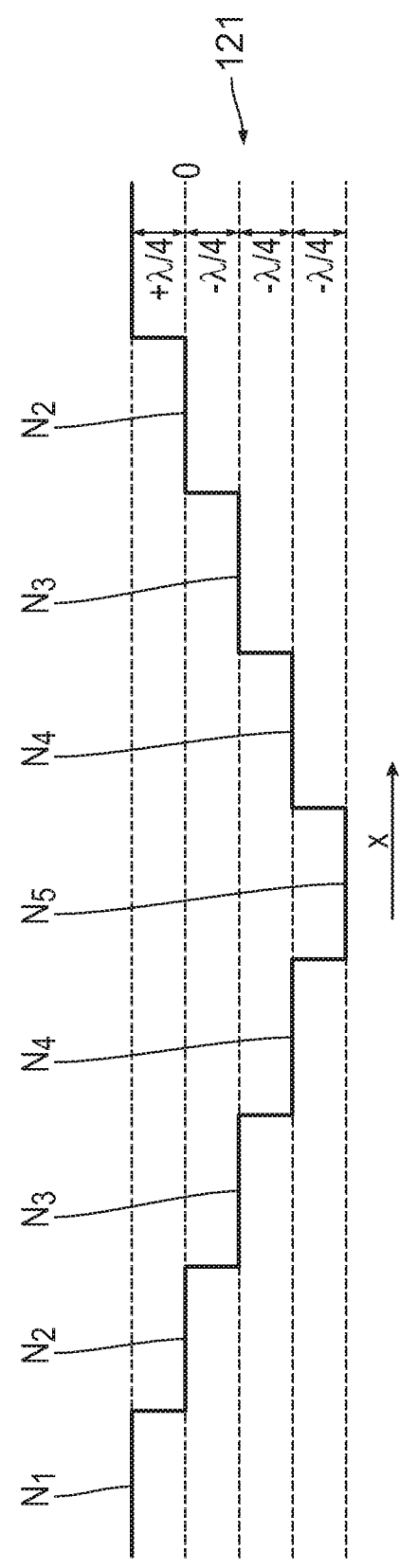
FIG. 51 shows, in an illustration similar to FIG. 50, a further embodiment of an optical diffraction component including five diffraction structure levels within one grating period.

FIG. 51 shows a further embodiment of an optical diffraction component for suppressing at least one target wavelength, the optical diffraction component being fashioned as an optical grating 121, once again including diffraction structures having five diffraction structure levels $N_1$ to $N_5$. Components and functions corresponding to those which have already been explained above with reference to FIGS. 1 to 50, and particularly with reference to FIGS. 46 to 50, bear the same reference signs and will not be discussed in detail again. Along the period running direction, the optical grating 121 has the following sequence of diffraction structure levels: positive diffraction structure level $N_1$ having a structure depth+$\lambda/4$, neutral diffraction structure level $N_2$, negative diffraction structure level $N_3$ having a structure depth–$\lambda/4$, doubly negative diffraction structure level $N_4$ having a structure depth–$\lambda/2$, triply negative diffraction structure level $N_5$ having a structure depth–$3\lambda/4$, doubly negative diffraction structure level $N_4$ having a structure depth–$\lambda/2$, negative diffraction structure level $N_3$ having a structure depth–$\lambda/4$, and neutral diffraction structure level $N_2$. The unit cell of the optical grating 120 thus includes the diffraction structure level sequence $N_1$, $N_2$, $N_3$, $N_4$, $N_5$, $N_4$, $N_3$, $N_2$ or a corresponding cyclic interchange.

The additional diffraction structure levels $N_4$ in the case of the optical grating 120 and $N_4$, $N_5$ in the case of the optical grating 121 result in an additional reinforcement of the diffraction effect, that is to say in a further reinforcement of the destructive interference of the target wavelength $\lambda$.

Figure 46:
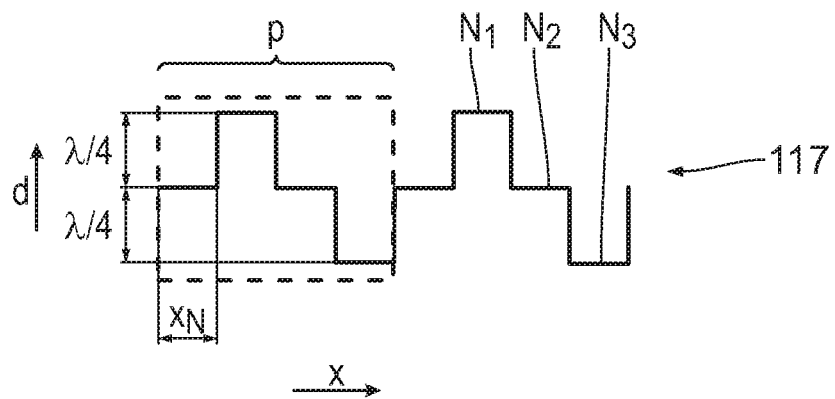
FIG. 46 shows a further embodiment of an optical diffraction component for suppressing at least one target wavelength by destructive interference including a periodic grating structure profile including diffraction structures having three diffraction structure levels arranged in such a way that the target wavelength is suppressed by destructive interference.
Figure 52:
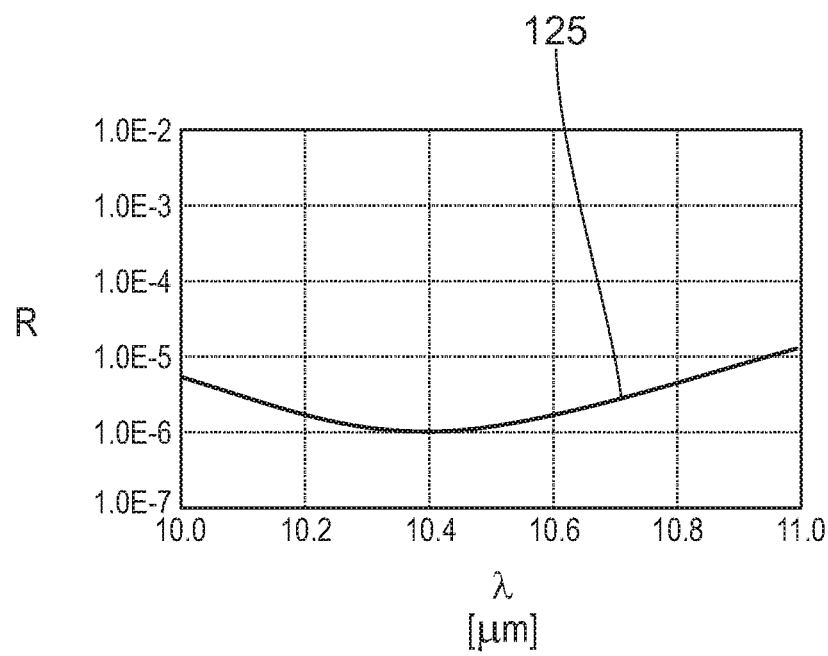
FIG. 52 shows, in a diagram similar to FIG. 5, a wavelength-dependent reflectivity R of an optical diffraction component in the form of an optical grating, fashioned in the manner of FIGS. 19, 36, 45 and 46 with three diffraction structure levels which are assignable to two diffraction structure groups, wherein there is a structure depth difference between the diffraction structure levels in each case of $\lambda 4$, wherein $\lambda$ is the target wavelength to be suppressed in each case.

FIG. 52 shows a reflectivity curve 125 of an optical grating of the type from FIG. 46 having the sequence therein of the diffraction structure levels $N_1$, $N_2$ and $N_3$ having a structure depth d of in each case $\lambda/4$ (d≈2.6 μm) and an identical structure length $x_N$ of the diffraction structure levels $N_1$ to $N_3$ in the period running direction x ($x_{N1}$=$x_{N2}$=$x_{N3}$). The result is a reflectivity curve 125 having a wide reflectivity minimum at $1 \cdot 10^{-6}$ around the wavelength $\lambda=10.4$ μm. Between 10.2 μm and 10.6 μm, the reflectivity is less than $2 \cdot 10^{-6}$. Between 10.1 μm and 10.7 μm, the reflectivity is less than $3 \cdot 10^{-6}$. Between 100 μm and 10.8 μm, the reflectivity is less than $5 \cdot 10^{-6}$. This results in a very good suppression of disturbing wavelengths in the wavelength ranges indicated.

Figure 53:
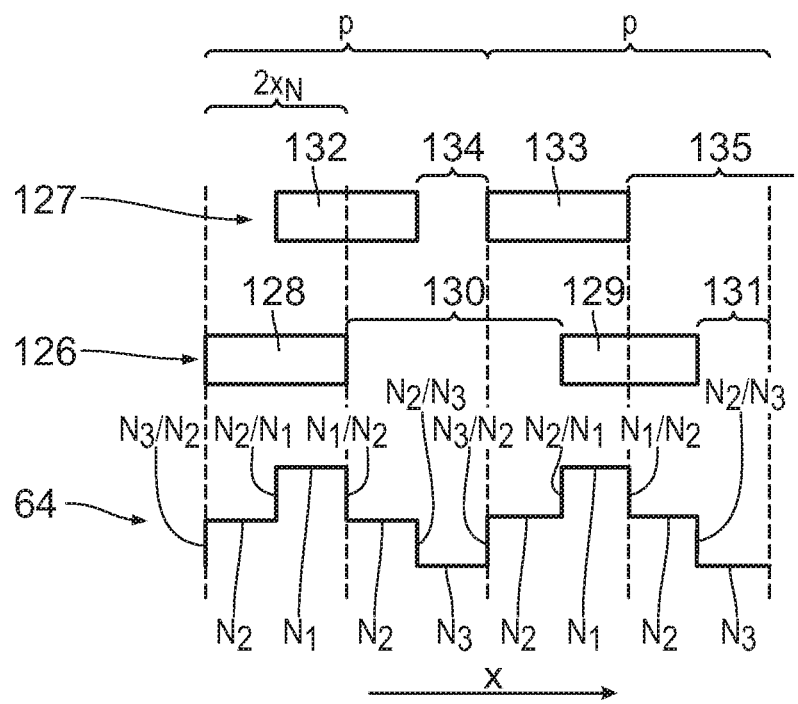
FIG. 53 shows, in an illustration similar to FIGS. 44 and 45, the optical diffraction component of the type from FIGS. 19, 36, 45 and 46 together with a further embodiment of two lithographic mask structures, which can be used in the production of the optical diffraction component for predefining once again the boundary regions between the surface sections or the diffraction structure levels of the diffraction structure groups.

FIG. 53 shows, in the manner of FIGS. 44 and 45, the relations during lithographic production of the optical grating 64 (also cf. FIGS. 17 to 19) with a period $p=4x_N$.

Components and functions corresponding to those which have already been explained above with reference to FIGS. 1 to 52, and particularly with reference to FIGS. 14 to 19, 44 and 45, bear the same reference signs and will not be discussed in detail again.

For the optical grating 64, FIG. 53 illustrates further embodiments of lithographic mask structures 126, 127 which are used during the lithographic production of the optical grating 64 and once again have periodically successive mask regions and mask gaps. In this case, the lithographic mask structure 126 has successive mask regions 128 and 129 and intervening mask gaps 130 and 131 and the mask structure 127 has successive mask regions 132 and 133 and intervening mask gaps 134 and 135.

During the lithographic production of the optical grating 64, the mask region 128 of the mask structure 126 defines the level sidewalls $N_3/N_2$, firstly, and $N_1/N_2$, secondly. The further mask region 129 of the mask structure 126 defines the level sidewalls $N_2/N_1$ and $N_2/N_3$ for the next sequence of the diffraction structure levels of the optical grating 64 that follows in the period running direction x. The further lithographic mask structure 127 defines, with the mask region 132, the level sidewalls $N_2/N_1$ and $N_2/N_3$ of the period of the diffraction structure levels $N_i$ leading in the period running direction x and the mask region 133 of the mask structure 127 defines the level sidewalls $N_3/N_2$ and $N_1/N_2$ of the next period of the diffraction structure levels $N_i$. The optical grating 64 correspondingly results as a superimposition of two binary structures whose boundary regions, perpendicular to the period running direction x (perpendicular to the plane of the drawing in FIG. 53) run completely separately, that is to say are not superimposed on one another.

The mask structures 128, 129, firstly, and 132, 133, secondly, have in each case the same x-extension, namely in each case $2x_N$. The mask gaps 131, firstly, and 134, secondly, have in each case the same x-extension, namely in each case $x_N$. The mask structures 130 and 135 likewise have in each case the same x-extension, namely in each case $3x_N$.

The mask structures 126, 127 thus predefine alternately different level sidewalls for the respectively successive periods p of the optical grating 64. By shilling by a period length p, most mask structures 126 and 127 can be converted into one another.

Figure 54:
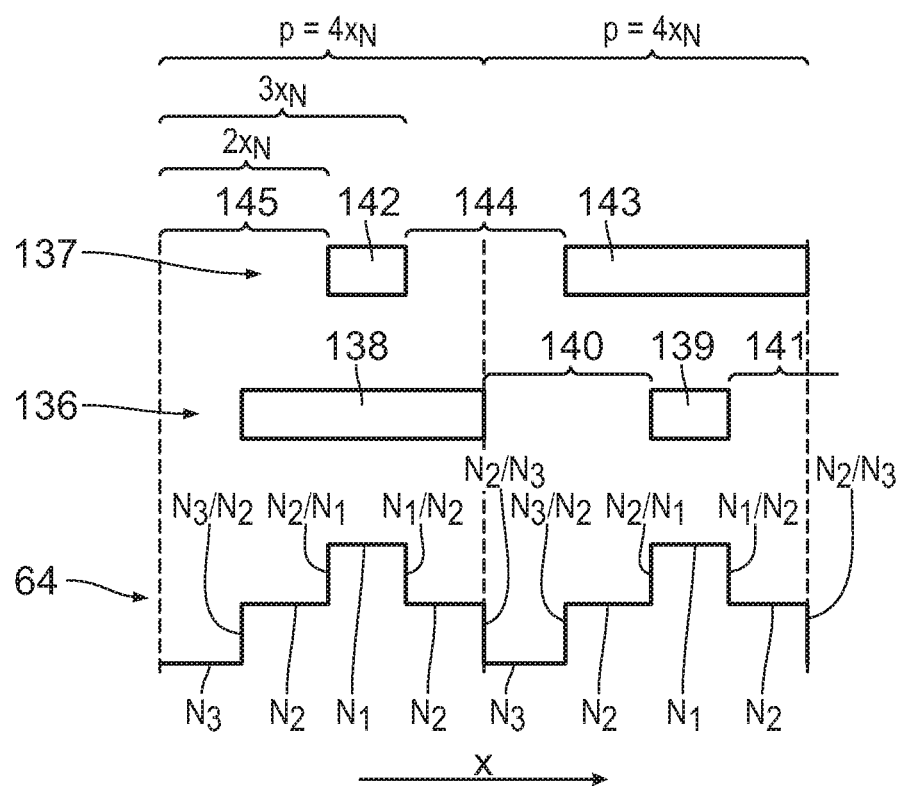
FIG. 54 shows, in an illustration similar to FIGS. 44 and 45, the optical diffraction component of the type from FIGS. 19, 36, 45 and 46 together with a further embodiment of two lithographic mask structures, which can be used in the production of the optical diffraction component for predefining once again the boundary regions between the surface sections or the diffraction structure levels of the diffraction structure groups.

FIG. 54 shows an alternative embodiment of two mask structures 136, 137 during lithographic production of the optical grating 64. Components and functions corresponding to those which have already been explained above with reference to FIGS. 1 to 53, and particularly with reference to FIGS. 14 to 19, 44 and 53, bear the same reference signs and will not be discussed in detail again.

The mask structure 136 has mask regions 138, 139 and intervening mask gaps 140, 141. The mask structure 137 has mask regions 142, 143 and intervening mask gaps 144 and 145. An x-extension of the mask regions 138, firstly, and 143, secondly, is $3x_N$ and thus three times the magnitude of an x-extension of the mask regions 139, firstly, and 142, secondly, which is $x_N$. The mask gaps 140, 141, 144 and 145 have in each case an extension of $2x_N$.

During the lithographic production of the optical grating 64, the lithographic mask structure 136 defines, with the mask region 138, the level sidewalk $N_3/N_2$ and $N_2/N_3$ of the first period p of the diffraction structure levels $N_1$ to $N_3$ of the grating 64 and the mask region 139 defines the level sidewalls $N_2/N_1$, firstly, and $N_1/N_2$, secondly, of the second period p of the diffraction structure levels $N_1$ to $N_3$. The further lithographic mask structure 137 defines, with the mask region 142, the level sidewalls $N_2/N_1$ and $N_1/N_2$ of the first period and, with the mask region 143, the level sidewalls $N_3/N_1$ and $N_2/N_3$ of the succeeding period p of the diffraction structure levels $N_1$ to $N_3$.

It holds true here, too, in a manner similar to that in the case of the embodiment according to FIG. 53, that the mask structures 136 and 137 predefine alternately different level sidewalls of the successive periods of the diffraction structure levels $N_1$ to $N_3$. The mask structures 136 and 137 can also be converted into one another by shifting by a period length $p=4x_N$.

Figure 55:
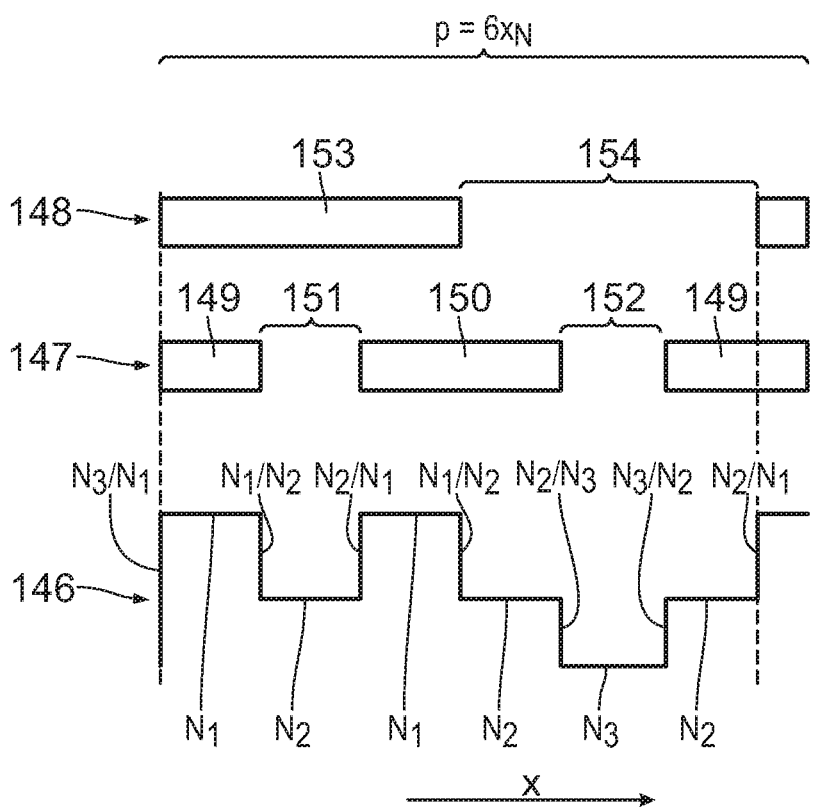
FIG. 55 shows, in an illustration similar to FIGS. 44 and 45, a further embodiment of an optical diffraction component of the type from FIGS. 19, 36, 45 and 46 together with a further embodiment of two lithographic mask structures, which can be used in the production of the optical diffraction component for predefining once again the boundary regions between the surface sections or the diffraction structure levels of the diffraction structure groups.

The relations during the production of a further embodiment of an optical grating 146 with two mask structures 147, 148 will be described with reference to FIG. 55. In contrast to FIGS. 53 and 54, which each show two grating periods of the optical grating 64, one grating period p is shown in FIG. 55. Within this grating period p, the optical grating 146 has the following sequence of the diffraction structure levels $N_i$ in the running direction x: $N_1$, $N_2$, $N_2$, $N_3$ and $N_2$. The grating period p has an extension of $6x_N$. All diffraction levels $N_1$ have in each case an extension of $x_N$.

The mask structure 147 has per period p mask regions 149, 150 and intervening mask gaps 151, 152 and the mask structure 148 has per period p exactly one assigned mask region 153 and one mask gap 154. The mask region 149 and the mask region 150 have an extension of $2x_N$. The mask gaps 151, 152 have an extension of $x_N$. The mask region 153 has an extension of $3x_N$. The mask gap 154 likewise has an extension of $3x_N$.

Within the sequence of the level sidewalls over the period p along the period running direction x, the following assignment holds true as far as the predefinition of the respective level sidewall by the mask region of the respective mask structure is concerned:

| Level sidewall | Predefining mask region |
| --- | --- |
| $N_2/N_1$ | 153 |
| $N_1/N_2$ | 149 |
| $N_2/N_1$ | 150 |
| $N_1/N_2$ | 153 |
| $N_2/N_3$ | 150 |
| $N_3/N_2$ | 149 |
| $N_2/N_1$ | 153 |
| etc. | etc. |

Figure 56:
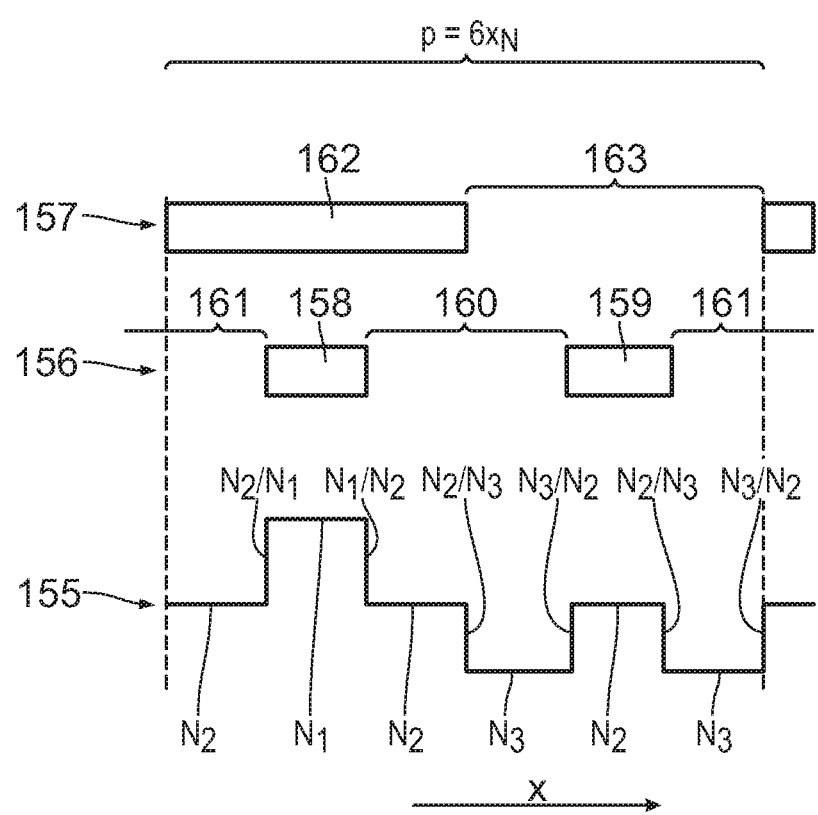
FIG. 56 shows, in an illustration similar to FIGS. 44 and 45, a further embodiment of an optical diffraction component of the type from FIGS. 19, 36, 45 and 46 together with a further embodiment of two lithographic mask structures, which can be used in the production of the optical diffraction component for predefining once again the boundary regions between the surface sections or the diffraction structure levels of the diffraction structure groups.

The relations during the production of a further embodiment of an optical grating 155 with two mask structures 156, 157 will be described with reference to FIG. 56. In contrast to FIGS. 53 and 54, which each show two grating periods of the optical grating 64, one grating period p is shown in FIG. 56. Within this grating period p, the optical grating 155 has the following sequence of the diffraction structure levels $N_i$: $N_2$, $N_1$, $N_2$, $N_3$, $N_2$ and $N_3$. Thus a period p having an extension of $6x_N$ is present in the case of the grating 155 as well. The diffraction structure levels $N_i$ have in each case an extension of IN along the period running direction x.

For the production of the optical grating 155, once again two lithographic mask structures 156 and 157 are illustrated in FIG. 56. In this case, the mask structure 156 has mask regions 158 and 159 and intervening mask gaps 160, 161 and the mask structure 157 has per period exactly one mask region 162 and one mask gap 163. The mask regions 158 and 159 have in each case the extension $x_N$. The mask gaps 160, 161 likewise have in each case the extension of $2x_N$. The mask region 162, firstly, and the mask gap 163, secondly, have in each case an extension of $3x_N$.

The following holds true for the assignment of the mask regions to the level sidewalls during the lithographic production of the optical grating 155:

| Level sidewall | Predefining mask region |
|---|---|
| $N_3/N_2$ | 162 |
| $N_2/N_1$ | 158 |
| $N_1/N_2$ | 158 |
| $N_2/N_3$ | 162 |
| $N_3/N_2$ | 159 |
| $N_2/N_3$ | 159 |
| $N_3/N_2$ | 162 |
| etc. | etc. |

The above-explained structurings of the optical gratings can have the effect that stray light radiation having an infrared wavelength, for example, that is reflected by the EUV collector 24 interferes destructively in a zero order and a stray light intensity is thus suppressed in the zero order. In this case, the optical diffraction components described above are generally used as reflective components.

A main body of the EUV collector 24 can be manufactured from aluminium. Alternative materials for this main body are copper, alloys including the constituent copper and/or aluminium or alloys, produced by powder metallurgy, of copper and aluminium oxide or silicon.

In order to produce a microstructured or nanostructured component, the projection exposure apparatus 1 is used as follows: first, the reflection mask 10 or the reticle and the substrate or the wafer 11 are provided. Subsequently, a structure on the reticle 10 is projected onto a light-sensitive layer of the wafer 11 with the aid of the projection exposure apparatus 1. Then, a microstructure or nanostructure on the wafer 11, and hence the microstructured component, is produced by developing the light-sensitive layer.

What is claimed is:

1. A component, comprising:
a periodic grating structure profile comprising diffraction structures configured so that a wavelength range around a first wavelength, $\lambda_1$, is diffracted by the periodic grating structure profile,
wherein:
the first wavelength, $\lambda_1$, is in the infrared wavelength range;
the wavelength range comprises radiation components comprising at least three different phases which interfere with each other destructively in at least one order of diffraction;
the at least one order of diffraction is selected from the group consisting of: the zero order of diffraction of the first wavelength, $\lambda_1$; the +first order of diffraction of the first wavelength, $\lambda_1$; and the −first order of diffraction of the first wavelength, $\lambda_1$;
the diffraction structures comprise diffraction structure levels;
the diffraction structure levels comprise:
a neutral diffraction structure level corresponding to a reference height of zero;
a positive diffraction structure level arranged higher by an optical path length of $\lambda_1/4 +1/-20\%$ relative to the neutral diffraction structure level; and
a negative diffraction structure level arranged lower by an optical path length of $\lambda_1/4 +1/-20\%$ relative to the neutral diffraction structure level; and
the diffraction structure levels define a topography of a grating period of a grating structure profile that is repeated regularly along a direction.

2. The component of claim 1, wherein the grating period comprises:
a first neutral diffraction structure section having the neutral diffraction structure level;
a second neutral diffraction structure section having the neutral diffraction structure level;
a positive diffraction structure section having the positive diffraction level; and
a negative diffraction structure section having the negative diffraction structure level.

3. The component of claim 2, wherein the diffraction structure sections have the following sequence: the positive diffraction structure level; the first neutral diffraction structure level; the negative diffraction structure level; and the second neutral diffraction structure level.

4. The component of claim 1, wherein, along the direction, the diffraction structure sections have the same length within +/−20%.

5. The component of claim 1, wherein:
the wavelength range further comprises a second wavelength, $\lambda_2$;
the wavelength, $\lambda_2$, is different from the first wavelength, $\lambda_1$; and
the second wavelength, $\lambda_2$, is in the infrared wavelength range.

6. The component of claim 5, wherein the diffraction structures are configured so that the wavelength range further comprises radiation components comprising at least three additional different phases which interfere with each other destructively in at least one order of diffraction selected from the group consisting of: the zero order of diffraction of the first wavelength, $\lambda_2$; the +first order of diffraction of the first wavelength, $\lambda_2$; and the −first order of diffraction of the first wavelength, $\lambda_2$.

7. The component of claim 5, wherein $(\lambda_1-\lambda_2)^2/(\lambda_1+\lambda_2)^2$ <20%.

8. The component of claim 7, wherein $(\lambda_1-\lambda_2)^2/(\lambda_1+\lambda_2)^2$ >0.01%.

9. The component of claim 5, wherein the wavelength range comprises radiation components comprising at least three different phases which interfere with one each other destructively in the zero order of diffraction of the first wavelength, $\lambda_2$.

10. The component of claim 5, wherein the wavelength range comprises radiation components comprising at least three different phases which interfere with one each other destructively in the +first order of diffraction of the first wavelength, $\lambda_2$.

11. The component of claim 5, wherein the wavelength range comprises radiation components comprising at least three different phases which interfere with one each other destructively in the −first order of diffraction of the first wavelength, $\lambda_2$.

12. A component, comprising:
at least three diffraction structure levels defining different structure depths relative to a reference plane,
wherein:
the three diffraction structure levels are assignable to at least first and second diffraction structure groups;
the first diffraction structure group is configured to suppress the zero order of diffraction of a first wavelength, $\lambda_1$;
the second diffraction structure group is configured to suppress the zero order of diffraction of a second wavelength, $\lambda_2$;
$(\lambda_1-\lambda_2)^2/(\lambda_1+\lambda_2)^2 < 20\%$;
a topography of the diffraction structure levels comprises a superimposition of first and second binary diffraction structure groups;
for each of the first and second binary diffraction structure groups:
the binary diffraction structure group comprises first surface sections having a first structure depth and second surface sections having a second structure depth; and
the first and second surface sections alternate along a direction;
boundary regions between adjacent surface sections of the first and second binary diffraction structure groups have a linear course; and
boundary regions of the first binary diffraction structure group and boundary regions of the second binary diffraction structure group are superimposed on each other at most along sections of their linear course.

13. The component of claim 12, wherein the boundary regions of the first binary diffraction structure group and the boundary regions of the second diffraction structure group run completely separately from one another.

14. The component of claim 12, wherein no sections of the boundary regions of the first binary diffraction structure group and boundary regions of the second binary diffraction structure group are superimposed on each other.

15. The component of claim 12, wherein:
the first diffraction structure group comprises a first diffraction grating supported by a grating surface;
the first diffraction grating has a first grating period;
the first diffraction grating comprises first diffraction positive structures and first diffraction negative structures;
the first diffraction positive structures are perpendicular to a section of the grating surface surrounding the first diffraction positive structures;
the first diffraction negative structures are perpendicular to a section of the grating surface surrounding the first diffraction negative structures;
the first diffraction grating has a first structure depth that is an optical path difference between the first diffraction positive structures and the first diffraction negative structures;
the second diffraction structure group comprises a second diffraction grating supported by the grating surface;
the second diffraction grating has a second grating period;
the second diffraction grating comprises second diffraction positive structures and second diffraction negative structures;
the second diffraction positive structures are perpendicular to a section of the grating surface surrounding the second diffraction positive structures;
the second diffraction negative structures are perpendicular to a section of the grating surface surrounding the second diffraction negative structures; and
the second diffraction grating has a second structure depth that is an optical path difference between the second diffraction positive structures and the second diffraction negative structures.

16. The component of claim 15, wherein:
the first grating period runs along a first direction;
the second grating period runs along a second direction; and
the first and second directions are not parallel to each other.

17. The component of claim 12, wherein the component is configured so that, for the first and second diffraction gratings, surface areas of the diffraction positive structures and of the diffraction negative structures make identical contributions to the entire grating surface.

18. The component of claim 12, wherein the component is configured so that, for the first and second diffraction gratings, surface areas of the diffraction positive structures and of the diffraction negative structures make contributions to the entire grating surface that differ by at most 20% from each other.

19. The component of claim 12, further comprising a third diffraction grating supported by the grating surface.

20. The component of claim 19, wherein:
the third diffraction grating comprises third diffraction positive structures and third diffraction negative structures;
the third diffraction grating has a third grating period;
the third diffraction positive structures are perpendicular to a section of the grating surface surrounding the third diffraction positive structures;
the third diffraction negative structures are perpendicular to a section of the grating surface surrounding the third diffraction negative structures;
the third diffraction grating has a third structure depth that is an optical path difference between the third diffraction positive structures and the third diffraction negative structures.

21. The component of claim 20, wherein:
the first grating period runs along a first direction;
the third grating period runs along a third direction; and
the first and third directions are not run parallel to each other.

22. A collector, comprising:
a component according to claim 1,
wherein the collector is a lithography collector.

23. The collector of claim 22, wherein the collector mirror is configured to guide:
used radiation toward a focal region; and
radiation having the first wavelength, $\lambda_1$, away from the focal region.

24. The collector of claim 22, wherein the collector is an EUV lithography collector.

25. An illumination system, comprising:
a lithography collector comprising a component according to claim 1; and
an illumination optical unit configured to illuminate an object field.

26. An optical system, comprising:
a lithography collector comprising a component according to claim 1;
an illumination optical unit configured to illuminate an object field; and a projection optical unit configured to image the object field into an image field.

27. An apparatus, comprising:
a light source;
a lithography collector comprising a component according to claim 1;
an illumination optical unit configured to illuminate an object field; and
a projection optical unit configured to image the object field into an image field,
wherein the apparatus is a projection exposure apparatus.

28. A method of using a projection exposure apparatus comprising an illumination optical unit and a projection optical unit, the method comprising:
using the illumination optical unit to illuminate a reticle in an object field of the projection optical unit; and
using the projection optical unit to project a structure of the reticle onto a light-sensitive material in an image field of the projection optical unit,
wherein the illumination optical unit comprises a lithography collector comprising a component according to claim 1.

29. The component of claim 2, wherein:
along the direction, extensions of the diffraction structure sections differ from each other in pairs; and
a sum of a length of the positive diffraction structure along the direction and a length of the negative diffraction structure along the direction is equal to two times a length of the first neutral diffraction structure along the direction.

30. The component of claim 2, wherein:
the positive diffraction structure level has a structure depth which is greater than $\lambda_1/4$;
the negative diffraction structure level has a structure depth which has the same absolute value as the structure depth of the positive diffraction structure level; and
compared to $\lambda_1/4$, structure depth variations of the positive diffraction structure level and of the negative diffraction structure level are such that phases of light which are reflected by the positive diffraction structure level and by the negative diffraction structure level yield an average value which is located at a phase position of destructive interference of the reflected light.

31. The component of claim 2, wherein the diffraction structure sections have the following sequence: the first neutral diffraction structure level; the second neutral diffraction structure level; the positive diffraction structure level; and the negative diffraction structure level.

* * * * *

UNITED STATES PATENT AND TRADEMARK OFFICE
CERTIFICATE OF CORRECTION

Page 1 of 2

PATENT NO. : 10,852,640 B2
APPLICATION NO. : 16/739320
DATED : December 1, 2020
INVENTOR(S) : Heiko Feldmann et al.

It is certified that error appears in the above-identified patent and that said Letters Patent is hereby corrected as shown below:

In the Specification

Column 12, Line 23, delete "one each" and insert -- each --;

Column 12, Line 26, delete "one each" and insert -- each --;

Column 12, Line 30, delete "one each" and insert -- each --;

Column 12, Line 34, delete "one each" and insert -- each --;

Column 12, Line 37, delete "one each" and insert -- each --;

Column 12, Line 41, delete "one each" and insert -- each --;

Column 15, Line 23, delete "diffraction; and The" and insert -- diffraction. The --;

Column 15, Line 50, delete "one each" and insert -- each --;

Column 15, Line 54, delete "one each" and insert -- each --;

Column 15, Line 57, delete "one each" and insert -- each --;

Column 15, Line 61, delete "one each" and insert -- each --;

Column 15, Lines 64-65, delete "one each" and insert -- each --;

Column 16, Line 1, delete "one each" and insert -- each --;

Column 17, Line 53, delete "FIG." and insert -- FIGS. --;

Signed and Sealed this
Thirteenth Day of April, 2021

Drew Hirshfeld
*Performing the Functions and Duties of the
Under Secretary of Commerce for Intellectual Property and
Director of the United States Patent and Trademark Office*

Column 18, Line 25, delete "FIG." and insert -- FIGS. --;

Column 18, Line 37, delete "FIG." and insert -- FIGS. --;

Column 20, Line 12, delete "λ4," and insert -- $\lambda/4$, --;

Column 33, Line 28, delete "$d_1\ d_2$." and insert -- $d_1 \neq d_2$. --;

Column 35, Line 8, delete "Ng" and insert -- $N_8$ --;

Column 36, Line 44, delete "do" and insert -- . . . $d_n$ --;

Column 36, Line 49, delete "$N_1$" and insert -- $N_i$ --;

Column 36, Line 50, delete "$N_1$" and insert -- $N_i$ --;

Column 36, Line 58, delete "$\lambda^N/(2\ m)$" and insert -- $\lambda_N / (2m)$ --;

Column 38, Line 61, delete "FIG." and insert -- FIGS. --;

Column 43, Line 35, delete "$P_o$, d" and insert -- $P_{0,d}$ --;

Column 43, Line 40, delete "$P_o$, a" and insert -- $P_{0,d}$ --;

Column 45, Line 52, delete "shilling" and insert -- shifting --;

Column 47, Line 2, delete "IN" and insert -- $x_N$ --;

In the Claims

Column 48, Line 55, Claim 9, delete "one each" and insert -- each --;

Column 48, Line 60, Claim 10, delete "one each" and insert -- each --;

Column 48, Line 65, Claim 11, delete "one each" and insert -- each --.